(12) United States Patent
Eaton et al.

(10) Patent No.: US 12,000,920 B2
(45) Date of Patent: Jun. 4, 2024

(54) HALL PROBE SIMULATOR CIRCUIT

(71) Applicant: University of Denver, Denver, CO (US)

(72) Inventors: Gareth R. Eaton, Denver, CO (US); Richard W. Quine, Littleton, CO (US)

(73) Assignee: University of Denver, Denver, CO (US)

( * ) Notice: Subject to any disclaimer, the term of this patent is extended or adjusted under 35 U.S.C. 154(b) by 0 days.

(21) Appl. No.: 14/419,907

(22) PCT Filed: Sep. 13, 2013

(86) PCT No.: PCT/US2013/059726
§ 371 (c)(1),
(2) Date: Feb. 5, 2015

(87) PCT Pub. No.: WO2014/043513
PCT Pub. Date: Mar. 20, 2014

(65) Prior Publication Data
US 2015/0185255 A1 Jul. 2, 2015

Related U.S. Application Data

(60) Provisional application No. 61/701,959, filed on Sep. 17, 2012, provisional application No. 61/701,314, filed on Sep. 14, 2012.

(51) Int. Cl.
*G01R 33/60* (2006.01)
*G01N 24/10* (2006.01)
*G01R 1/20* (2006.01)

(52) U.S. Cl.
CPC ............. *G01R 33/60* (2013.01); *G01N 24/10* (2013.01); *G01R 1/203* (2013.01)

(58) Field of Classification Search
CPC .... G01R 33/60; G01R 1/203; G01R 33/0206; G01R 33/028; G01R 33/038;
(Continued)

(56) References Cited

U.S. PATENT DOCUMENTS 2,767,911 A * 10/1956 Hollingsworth ....... G06G 7/162
708/841
3,546,578 A * 12/1970 Chapman ........... G01N 27/9046
324/251
(Continued)

FOREIGN PATENT DOCUMENTS

| EP | 0567116 | 7/2000 |
|---|---|---|
| EP | 2378281 | 10/2011 |
| WO | 2010043548 | 4/2010 |

OTHER PUBLICATIONS

Richard W. Quine et al., A Linear Magnetic Field Scan Driver; Feb. 1, 2009, NIH Public Access; Department of Engineering, University of Denver, Denver, CO 80208.*
(Continued)

*Primary Examiner* — Nasima Monsur
(74) *Attorney, Agent, or Firm* — Neugeboren O'Dowd PC

(57) ABSTRACT

A simulated Hall probe, provide EPR coil driver, and/or perform a time-domain full scan sinusoidal deconvolution of EPR signals. The simulated Hall probe can return a Hall Effect voltage from a coil current that creates a magnetic field within a coil magnet and the reference current that would be fed to an actual Hall probe. From these values, the Hall Effective voltage can be determined which can be used to determine the magnetic field flux, which can then be used to regulate the magnetic field.

19 Claims, 45 Drawing Sheets

(58) Field of Classification Search
CPC .. G01R 33/1215; G01R 15/20; G01R 15/202;
G01R 21/08; G01R 33/06; G01R 33/07;
G01R 33/077; G01R 33/075; G01R
33/0035; G01R 15/207; G01R 33/072;
G01R 31/2884; G01R 33/0023; G01R
33/09; G01R 33/0017; G01R 35/005;
G01R 19/0092; G01R 33/0082; G01R
33/02; G01R 15/205; G01R 31/2829;
G01R 33/00; G01R 33/093; G01R
1/06766; G01R 1/44; G01R 33/0064;
G01R 33/0094; G01R 33/10; G01R
15/18; G01R 15/181; G01R 15/183;
G01R 19/00; G01R 21/06; G01R 33/096;
G01R 33/24; G01N 24/10; G01N 27/90;
G01N 27/902; G01N 27/9033; G01N
27/9046; B64G 1/366; G01D 5/142;
G01D 5/145; G01D 5/147; G01D 3/0365;
G01D 5/2448; H01L 43/065; H01L
43/04; G01B 7/30; G01B 7/003; G01P
3/487; G01K 2217/00; H01R 13/6683;
H01R 2201/20
USPC .... 324/316, 202, 251, 207.2, 252, 244, 322,
324/117 H, 117 R, 225, 239, 750.3, 258,
324/149, 654, 713, 754.07, 754.21, 76.11;
702/104, 127, 64, 65
See application file for complete search history.

(56) References Cited

U.S. PATENT DOCUMENTS

| | | | |
|---|---|---|---|
| 3,597,679 A * | 8/1971 | Habfast | H10N 52/80 324/251 |
| 5,068,611 A | 11/1991 | Savelainen | |
| 5,296,802 A | 3/1994 | Beranger et al. | |
| 5,739,690 A | 4/1998 | Rinard | |
| 6,046,586 A | 4/2000 | Rinard | |
| 6,104,231 A * | 8/2000 | Kirkpatrick, II | G01R 33/07 327/378 |
| 6,150,817 A | 11/2000 | Lurie et al. | |
| 6,177,797 B1 | 1/2001 | Srinivasan | |
| 6,249,418 B1 * | 6/2001 | Bergstrom | F01L 9/04 361/152 |
| 6,304,230 B1 | 10/2001 | Panther et al. | |
| 6,917,201 B2 | 7/2005 | de Swiet | |
| 6,983,657 B1 * | 1/2006 | Kakutani | D06F 37/24 73/779 |
| 7,068,034 B2 | 6/2006 | de Swiet | |
| 8,217,653 B2 | 7/2012 | Vaughan | |
| 8,405,393 B2 | 3/2013 | Tseitlin et al. | |
| 8,730,697 B2 | 5/2014 | Kim et al. | |
| 9,110,146 B2 | 8/2015 | Czechowski et al. | |
| 2004/0113612 A1 * | 6/2004 | Nix | G01D 3/036 324/230 |
| 2005/0017720 A1 | 1/2005 | Mett et al. | |
| 2005/0046387 A1 * | 3/2005 | Aker | H02J 7/0047 320/125 |
| 2005/0146331 A1 | 7/2005 | Flexman et al. | |
| 2008/0191709 A1 * | 8/2008 | Mehta | G01R 31/2603 324/601 |
| 2009/0001964 A1 * | 1/2009 | Strzalkowski | G01R 15/181 324/202 |
| 2009/0310703 A1 | 12/2009 | Han et al. | |
| 2010/0007338 A1 * | 1/2010 | Schultz | G01R 33/0023 324/202 |
| 2010/0164650 A1 * | 7/2010 | Abou-Alfotouh | H02M 3/1582 333/181 |
| 2011/0018534 A1 | 1/2011 | Peukert et al. | |
| 2011/0210737 A1 | 9/2011 | Tseitlin et al. | |
| 2011/0241667 A1 | 10/2011 | Blumich et al. | |
| 2013/0257431 A1 | 10/2013 | Tseitlin et al. | |
| 2015/0185299 A1 | 7/2015 | Rinard et al. | |

OTHER PUBLICATIONS

International Search report and Written Opinion dated Apr. 9, 2014 in PCT Application No. PCT/US2013/059726 (15 pgs).

Blumich, B. et al., NMR with excitation by Frank sequences. J. Magn. Reson. 199 (2009) 18-24.

European Search Report, as issued in connection with European Application No. 11751109.7, dated Apr. 16, 2014, 13 pgs.

European Search Report, Supplemental, as issued in connection with European Application No. 11751109.7, dated May 6, 2014, 1 pg.

Fuhs, M. et al., Fourier-Transform EPR at High-Field High-Frequency. J. Magn. Reson. 149, 1 (Mar. 1, 2001) 67-73.

International Search Report and Written Opinion, as issued in connection with International Patent Application No. PCT/US2011/026231, dated Apr. 20, 2011, 8 pgs.

International Search Report and Written Opinion, as issued in connection with International Patent Application No. PCT/US2013/051219, dated Jan. 9, 2014, 8 pgs.

International Search Report and Written Opinion, as issued in connection with International Patent Application No. PCT/US2013/059726, dated Apr. 9, 2014, 11 pgs.

Joshi, J.P. et al., Rapid-Scan EPR with Triangular Scans and Fourier Deconvolution to Recover the Slow-Scan Spectrum. J. Magn. Reson. 175 (2005) 44-51.

Morton, J.J.L. et al., Solid-state quantum memory using the 31P nuclear spin. Nature 455 (2008) 1095-1088.

Owenius, R. et al. Frequency (250 MHz to 9.2 GHZ) and Viscosity Dependence of Electron Spin Relaxation of Triarylmethyl Radicals at Room Temperature. J. Magn. Reson. 172 (2005) 168-175.

Prisner, T. et al. ESR with Stochastic Excitation. J. Magn. Reson. 84, 2 (Sep. 1, 1989) 296-308.

Pursley, R. et al. Stochastic Excitation and Hadamard Correlation Spectroscopy with Bandwidth Extension in RF FT-EPR. J. Magn. Reson. 162, 1 (May 1, 2003) 35-45.

Quine, R.W. et al., Fast-Response VHF Pulsed 2 KW Power Amplifiers. Conc. Magn. Reson. B (Magn. Reson. Engin.) 29B (2006) 185-190.

Quine, R.W. et al., Fast-response VHF pulsed power amplifiers. Conc. Magn. Reson. B (Magn. Reson. Engin.) 27B (2005) 1-7.

Quine, R.W. et al., A Pulsed and Continuous Wave 250 MHz Electron Paramagnetic Resonance Spectrometer. Mgn. Reson. Engineer. 15 (2002) 59-91.

Rinard, G.A. et al., 250 MHz Crossed Loop Resonator for Pulsed Electron Paramagnetic Resonance. Magn. Reson. ingineer. 15 (2002) 37-46.

Rinard, G.A. et al., A wire-crossed-loop resonator for rapid scan EPR. Concepts in Magn. Reson. Part B. 378, 2 (Apr. 9, 2010) 86-91.

Rinard, G.A. et al., An L-Band Crossed-Loop (Bimodal) EPR Resonator. J. Magn. Reson. 144, 1, (May 1, 2000) 85-88.

Stoner, J.W. et al., Direct-detected rapid-scan EPR at 250 MHz. J. Magn. Res. 170 (2004) 127-135.

Tseitlin, M. et al., Background Removal Procedure for Rapid Scan EPR. J. Magn. Reson. 196 (2009) 48-53.

Tseitlin, M. et al., Use of the Frank Sequence in Pulsed EPR. J. Magn. Reson. 209, 2 (Feb. 3, 2011) 306-309.

U.S. Office Action in U.S. Appl. No. 12/942,386, dated Jan. 6, 2012, 9 pgs.

U.S. Office Action in U.S. Appl. No. 12/942,386, dated Jun. 7, 2012, 11 pgs.

U.S. Notice of Allowance in U.S. Appl. No. 12/942,386, dated Nov. 26, 2012, 9 pgs.

U.S. Office Action in U.S. Appl. No. 13/789,383, dated Nov. 10, 2015, 9 pgs.

* cited by examiner

HALL PROBE SIMULATOR CIRCUIT

GOVERNMENT RIGHTS

This invention was made with government support under Grant Numbers EB000557 and EB002034 awarded by National Institute of Health. The government has certain rights in the invention.

BACKGROUND

Similar to NMRI, Electron Paramagnetic Resonance (EPR) may allow for the noninvasive imaging of various objects, including organic objects, such as the human body. However, EPR differs in many respects from NMRI. EPR measurements may be used for imaging the location of electron spins and for imaging physical parameters that affect the EPR measurements. Rather than observing the magnetic fields as produced by the spins of atoms' nuclei, EPR relies on the behavior of the electrons of atoms. In short, EPR relies on a magnetic field being applied to an object being studied, followed by the spectra produced by changes in energy level of unpaired electrons of the atoms of the object under study being detected and measured.

Some suggest that EPR is not as effective as NMRI because of a number of difficulties. One of these difficulties relates to the relaxation time of electrons as compared to the nuclei of atoms. After being excited, the nuclei of atoms may take several hundred microseconds or more the return to their relaxed state. This may allow for a significant window of time for the nuclei to be observed in their excited states (their spins aligned) while allowing for an amount of time to pass between when the magnetic field was applied to the object under study and when the spin of the nuclei of the atoms of the object is measured. In contrast, the relaxation times of electrons may be much shorter, possibly by multiple orders of magnitude. In EPR after an unpaired electron of an atom has been excited, the electron may return to its relaxed state after roughly three microseconds or less. Therefore, the amount of time available to detect the excited electrons is significantly shorter in EPR than NMRI. Accordingly, while in NMRI it may be possible to allow a significant amount of time (e.g., tens or hundreds of microseconds) to pass between when the magnetic field is applied to the object and when the nuclei spins are observed, this time period may be greatly shortened when EPR is used.

Some current techniques for EPR may require large amounts of power being incident on the object being studied. In some embodiments, described herein, RF/microwave power required to perform pulsed EPR is reduced. High power amplifiers may be expensive and carry the burden of ensuring that the in vivo imaging technology is designed to prevent excessive absorption of RF/microwave power by the object being imaged (in MRI this may be referred to as the Specific Absorption Rate).

SUMMARY

Embodiments of the invention include systems and methods to simulate a Hall probe, an EPR coil driver, and time-domain full scan sinusoidal deconvolution of EPR signals.

One embodiment of the invention includes a Hall Probe simulator that includes a reference current input configured to receive the reference current for a Hall Probe; a current sensor configured to sense the coil current in a coil magnet that produces a magnetic field; and a controller coupled with the reference current input and the current sensor. The controller can be configured to determine a Hall Effect voltage from a function of the coil current and the reference current.

In some embodiments, the controller can be further configured to determine the magnitude of the magnetic field produced by the coil magnet from the Hall Effect voltage.

In some embodiments, the Hall Probe simulator includes a reference resistor. In such embodiments, the reference current input inputs a reference voltage across the reference resistor that is proportional to the current input according to Ohms law, and the Hall Effect voltage is determined from a function of the reference voltage and the coil current. In some embodiments, the Hall Probe simulator includes a temperature regulator coupled at least partially with the reference resistor and configured to regulate the temperature of the reference resistor.

In some embodiments, the Hall Probe simulator includes a current sense resistor. In such embodiments, the current sensor is configured to sense a current sense voltage across the current sense resistor, wherein the current sense voltage is proportional to the coil current. And the Hall Effect voltage is determined from a function of the current sense voltage and the reference current. In some embodiments, the Hall probe simulator includes a temperature regulator coupled at least partially with the current sense resistor and configured to regulate the temperature of the current sense resistor.

In some embodiments, the Hall Probe simulator includes a reference resistor and a current sense resistor. The reference current input can input a reference voltage across the reference resistor; and the current sensor is configured to sense a current sense voltage across the current sense resistor. The current sense voltage is proportional to the coil current. The Hall Effect voltage can then be determined from a function of the reference voltage and the coil current. In some embodiments, the function of the coil current and the reference current comprises a product of the coil current and the reference current. In some embodiments, the controller is further configured to regulate the coil current in response to the Hall Effect voltage.

Some embodiments of the invention can include a method for simulating a Hall Probe. The method can sense a coil current in a coil magnet that produces a magnetic field; sense a reference current sent to a Hall Probe; determine a Hall Effect voltage from a function of the coil current and the reference current; and output the Hall Effect voltage.

The method can further determine the magnitude of the magnetic field produced by the coil magnet from the Hall Effect voltage. The method can further regulate the temperature of the current sense resistor.

In some embodiments, sensing the coil current can include sensing a current sense voltage across a current sense resistor in series with the coil magnet. Then, the Hall Effect voltage can be determined from a function of the current sense voltage and the reference current. The current sense voltage is proportional to the coil current.

In some embodiments, sensing the reference current can include sensing a reference voltage across a reference resistor in place of the Hall Probe, and wherein the Hall Effect voltage is determined from a function of the reference voltage and the coil current. In some embodiments, the function of the coil current and the reference current comprises a product of the coil current and the reference current.

Embodiments of the invention can also include a method for deconvoluting an EPR signal. The method can include receiving an EPR signal from an EPR device; determining a free induction decay signal from the EPR signal using a Tikhonov regularization; and determining the EPR spectrum from the free induction decay signal. In some embodiments, the EPR signal can be a rapid scan EPR signal such that transition through resonance occurs in a time that is short relative to electron spin relaxation time. In some embodiments, the free induction decay signal can be determined using $\|\hat{D}\text{fid}-\text{rs}*d\|^2+\lambda\|\hat{R}\text{fid}\|^2$, wherein D is a Toeplitz matrix, fid is the free induction decay signal, R is a regularization matrix, rs is the rapid scan signal, λ is the regularization parameter, and d is the driving function. In some embodiments, the free induction decay signal can be determined from $\text{fid}=(\hat{D}\hat{D}^T+\lambda\hat{R}\hat{R}^T)^{-1}\hat{R}^T(\text{rs}*d)$, wherein D is a Toeplitz matrix, fid is the free induction decay signal, R is a regularization matrix, rs is the rapid scan signal, λ is the regularization parameter, and d is the driving function.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Systems and methods are disclosed to simulate a Hall probe, EPR coil driver, and time-domain full scan sinusoidal deconvolution of EPR signals.

Hall Probe Simulator

Embodiments of the invention include systems and methods that can determine the transverse voltage VH produced by a Hall probe if it were placed in a magnetic field created within a coil of wire, without the use of an actual Hall probe, using a Hall probe reference current iR and the coil current $i_C$.

Figure 1:
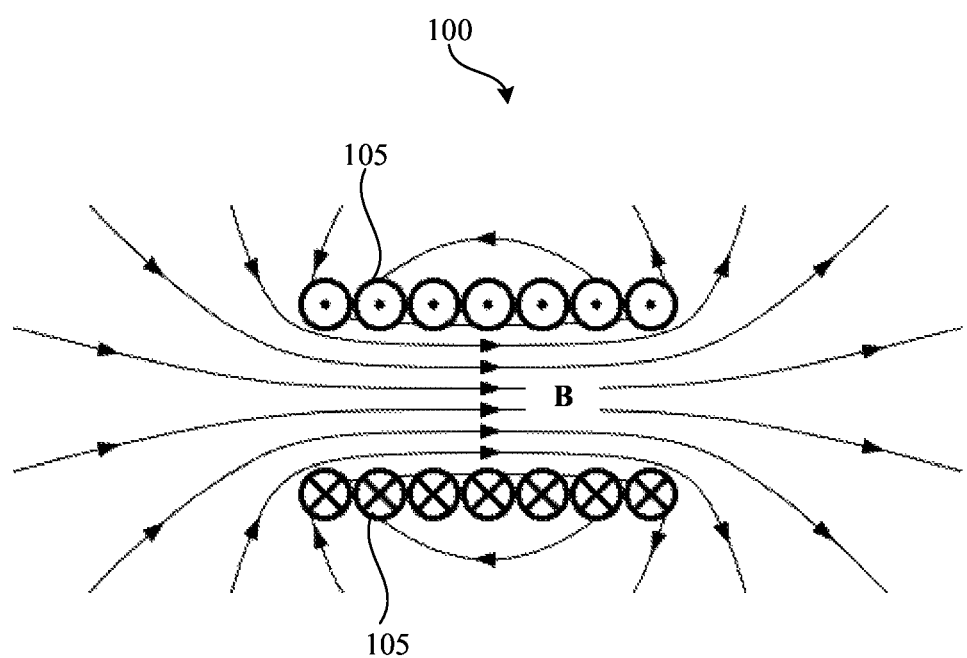
FIG. 1 is a cross-section diagram of a coil magnet.

FIG. 1 shows the magnetic field lines, B, created from coiled magnet 100 that includes a plurality of conductive coils 105. Magnetic field, B, is created when coil current iC is conducted through conductive coils 105. When a metallic core is placed within the conductive coils, the magnitude of the magnetic field created by coils 105 is directly proportional to both the number of turns in the winding, N, (in the example shown in FIG. 1, N=7) and the coil current iC; and the permeability, μ, of the material within the core material placed within the coils and the permeability, μ, of any other material within which the magnetic field is lines run, such as air. When the core material is unknown as is often the case when testing materials, then the permeability, μ, is unknown and the magnitude of the magnetic field, B, cannot be determined from coil current iC. A Hall probe can be used to measure the magnetic field within the conductive coils.

Figure 2:
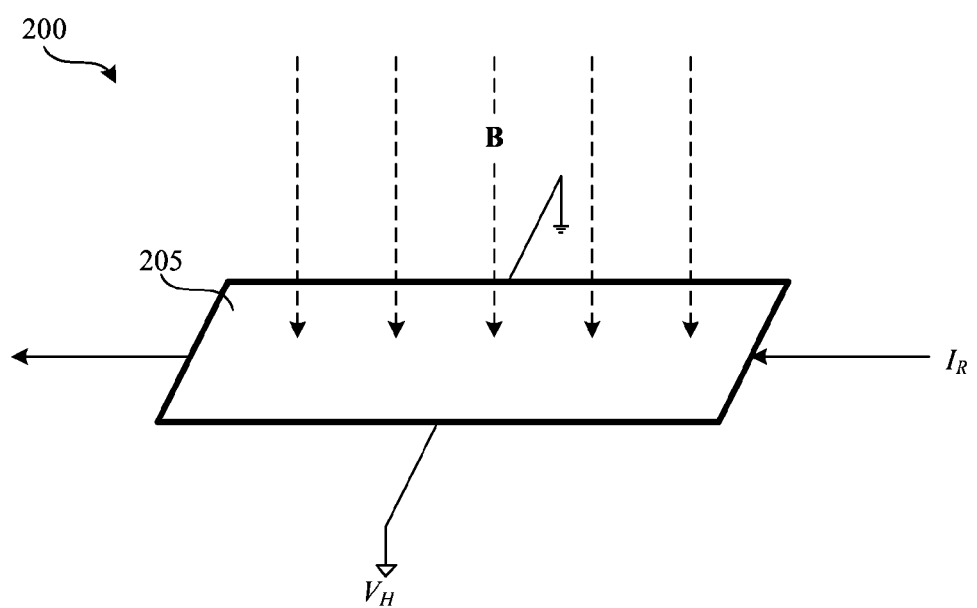
FIG. 2 is a diagram of a typical Hall probe.

An example of a typical Hall probe 200 is shown in FIG. 2. The typical Hall probe 200 includes a rectangular plate 205 that is placed within magnetic field B. Excitation current IR is conducted through plate 205. As shown, the face of the rectangular plate 205 can be aligned perpendicular with respect to magnetic field B. As such, the current is passing through rectangular plate 205 is in a direction that is perpendicular with magnetic field B. From the magnetic field, B, and the reference current iR a Hall Effect voltage VH is produced. The Hall Effect voltage is produced perpendicular relative to both the magnetic field and the reference current. The Hall Effect voltage can be determined from:

$$V_H = -\frac{I_R \cdot B}{n \cdot e \cdot t},$$

where IR is the reference current across the plate length, B is the magnetic field, t is the thickness of the plate, e is the elementary charge, and n is the charge carrier density of the carrier electrons. Thus, the Hall Effect voltage VH is directly proportional to the magnetic field. By measuring the Hall Effect voltage VH one can determine the strength of magnetic field B.

Often the reference current iR, is sinusoidal, for example, in the range of 1 kHz to 2 kHz. In some systems the magnetic field runs at 1.17 kHz. In a Hall probe simulator circuit the response voltage VR, equivalent to the Hall Effect voltage VH of an actual Hall probe, can be expressed as VR=kIR, where k is a constant with the dimensions volts/ampere/gauss. Typical values might include IR=0.5 App and k=1.6×10 −4 V/A/G so that at a typical L-band field of 370 G, VR is about 30 mVpp. Thus, knowing the excitation current and the response voltage, one can simulate the output voltage of an actual Hall probe.

In some situations, however, a Hall probe may not be practical. For example, the size of a Hall probe may make it difficult to place the Hall probe within the conductive coils of an electromagnet. Moreover, in some situations, the Hall probe may affect the magnitude of the magnetic field within the conductive coils. Various other situations, such as the presence of magnetic field gradients, may also make it difficult or not practical to use a Hall probe to measure the magnetic field. Despite these difficulties, various experimental situations may require feedback from a Hall probe to control a magnetic field value, for example, in a feedback circuit that can be used to create a stable magnetic field. Thus, various embodiments of the invention can be used in applications of electromagnets in which it is desired to control the magnetic field, but in which, for various experimental reasons, it is not practical to control the magnetic field using a Hall probe.

Thus, embodiments of the invention can produce the Hall Effect voltage VH from the coil current iC and the reference current iR. In some embodiments, the reference current iR can be converted to a reference voltage VR using reference resistor RR and the coil current iC can also be converted to a current sense voltage VCS using a current sense resistor RCS. The Hall Effect voltage VH can be determined from the product of the current sense voltage VCS and the reference voltage VR. In some embodiments, this product may or may not be multiplied by a constant value. Instead, either or both the magnitude of the current sense voltage VCS and/or the magnitude of the reference voltage VR can be amplified so that the product of the two values can be equal to the Hall Effect voltage VH. The reference voltage VR can be amplified. In some embodiments, the reference voltage VR can be amplified by a factor of 5, 10, 15, 20, etc.

Figure 3A:
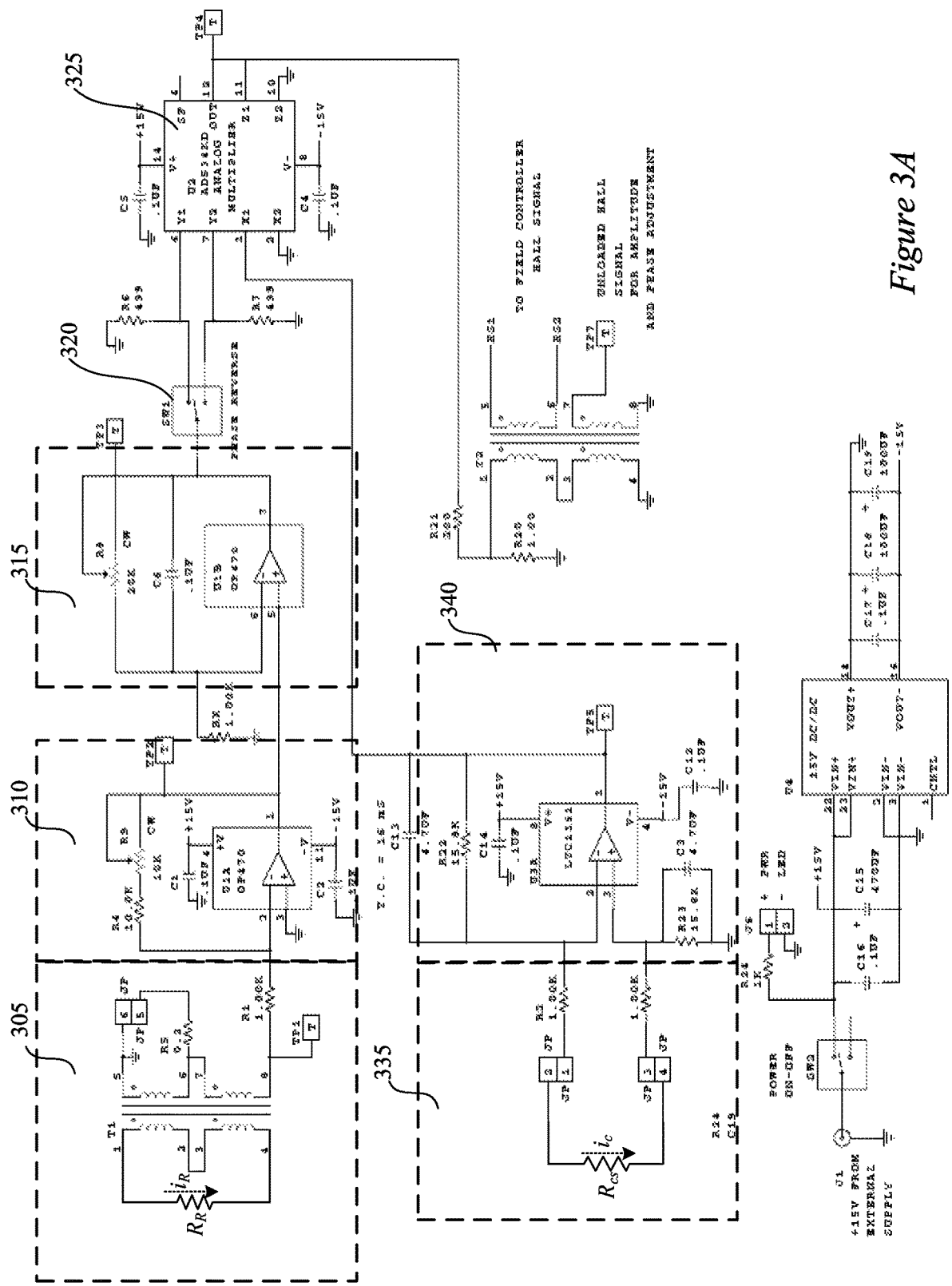
FIGS. 3A and 3B are examples of Hall probe simulator circuits according to some embodiments of the invention.
Figure 3B:
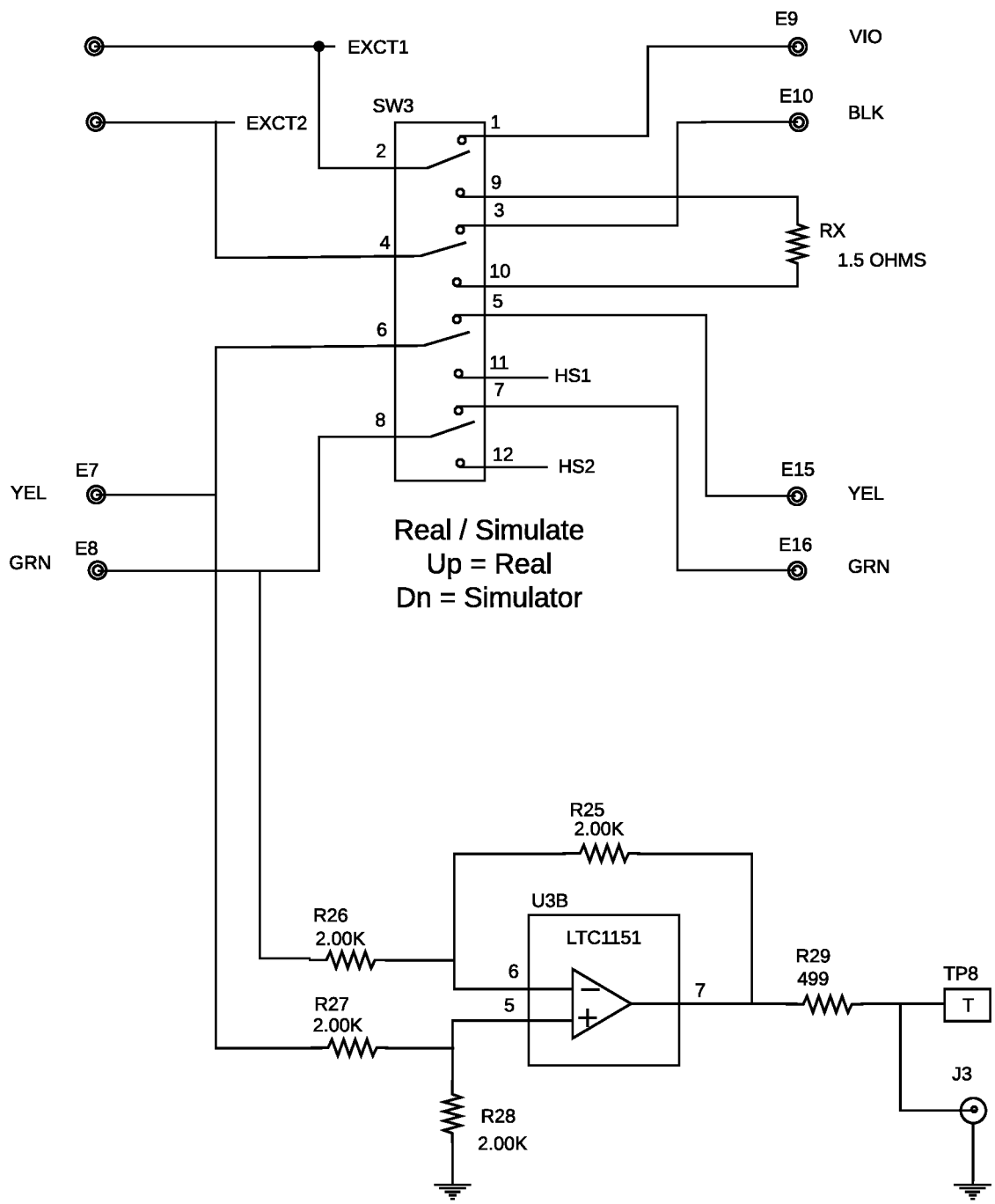

FIGS. 3A and 3B shows an example of a Hall probe simulator circuit having a number of modules according to some embodiments of the invention.

In some embodiments, in the excitation module 305, the reference current iR can be converted to the reference voltage VR by measuring the voltage across reference resistor RR. In some embodiments, the AC input and/or output of the simulator circuit can be transformer coupled so that no ground connection is made to the field controller signals, either excitation or simulated Hall signal. Such a transformer can couple the excitation input to a first amplifier. This first amplifier may or may not have a gain control adjustment, which sets the scale factor for the simulated signal. This adjustment can be made to set the Gauss scale in the spectrometer. A phase adjustment module 315 can adjust the simulated Hall signal to have the same phase as an actual Hall probe.

In module 305, a 1:1 transformer, T1, can be used to isolate the resistor. In module 310, the reference voltage VR can be amplified and/or phase adjusted using any number of techniques. For example, the reference voltage VR can be amplified to arrive at the multiplier as about 8.5 Vpp sinusoidal. Various impedance matching resistors can also be used. In some embodiments, a calibration of the Hall probe simulator can be achieved by adjusting the gain. In some embodiments, the L-band magnet can have a coil constant of 16.7 G/A.

In some embodiments, in module 335, coil current iC can be sensed across a low value current sense resistor RCS. For example, current sense resistor RCS can be a resistor having ohms less than or equal to 1.6, 1.4, 1.2, 1.0, 0.8, 0.6, 0.4 or 0.02. In some embodiments, current sense resistor RCS can be a low temperature coefficient resistor. If, for example, the magnet current in the L-band magnet at 1.04 GHz and at g=2 is 22.5 amps, the current sense resistor RCS can dissipate about 10 watts. To provide a stable operating temperature for the resistor, it can be attached to a heat sink, such as a water-cooled heat sink. In some embodiments the same water supply that that is used for the magnet power supply can be used to keep current sense resistor RCS at a relatively constant temperature. For instance, with the high flow rate required by the power supply the temperature rise in the water for a 10 W heat load can be very small. The temperature of the sense resistor is then kept essentially at the temperature of the source water. In module 340, the current sense voltage VCS which is proportional to the coil current, can be amplified using various techniques.

In some embodiments, the simulator is configured so that it can be switched between using an actual Hall probe and a Hall simulator. The signal produced by the actual Hall probe can be observed while adjusting the Hall probe simulator signal phase to match. Following the phase adjustment module 315 is a 180 degree phase reversal switch 320, which can allow for connecting the magnet current so it flows in either direction through the simulator.

In some embodiments, multiplier 325 can be used to multiply the reference voltage VR and the current sense voltage VCS.

In some embodiments, the output of the simulator can have low impedance. In some embodiments, various resistors can be used to provide a low source impedance match to the field controller. In some embodiments, the simulator can be connected to the "low" (−) side of a magnet power supply so the common mode voltage at the sense resistor is low. A ground strap from the simulator to a suitable system chassis ground can be used and may keep the simulator at ground potential.

Figure 4:
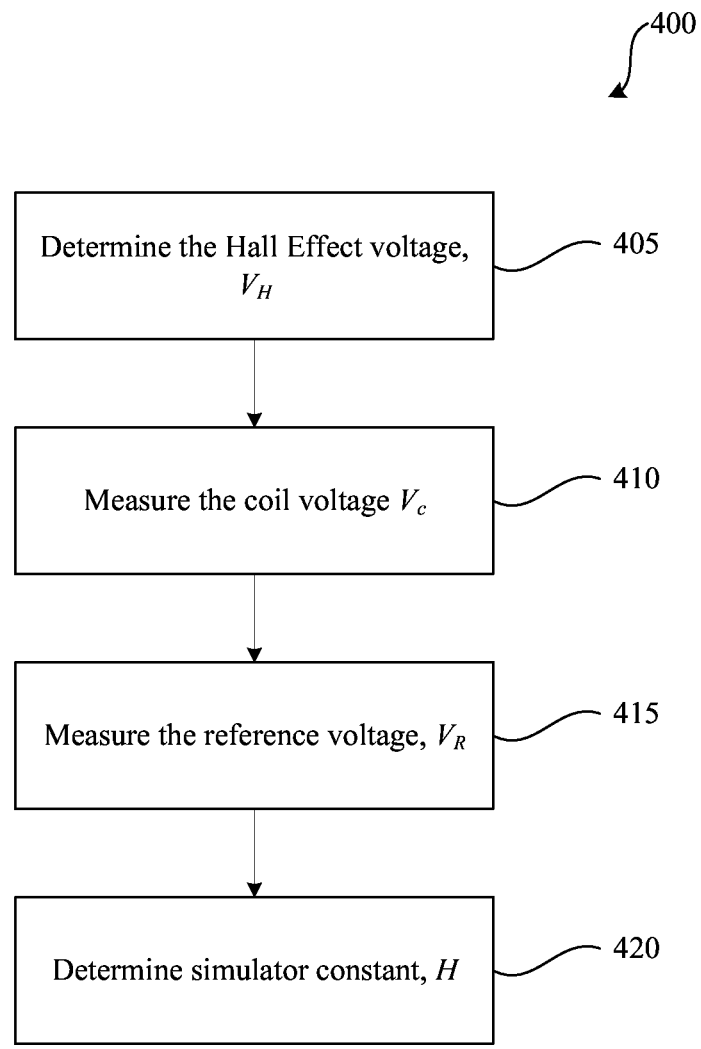
FIG. 4 is flowchart of a process for calibrating a Hall probe simulator according to some embodiments of the invention.

FIG. 4 is a flow chart of process 400 for calibrating a Hall probe simulator according to some embodiments of the invention. Process 400 starts at block 405, where the Hall Effect voltage VH is determined using a Hall probe. At block 410, the current sense voltage VCS can be measured. As noted above, the current sense voltage, which is proportional to the coil current, can be measured from the voltage across current sense resistor RCS. At block 415, the reference voltage VR is measured. As noted above, the reference voltage can be measured from the voltage across reference resistor RR. In some embodiments, a simulator constant, H, can then be determined from these values. For example, $$H = \frac{V_H}{V_C V_R}.$$

In some embodiments, the reference voltage VR and/or the current sense voltage VCS can change over time. For example, the reference voltage VR and/or the current sense voltage VCS can have sinusoidal profiles over time. In some embodiments, the reference voltage VR is sinusoidal and the current sense voltage VCS is not.

Figure 5:
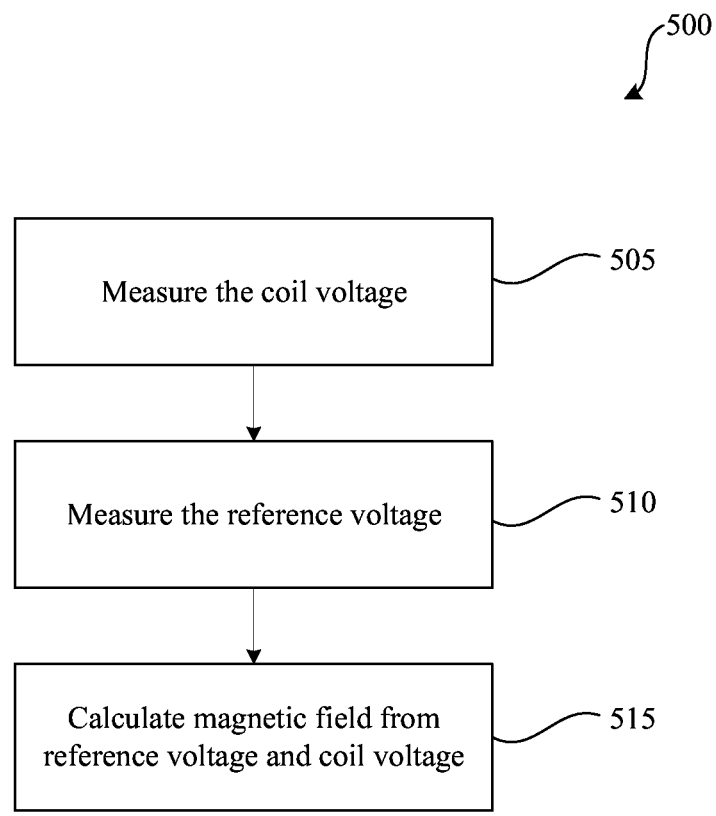
FIG. 5 is a flowchart of a process for using a Hall probe simulator according to some embodiments of the invention.

FIG. 5 is a flow chart of process 500 for using a Hall probe simulator according to some embodiments of the invention. Process 500 starts at block 505, where the current sense voltage VCS is measured. As noted above, the current sense voltage can be measured from the voltage across current sense resistor RCS. At block 510, the reference voltage VR is measured. As noted above, the reference voltage can be measured from the voltage across reference resistor RR. At block 515 the Hall Effect voltage VH can be determined from the reference voltage VR and/or the current sense voltage VCS. The Hall Effect voltage VH can be used to determine the magnitude of the magnetic field and/or used in a feedback circuit to control the magnetic field.

Figure 6:
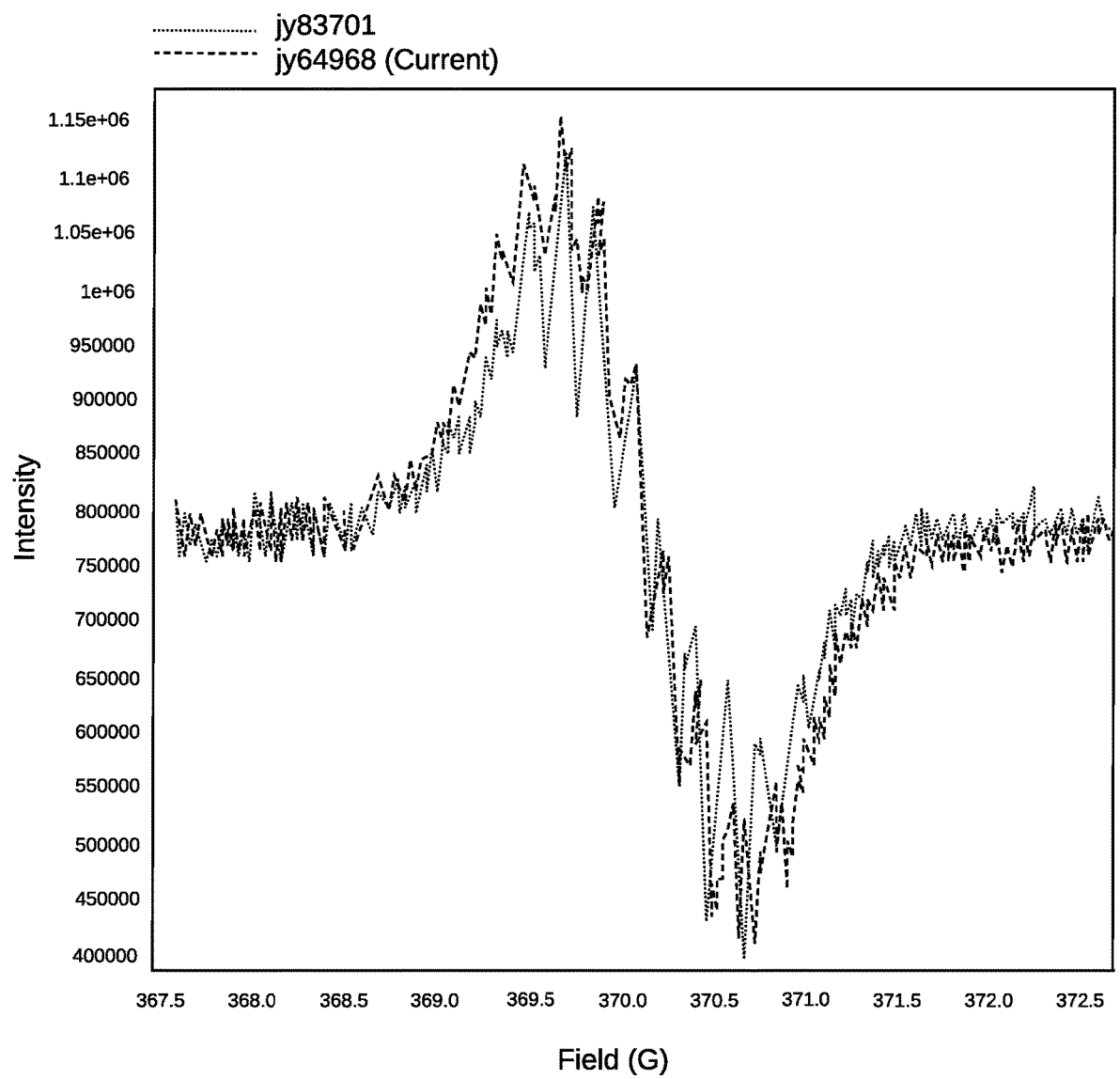
FIG. 6 is a graph showing a comparison of Hall probe measurements and Hall probe simulator measurements of intensity over spectra

FIG. 6 shows a comparison of Hall probe measurements and Hall probe simulator measurements of intensity over spectra according to some embodiments of the invention. In the figure, the red line is the spectrum by using the Hall probe simulator and the green line is the spectrum by using Hall probe. Each of these spectra averages 40 scans of 2048 point spectra, using. As shown, the Hall probe provides substantially similar results.

Figure 7:
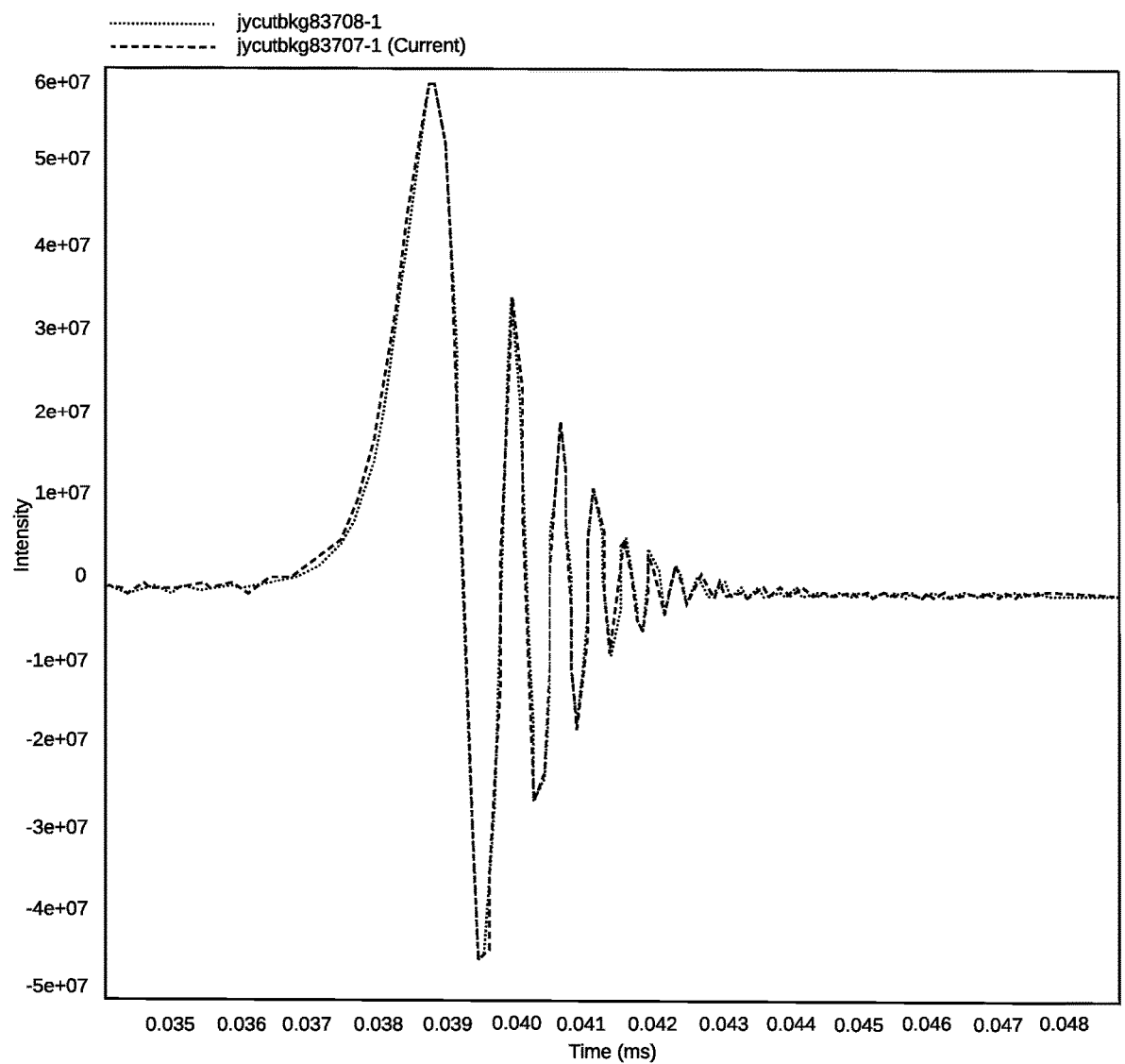
FIG. 7 is a graph showing a comparison of Hall probe measurements and Hall probe simulator measurements of intensity over time in the rapid scan spectra.

FIG. 7 shows a comparison of Hall probe measurements and Hall probe simulator measurements of intensity over time in the rapid scan spectra. Again, the red line is the spectrum by using the Hall probe simulator and the green line is the spectrum by using Hall probe.

Systems and methods are described herein to convert a Hall probe field controller to current control so that the magnitude of a magnetic field can be determined without using an actual Hall probe. This can be beneficial for imaging where Hall probes have to be placed at the null position of gradient fields, which can be difficult and unstable. Rapid scan coils also confuse a Hall probe placed in the scanned field. In some embodiments, a Hall probe simulator may be used as a temporary or permanent replacement for a damaged Hall probe.

EPR Coil Driver

Figure 8:
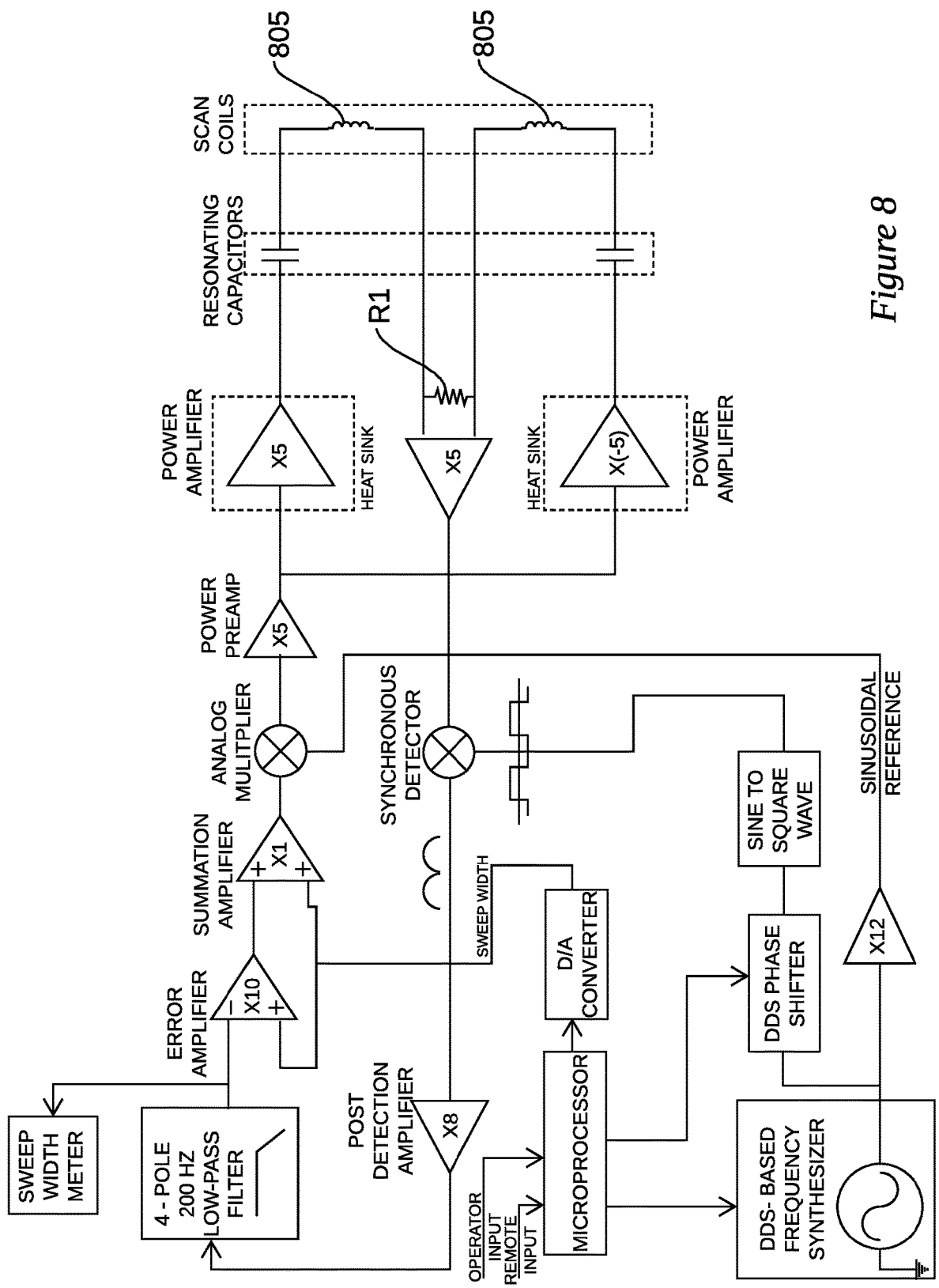
FIG. 8 is an example of a simplified circuit diagram of an EPR coil driver according to some embodiments of the invention.
Figure 9A:
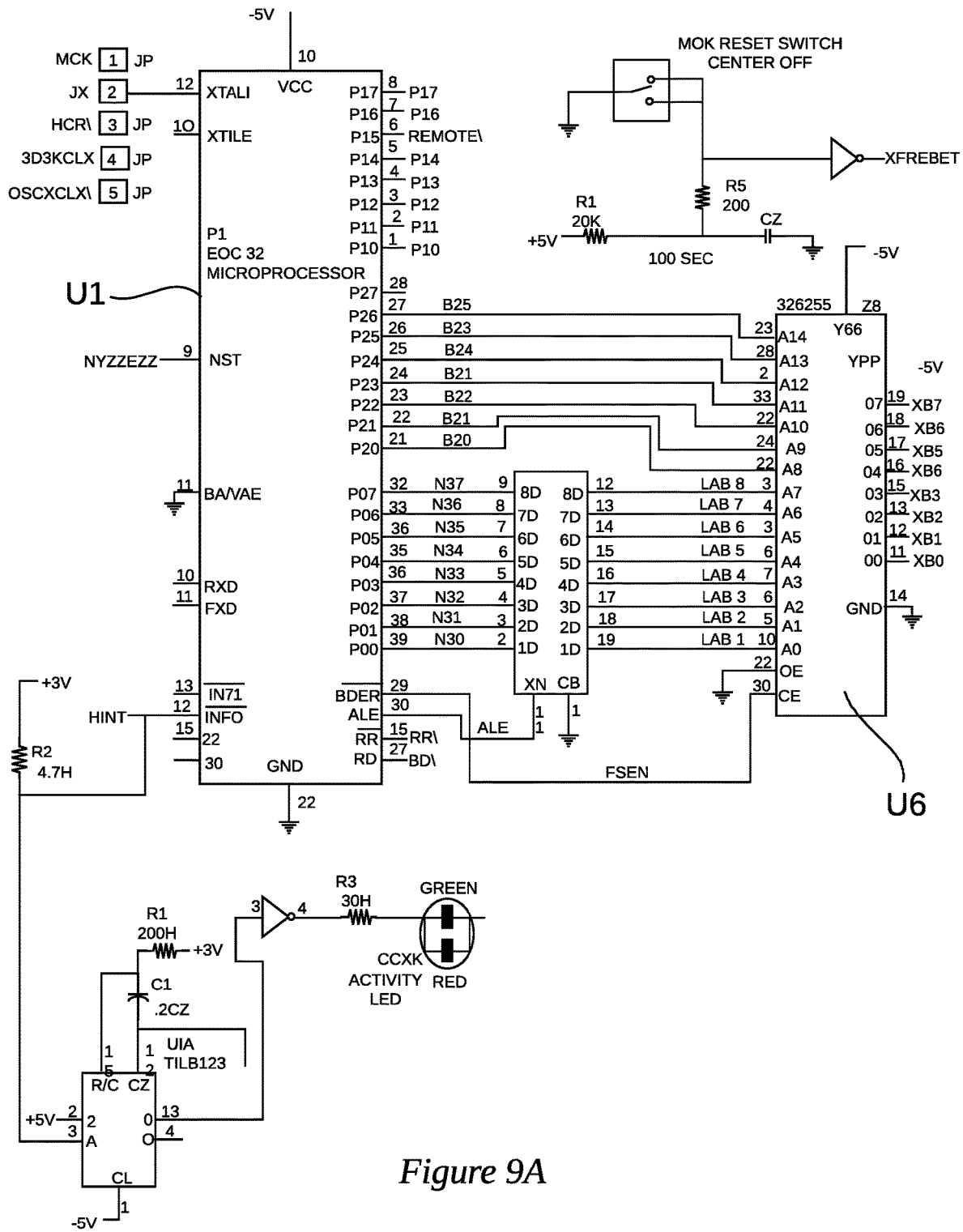
FIG. 9-19 are examples of schematic diagrams of an EPR coil driver according to some embodiments of the invention.
Figure 9B:
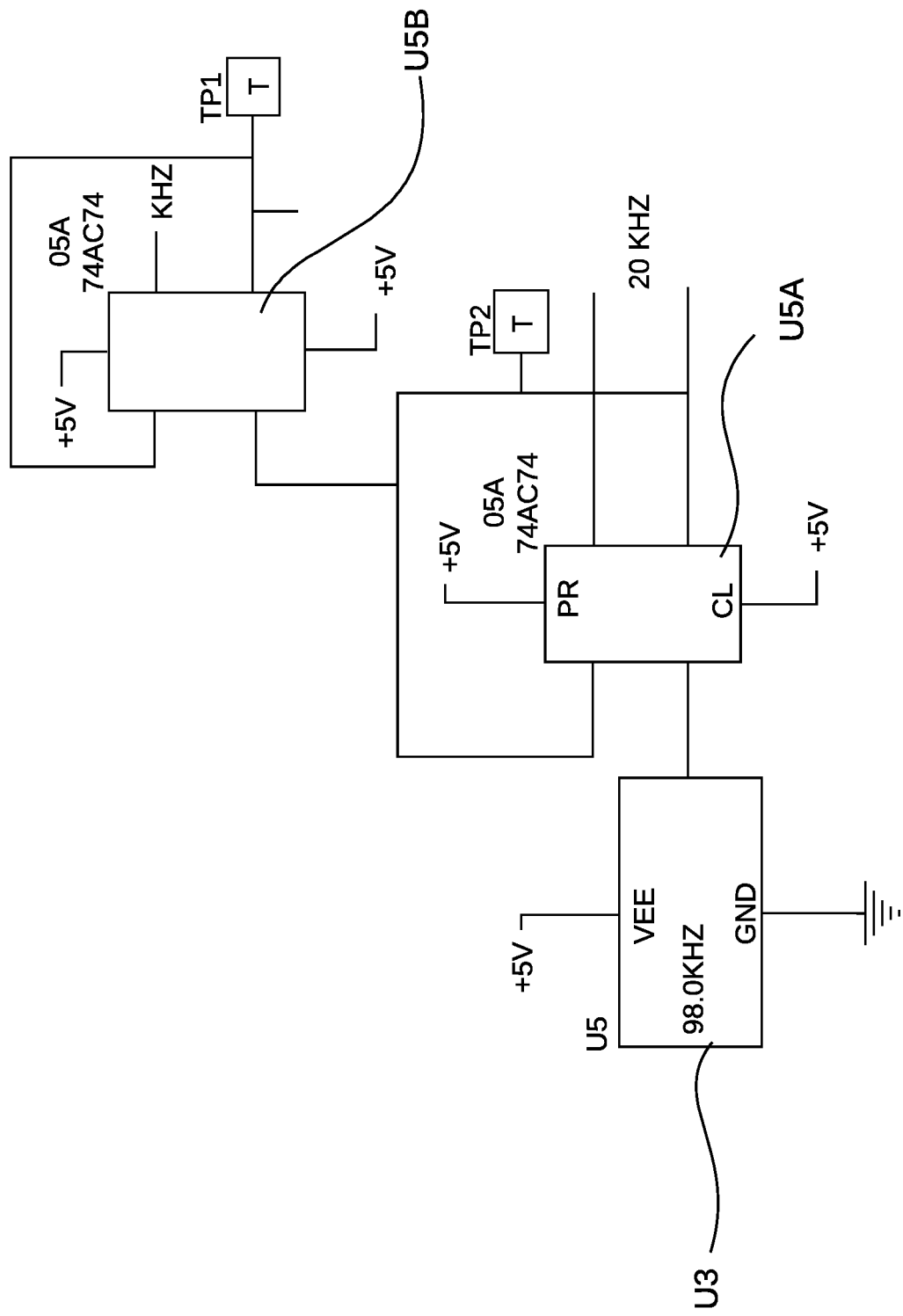
Figure 9C:
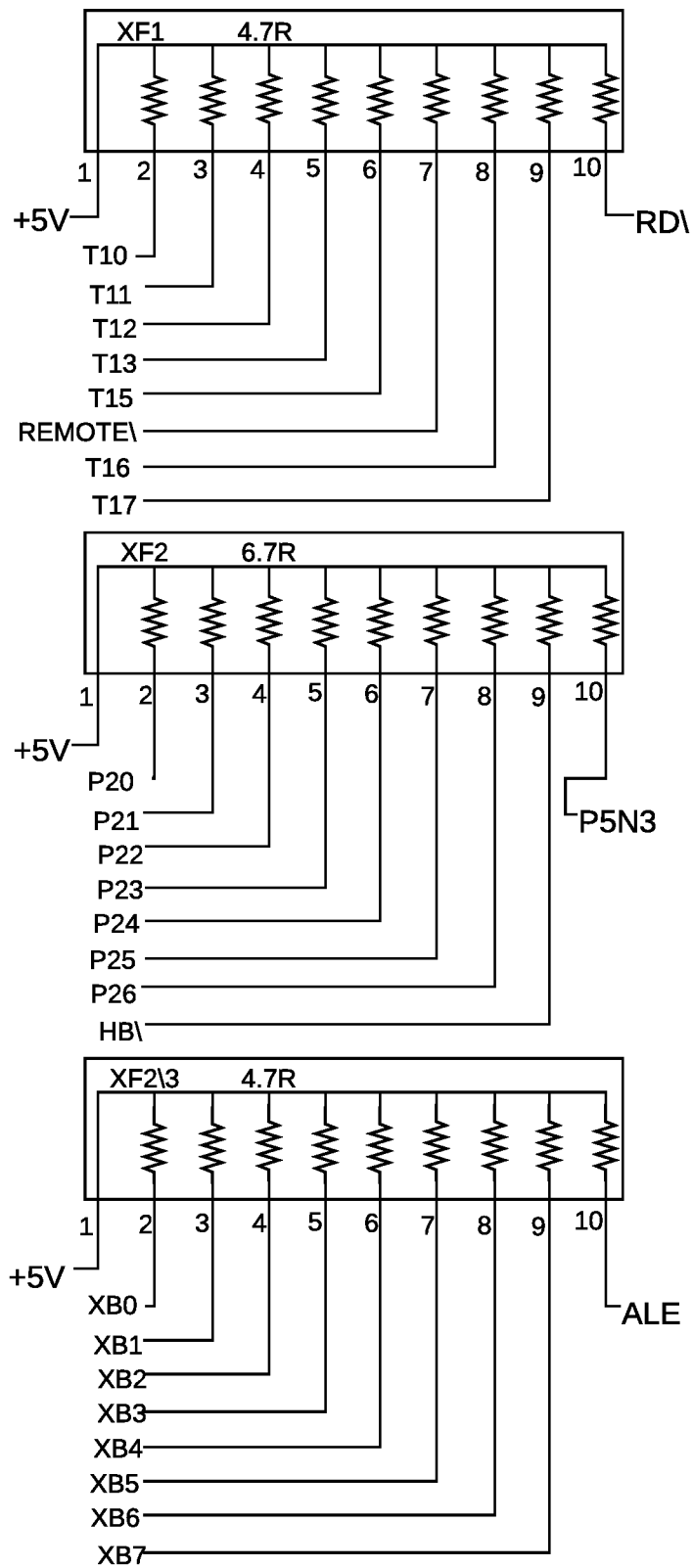
Figure 10A:
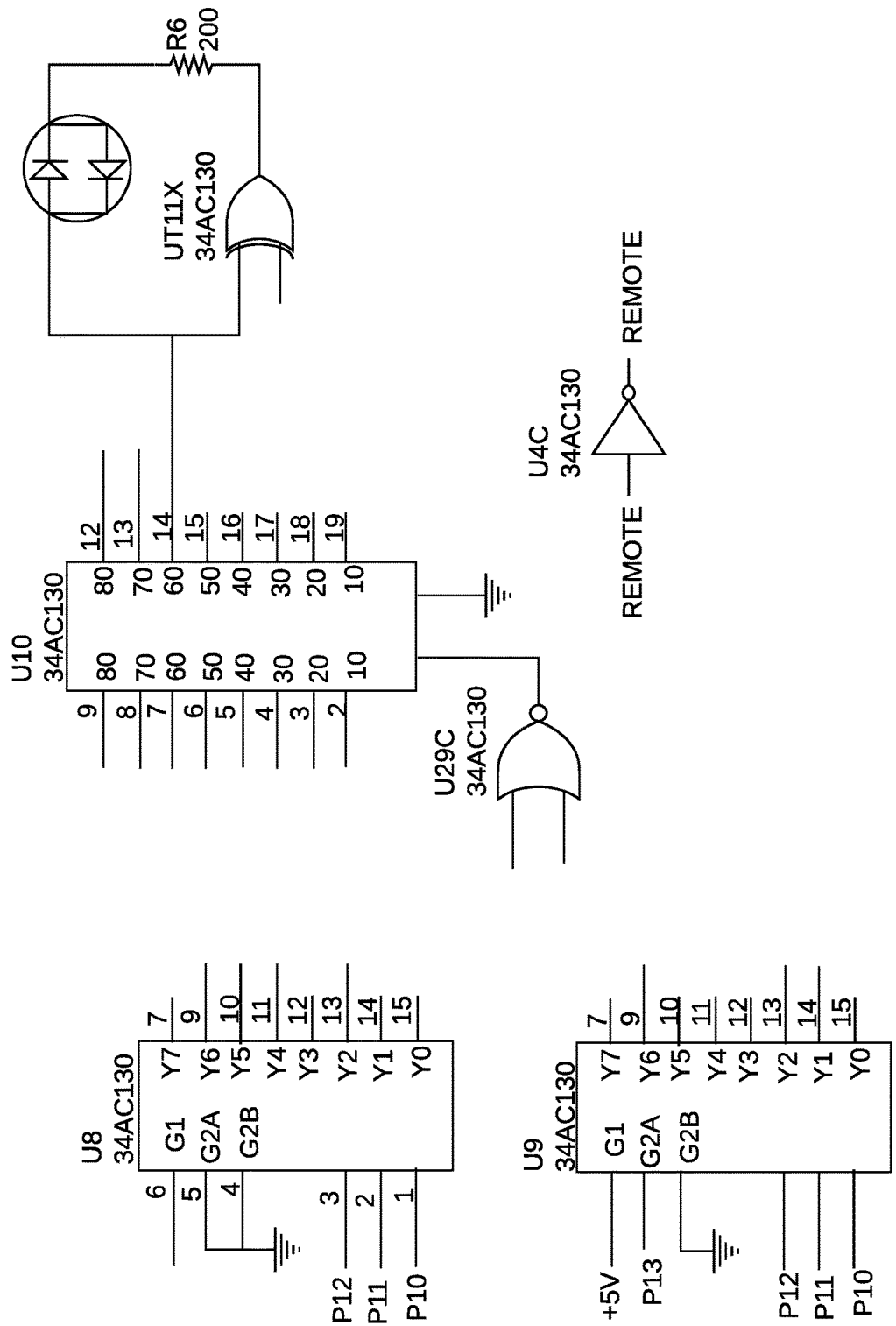
Figure 10B:
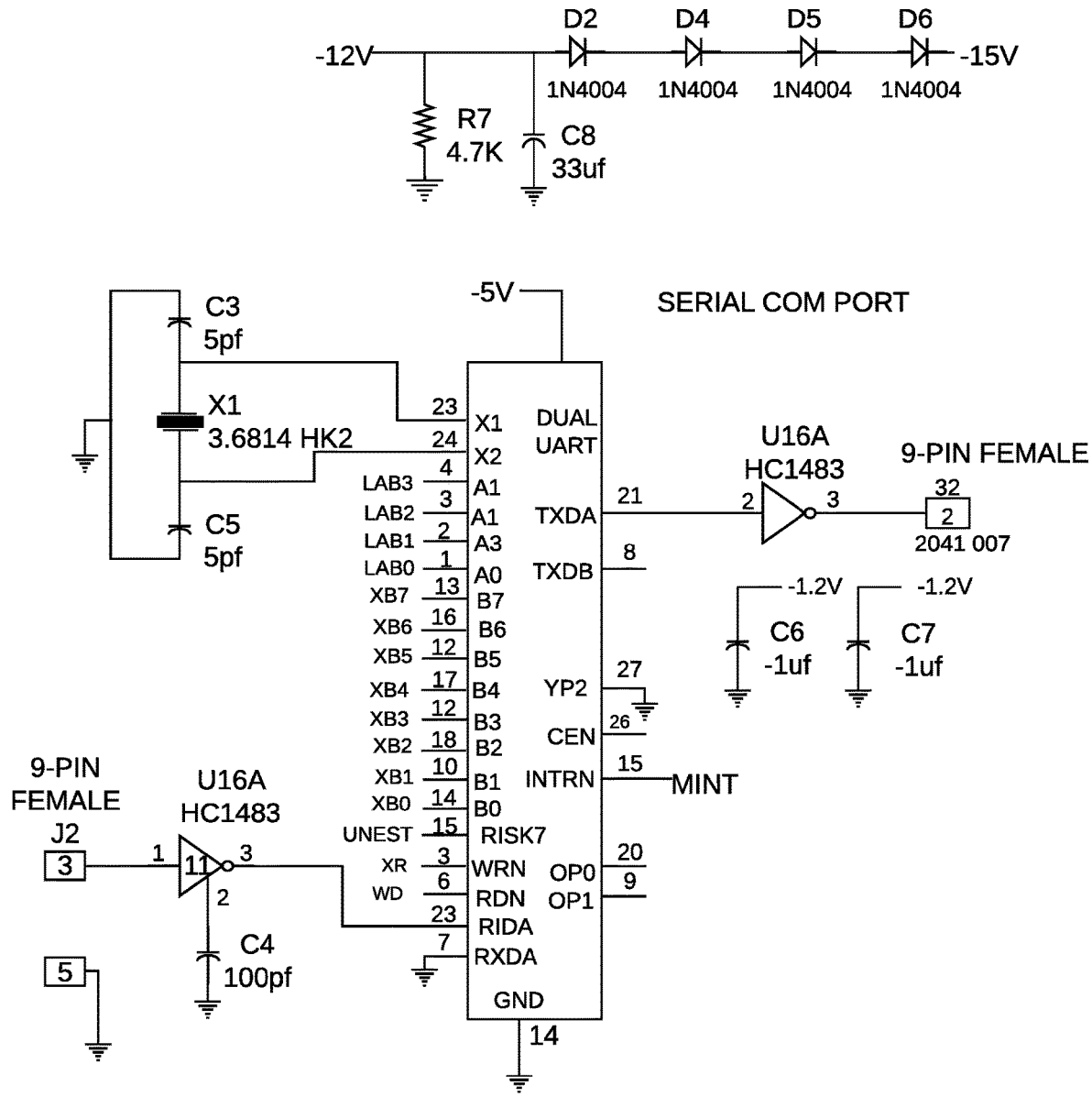
Figure 10C:
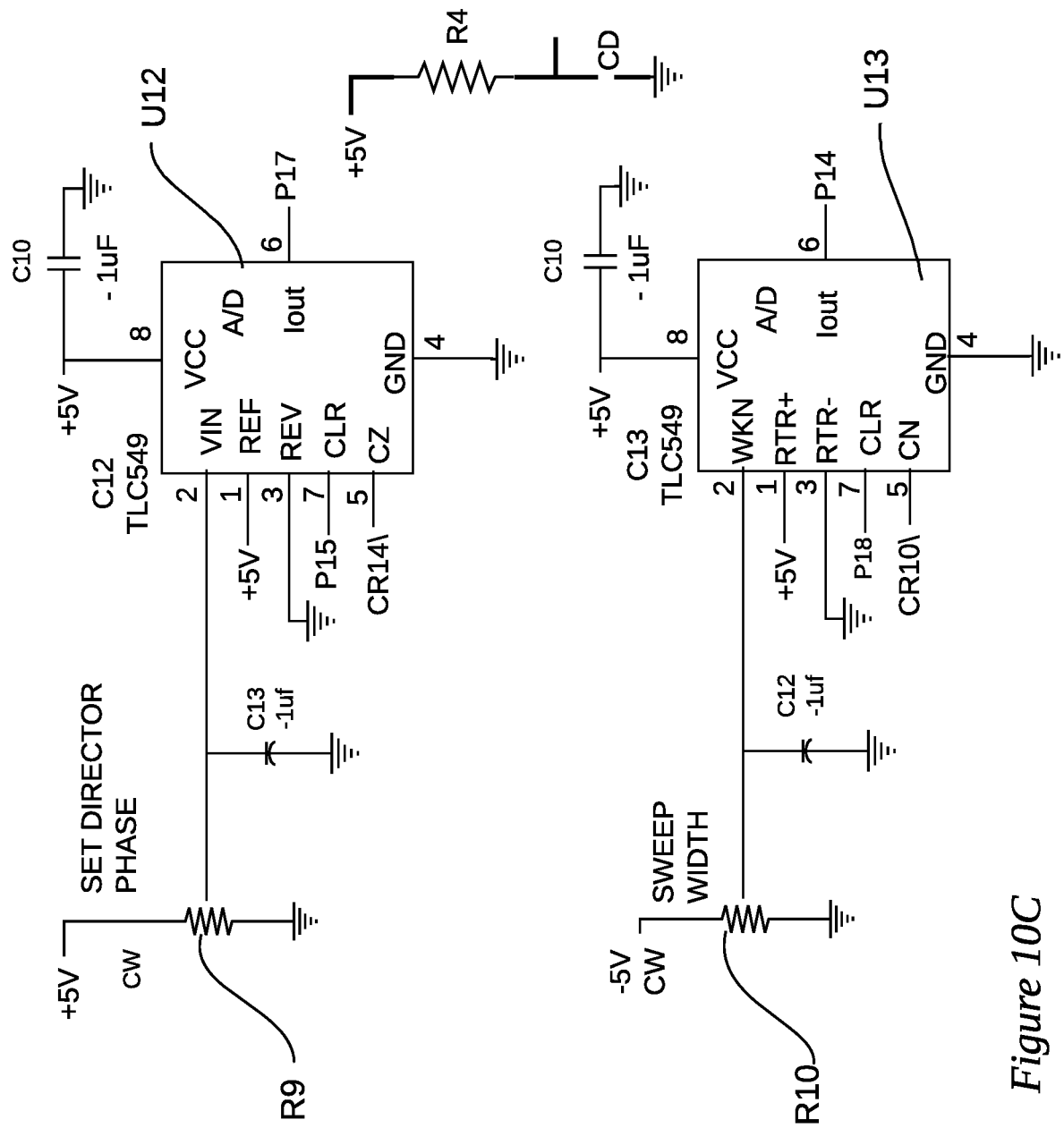
Figure 10D:
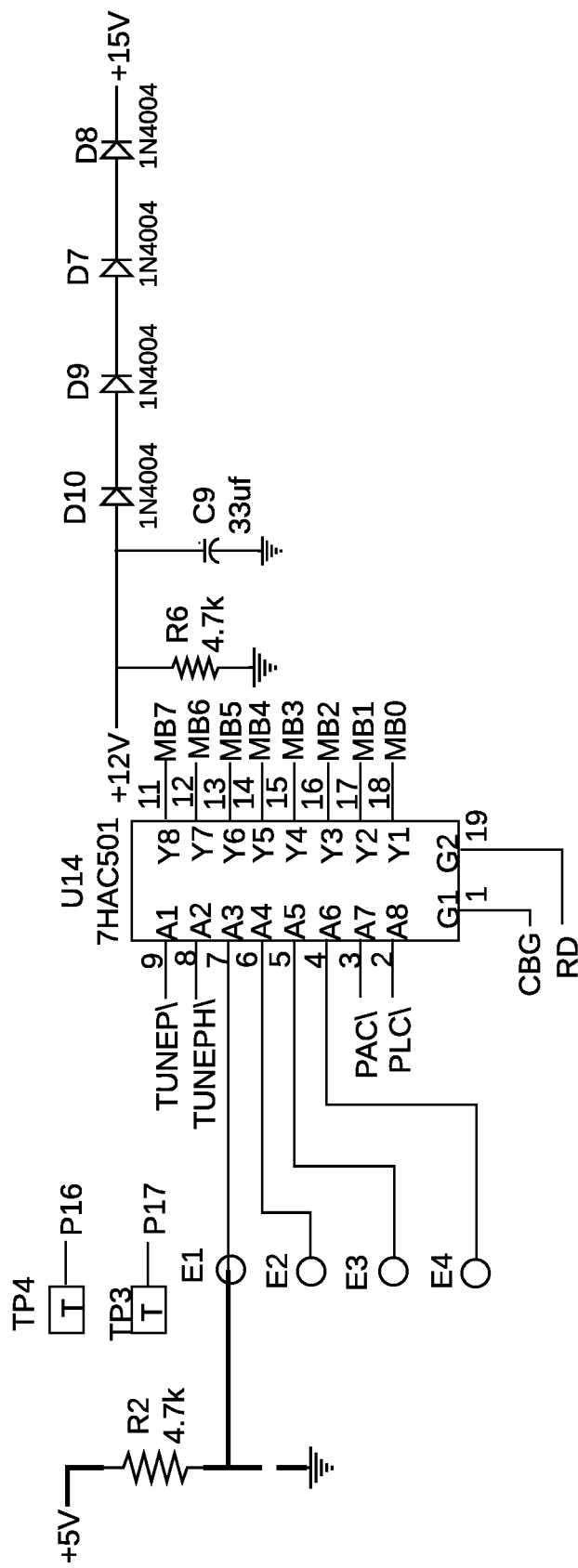

An EPR coil driver is also disclosed according to some embodiments of the invention. An example of block diagram of an EPR coil driver is shown in FIG. 8. Various circuit diagrams are provided as examples of embodiments of the invention. The lower left blocks shown in FIG. 8 are often referred to as the upper card and represented by circuit diagrams shown in FIGS. 9-13. The other blocks shown in FIG. 8 are referred to as the lower card and are represented by circuit diagrams shown in FIGS. 14-19.

This example, however, should not be interpreted as limiting the scope of the invention. In some embodiments the EPR coil driver can be a microprocessor controlled, feedback stabilized, and/or a push-pull power amplifier design with digital frequency synthesis and/or output amplitude control. Individual sections of the block diagram, with reference to the schematic diagrams, are described below.

Frequency Synthesis and Control

The scan frequency can be synthesized, for example, in sinusoidal form by a Direct Digital Synthesis (DDS) chip U29 shown in FIG. 13. Control of the frequency can originate at the front panel frequency control potentiometer R22 shown in FIG. 11 and/or the frequency range switch SW3 of FIG. 12. An analog frequency control voltage can be conditioned by U22A shown in FIG. 11 and/or U24A in FIG. 13. This voltage (e.g., 0 to 4 V D.C.) can be digitized to 16 bits by U25 and acquired by microprocessor U1 in FIG. 9.

The microprocessor firmware code can then processes the 16 bits of frequency control in the following manner.

In some embodiments, the DDS control space can be 28 bits wide with the least significant bit (LSB) equal to MCLK/228, where MCLK is the DDS master reference clock. MCLK can be run, for example, at 25 MHz, derived from the 50 MHz primary oscillator U3 shown in FIG. 9. The 50 MHz can be divided by 2 and made 50/50 symmetrical at U5A. The 16 bits of frequency data, which originate at the manual frequency control pot, can be placed in the 28-bit DDS control space at a different position for each frequency range. This can set the frequency resolution for each range. A constant is then added as an offset for each range. This sets the minimum frequency for each range. The maximum frequency for each range then is the LSB value times the front panel frequency control setting plus the offset value. This gives each range the full 16 bits of resolution but starting at a different minimum value and having different absolute frequency values for their LSB resolutions. The purpose of all of this digital manipulation and very fine (16-bit) frequency resolution, in each of 3 ranges, is to give the frequency control knob an "analog feel". This provides a sense that tuning the frequency to the coil resonance has nearly "infinite" resolution despite the digital control required by the DDS chip. The frequency resolution required to easily tune a resonant circuit is dependent on the Q of the circuit. Higher Q can require higher frequency resolution. In the case of the scan coil resonance the Q is approximately constant over the frequency range of interest. Normally, considering the equation $Q=\omega L/R$ Q would increase linearly with frequency for constant R but the scan coil wire has increased resistance with frequency due to the A.C. resistance effect. So Q is nearly constant with frequency, except at the very lowest frequency where the resistance is dominated by the DC resistance value. In some embodiments, the frequency resolution as a percent of the frequency value can stay approximately constant with frequency.

Figure 12A:
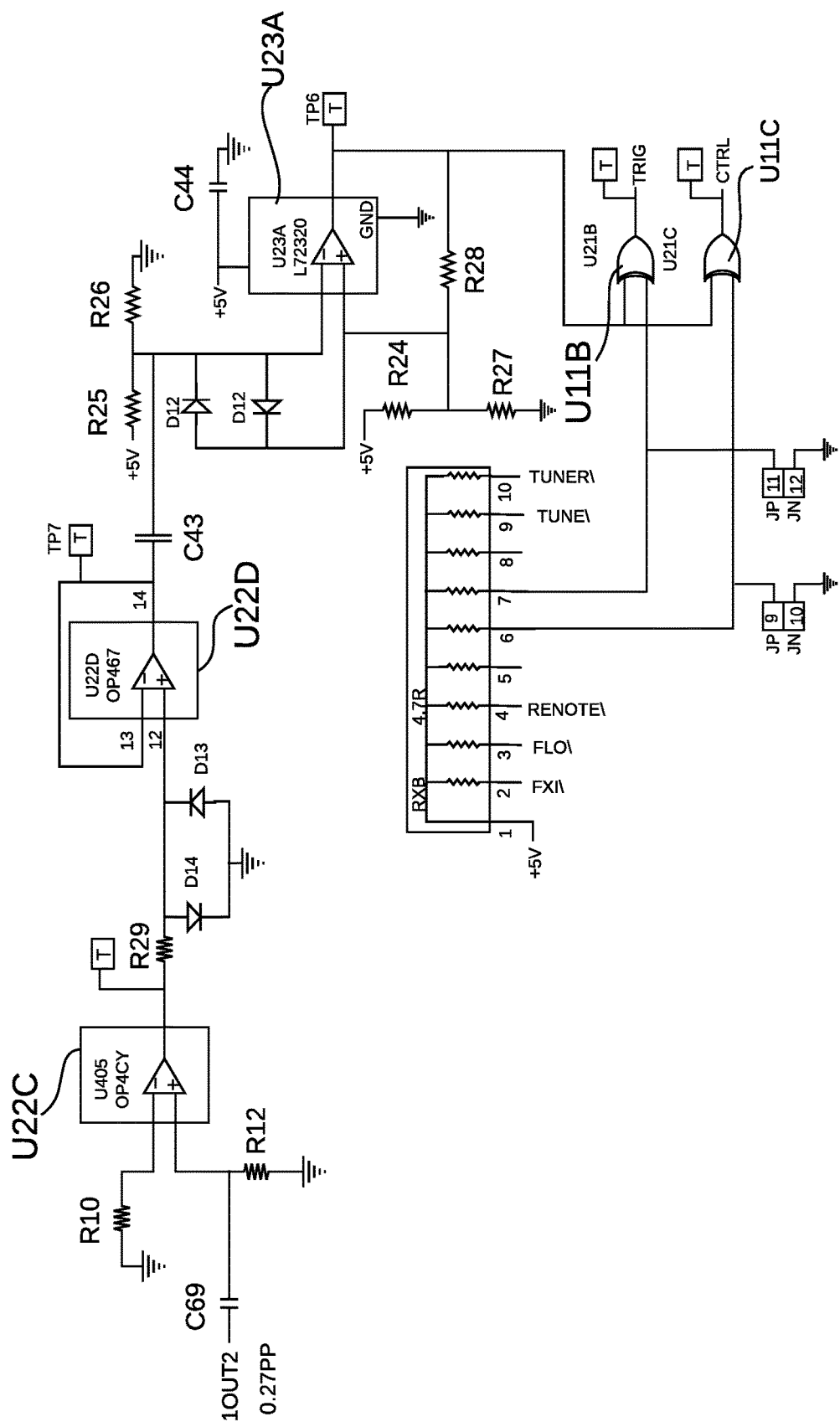
Figure 12B:
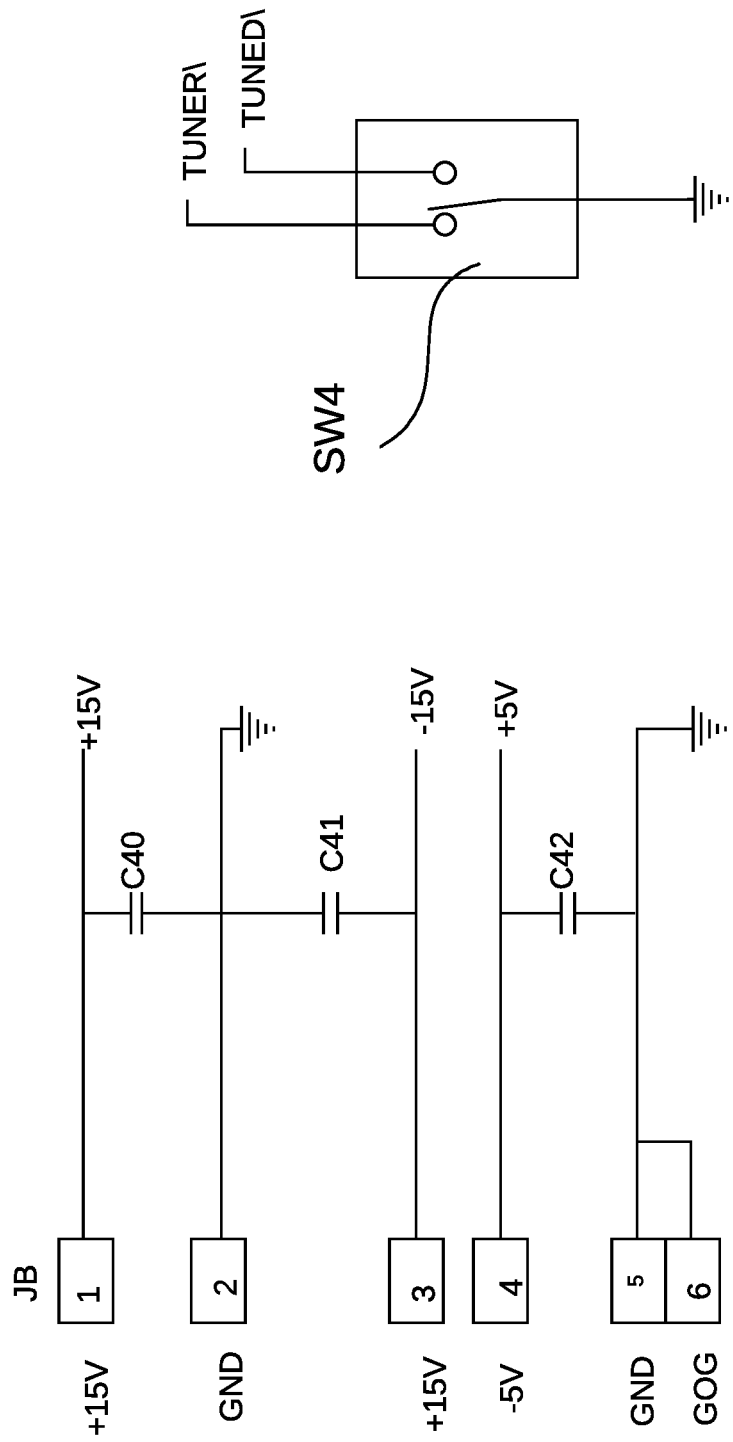
Figure 12C:
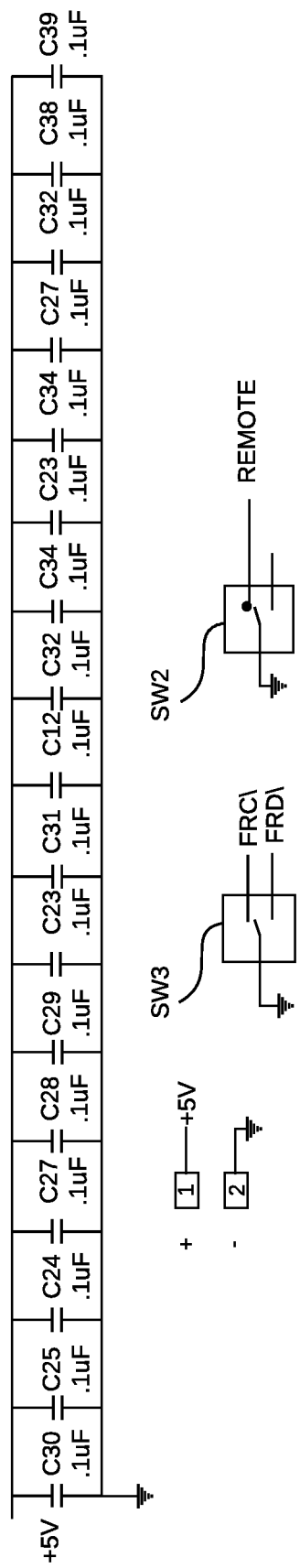
Figure 13A:
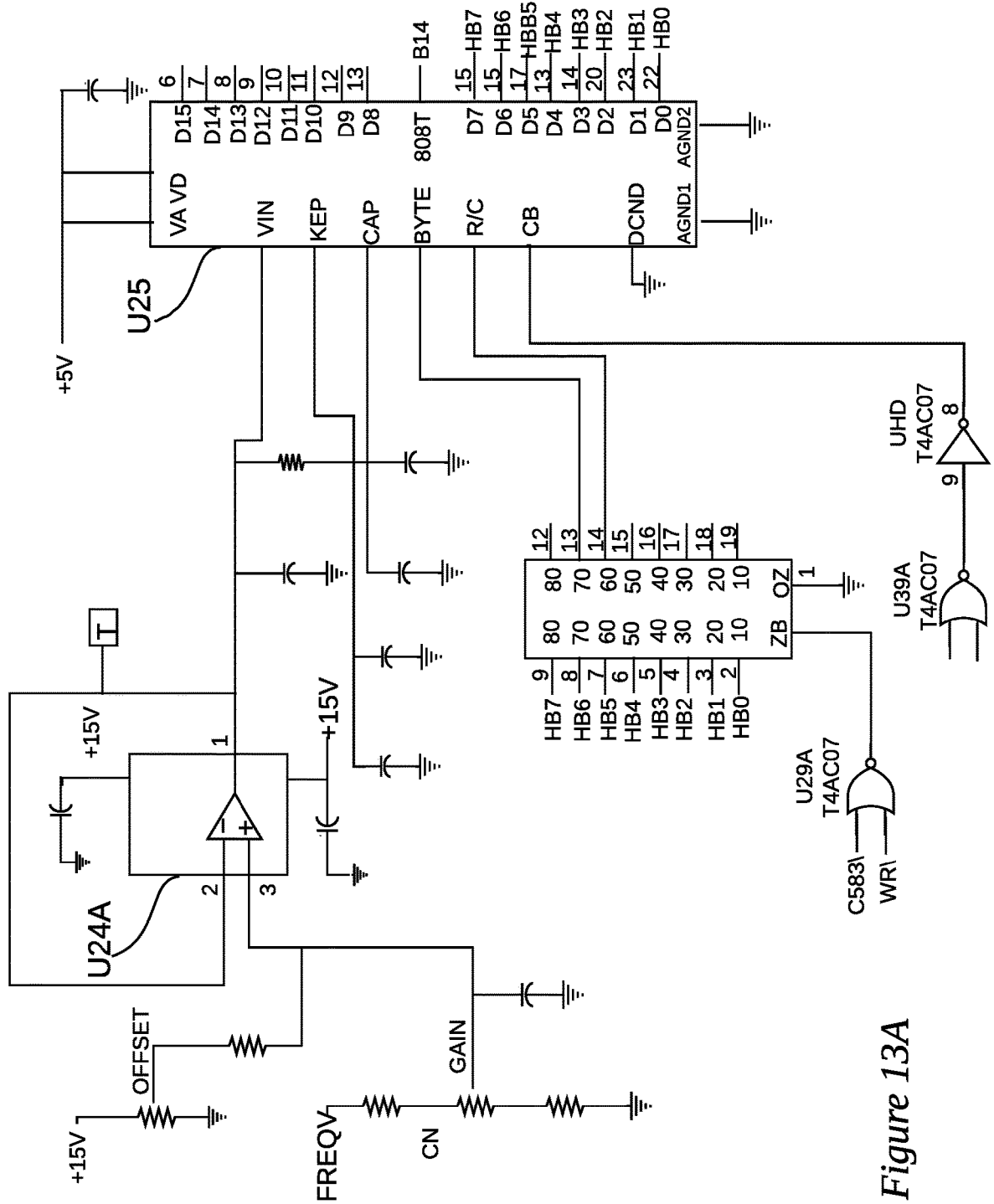
Figure 13B:
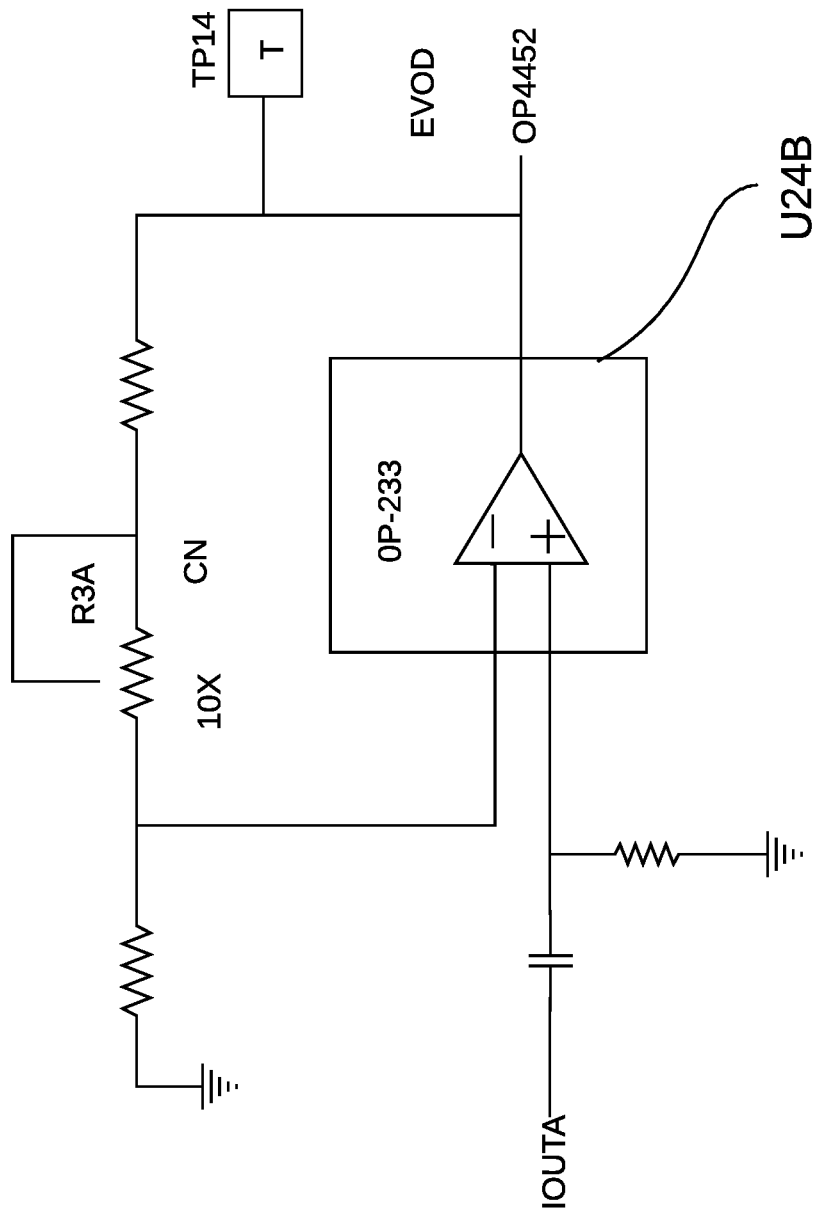
Figure 13C:
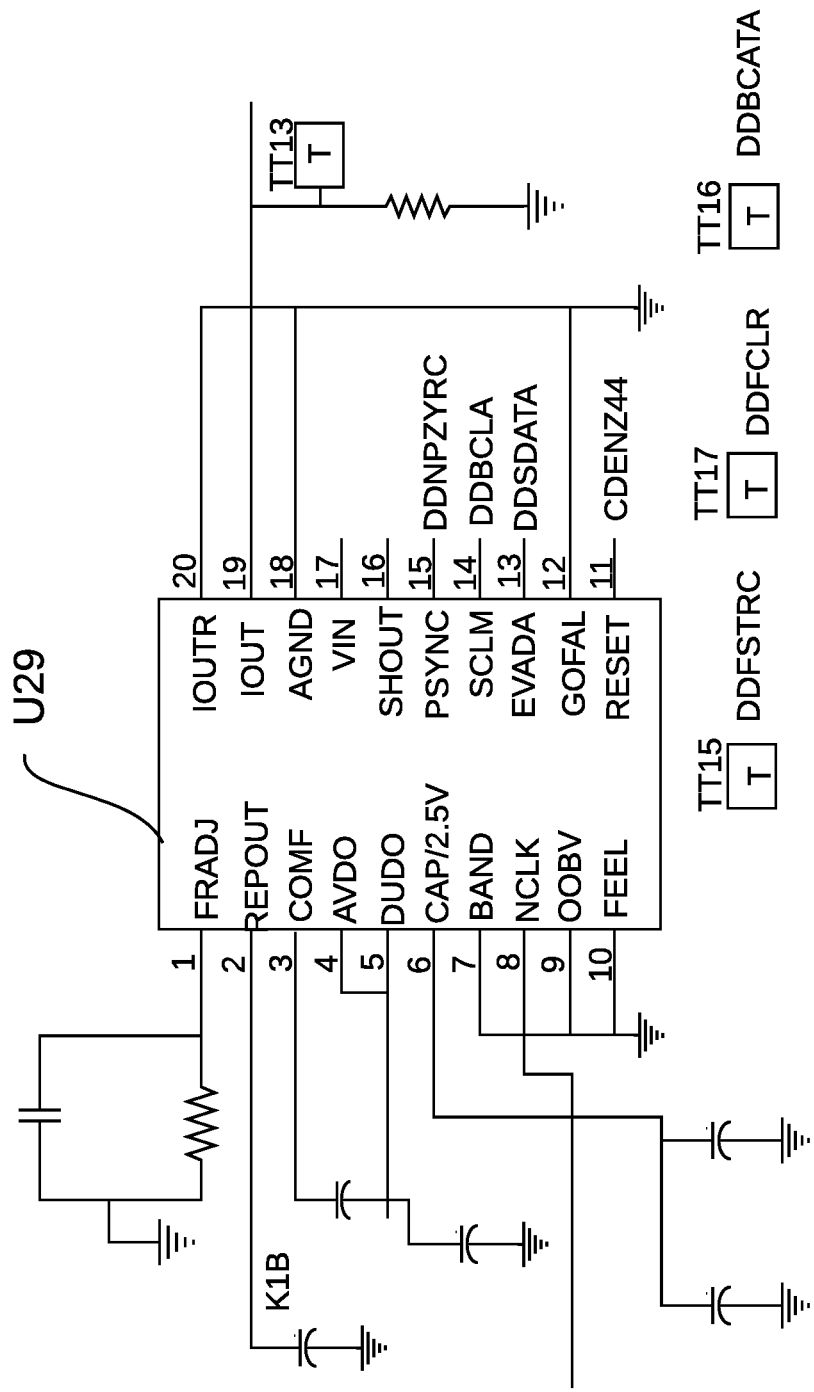
Figure 13D:
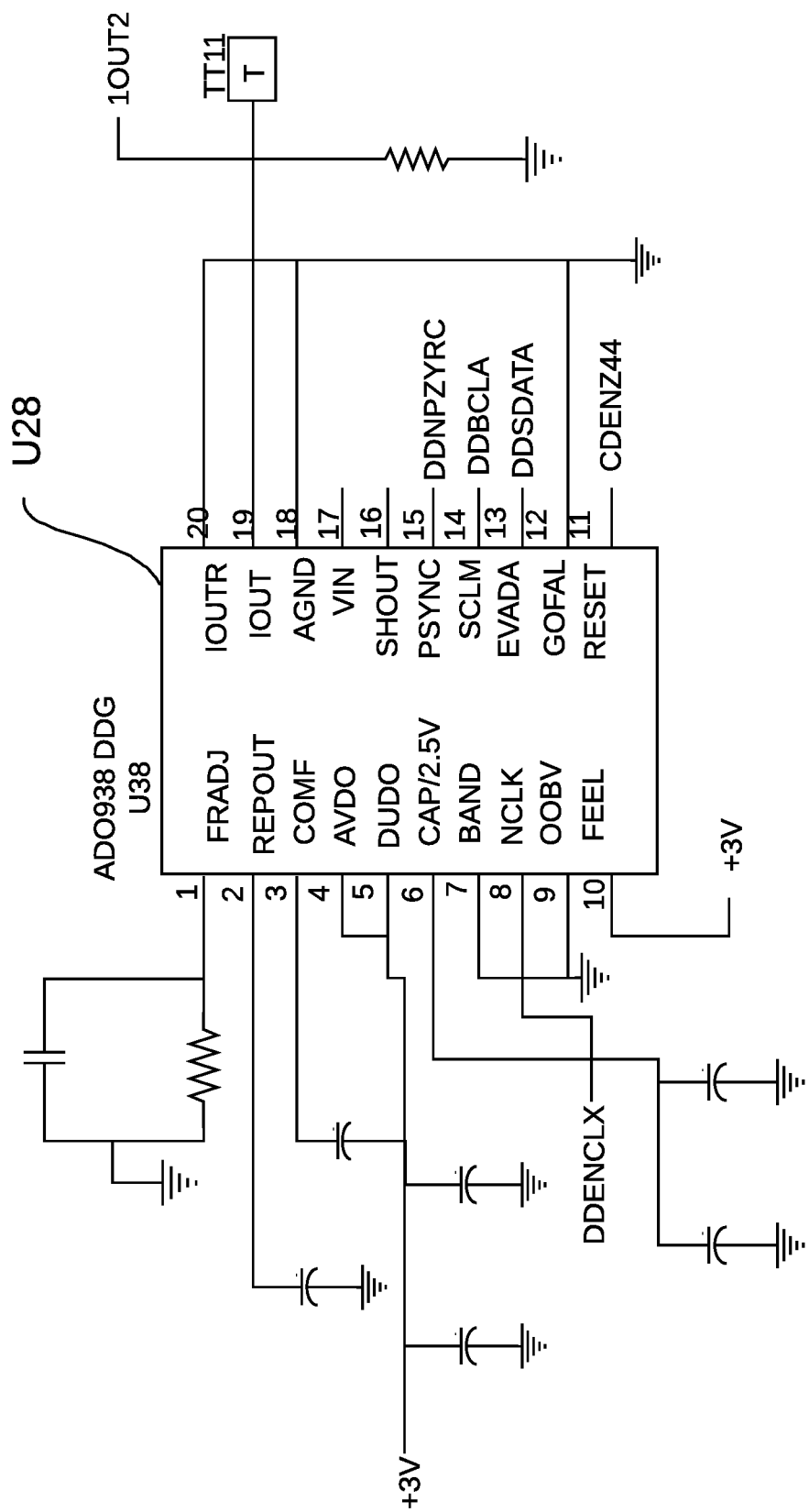

In conjunction with the frequency control potentiometer is the frequency lock switch SW4 shown in FIG. 12. This switch may be held in a spring-loaded position when the frequency is tuned, and returns to the lock position when released. The lock position records a single digital number in the microprocessor memory that represents the frequency. This will hold until power is turned off. By this mechanism the analog circuits associated with the frequency control potentiometer and the A/D converter, which could drift over time, are disconnected from the DDS, so the frequency will not drift any more than the highly stable primary oscillator. When power comes up, the microprocessor reads the current setting of the control pot, which will set the initial frequency approximately to where it was when the power was turned off, if the potentiometer has not been changed.

The sinusoidal output of U29 can be amplified and the D.C. component can be removed, by amplifier U24B shown in FIG. 13. The output of this stage is then sent to the lower card, described later, for use in producing the sinusoidal scan current.

Sampling Phase Control

Second DDS U28, shown in FIG. 13, can be used to create a square wave that is synchronized to the scan frequency but adjustable in phase with respect to it. Second DDS U28 can be programmed at the same time and with the same values as DDS U29 except for the phase parameter. In some embodiments, the phase parameter of second DDS U28 can be set to 180 degrees as the neutral position. The phase parameter has a range of 0 to 359.9 degrees so by starting at the middle for the adjustment range gives about equal range on each side. Normally the phase only has to be adjusted a few degrees. The phase adjustment can be manual and can start with the front panel potentiometer R9 shown in FIG. 10. The analog voltage from potentiometer R9 can be immediately digitized to 8 bits by A/D converter U12. The center scale value will become a value of 180 degrees phase, which the microprocessor loads into the second DDS U28.

Since the final use of the phase shifted signal is as a square wave, the sinusoidal output of second DDS U28 can be converted to a square wave while introducing as little jitter as possible. Second DDS U28 has a direct square wave output, but it has a 1 MCLK period ambiguous state transition jitter (40 ns). In some embodiments, this can be unacceptable and a square wave converter can be implanted as shown in FIG. 12. The D.C. component of the sinusoidal output of the DDS can be removed and the A.C. component is applied to a high gain, open loop amplifier U22C. This can drive the amplifier to ±saturation with a very fast transition at the zero crossing, limited only by the slew rate of the amplifier (e.g., 170 V/µs). Following open loop amplifier U22C a diode clipper can limit the transition to ±0.7 V. At the specified slew rate the 1.4 V transition can take, for example, about 8 ns. This signal can then be buffered by amplifier U22D and applied to comparator U23A. The comparator uses hysteresis and high gain to further reduce the transition time to about 4.5 ns. Comparator U23A output can be applied to EXOR logic gate U11B and/or EXOR logic gate U11C which are high gain, fast transition devices. Final output of these gates is a square wave with about, for example, a 2 ns rise time and less than 5 ns jitter. EXOR logic gate U11B and/or EXOR logic gate U11C can also serve as 180 degree phase shifters, if needed. The signal at this point is nominally 180 degrees shifted from the scan current waveform. EXOR logic gate U11C can be used to shift it back to the 0 degree phase for use by the feedback detector on the lower card. EXOR logic gate U11B can be used to drive the output trigger generator with the 180 degree phase signal.

Generation of the Trigger Output

The coil driver can provide an output signal that can be used to trigger a spectrometer digitizer. The operator can adjust the trigger delay to occur at any point on the sinusoidal current waveform. The trigger delay one-shot U19A, shown in FIG. 11, can be triggered by EXOR logic gate U11B. This signal can be approximately synchronized with the zero crossings of the scan coil current at 180 degree phase. This positions the start of the trigger delay at the zero crossing of the current where the current direction is decreasing. Front panel trigger delay control potentiometer R23 in FIG. 15 can then be used to position the digitizer trigger anywhere on the current sinusoid. The delay range is adjusted automatically to fit each of the three frequency ranges by selection of resistors through analog switch U18 in FIG. 11. The length of the trigger pulse can be set by internal adjustment potentiometer R15 with an adjustment range of approximately 200 to 1000 ns, normally set to 500 ns. Three output triggers can be driven by a cable driver, one to trigger the digitizer, one to trigger an oscilloscope and another for any purpose that might be useful.

Sweep Width Control

Sweep width can be controlled either manually from the front panel or remotely via the RS232 serial port. Manual sweep width control can originate at the front panel potentiometer R10 shown in FIG. 10. The variable analog voltage from potentiometer R10 can be immediately digitized by A/D converter U13 to 8-bit resolution. The microprocessor can read in the value and store it. The acquisition of the value can be read about 1500 times per second and averaged. The averaged values are then subjected to a short term hysteresis algorithm that prevents LSB ambiguity jitter. The hysteresis algorithm does not prevent access any of the 256 states of the A/D. The stored value, after averaging and hysteresis processing, can then be applied to the D/A converter U21 shown in FIG. 11. The output of the D/A is an analog voltage that commands the feedback system to set a corresponding sweep current. The voltage at the output of the D/A has the scale factor of 0.5 Vdc/App of scan current. The range is 0 to 3 Vdc (0 to 6 App of scan current).

In some embodiments, the reason for going through the microprocessor, and doing both A/D and D/A conversions, is so that the scan width can be controlled remotely from a PC or other digital source. The manual system described above has 8-bit resolution but the D/A part of it has 12-bit resolution. This allows the remote control of sweep width to have 12-bit resolution if needed. When REMOTE operation is selected by switch SW2 shown in FIG. 12, the microprocessor can ignore the manual sweep width potentiometer and can obtain the sweep width value from the serial data port. After power up, if in REMOTE mode, the WAITING LED will glow until a sweep width value is received from the remote source. After the value is received it will glow and the scan current will be enabled.

Microprocessor Functions

Any type of microprocessor can be used. For example, in some embodiments, the microprocessor can be a standard 8051 process. Microprocessor U1, shown in FIG. 9, can be coupled with, for example, EPROM program memory U6. The processor can be clocked at any speed (for example, at 12.5 MHz) derived from division U5A and/or division U5B of the fundamental oscillator U3. There are no processing speed issues in this design except possibly the averaging time for the front panel potentiometer readings. If it were too slow, the controls would seem sluggish. Enough averaging has to be done in the 8-bit A/Ds to insure S/N well above 256:1 or else there could be LSB jitter.

Sweep Width Feedback Control System

Embodiments of the invention can implement any feedback stabilized control system. For example, embodiments of the invention can use error determined output and/or error modified output feedback stabilized control systems. In some embodiments, an error determined output system can be used where the output waveform shape may be computed by the error amplifier. Some embodiments can include a linear scan driver where the driving voltage wave shape to the coils is unknown until the error amplifier computes it. In other embodiments, for example, with a resonated coil system, the wave shape is known to be sinusoidal for all operating conditions. With the wave shape fixed, the only parameters to be controlled are the frequency and amplitude. The sinusoidal wave shape and its frequency are synthesized on the upper card as described above. The feedback system on the lower card can control the current amplitude as determined by the sweep width control system, also on the upper card. This can allow a lower gain error amplifier based on a D.C. voltage representation of the measured coil current.

Circuit Implementation of Sweep Width Feedback Control

Figure 15:
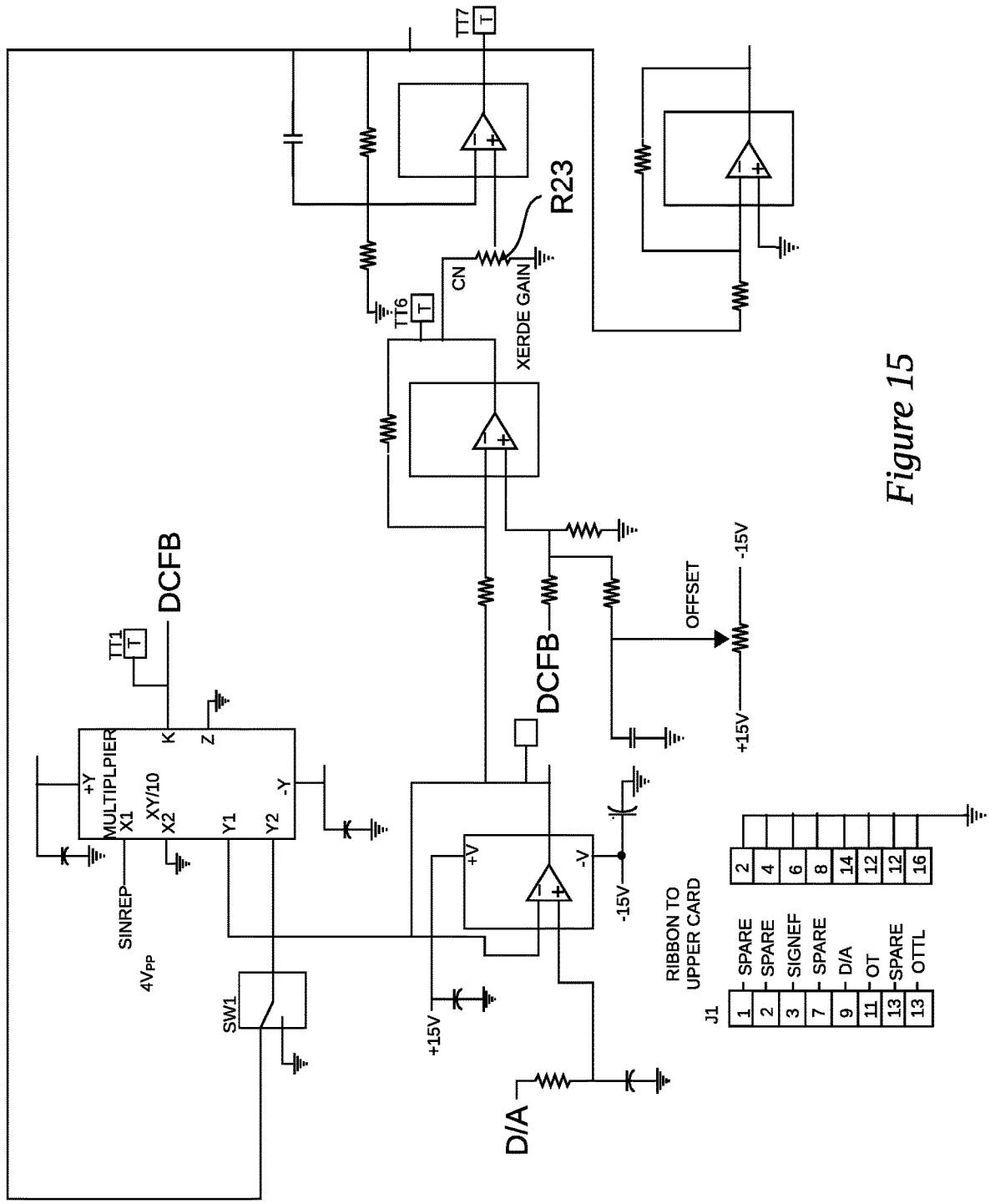

Referring to FIG. 15, the analog multiplier chip U3 can multiply the reference sinusoid by the sum of the error and the sweep width command voltage. These voltages can be scaled and the power amplifier gains can be set so that when the error is zero the command voltage times the reference sinusoid provides approximately the correct coil current. In the circuit, the coil current is represented by the label DCFB which has the same scale as the command voltage (labeled D/A from upper card), 0.5 V/App. The difference between the command and the DCFB voltage can be amplified to produce the error voltage. The error voltage is then summed with the command (with appropriate sign for negative feedback) and multiplied by the sinusoidal reference to produce an amplitude corrected sinusoid which becomes the drive to the power amplifier stages, labeled PAD.

Detection of the Coil Current

In some embodiments, to provide an accurate D.C. voltage proportional to the coil current, the current waveform may need to be accurately rectified. A simple diode bridge rectifier could be used if the current were always above the level represented by the typical diode threshold voltage. For the intended use of the coil driver, however, it can be important that low level detection should be as accurate as high level detection. A synchronous detector can be used to solve this problem. The synchronous detector can be implemented with an analog multiplier, U1, shown in FIG. 14. The voltage across the current sense resistor R1 can first be amplified by stage U2B and then applied to the multiplier. The other multiplier input is the phase adjustable TTL square wave produced on the upper card at a nominal zero degrees phase to the current waveform, labeled 0TTL. The TTL square wave may be centered on zero volts because the current waveform is centered on zero, so the TTL square wave (e.g., 0 to 5V) is offset by internal potentiometer R6. The potentiometer is adjusted to produce amplitude symmetry at test point TP2. The full wave detected waveform is then amplified by stage U2A and low-pass filtered at 100 Hz by the 4-pole Butterworth filter implemented by stages U2C and U2D. The output of the filter is the D.C. voltage representing the actual coil current, labeled DCFB used by the feedback system described above.

In some embodiments, potentiometer R6 can provide a means of adjusting amplitude symmetry. In some embodiments, the synchronous detector may need what might be called "time symmetry", that is, phase alignment between the TTL sampling waveform and the actual current waveform. The resonant circuit can nominally eliminate phase shift between voltage and current, but that phase null may be rapidly changing function at the resonant frequency. If the operating frequency is not exactly on resonance the phase can be shifted. In addition, there are fixed time delays in the system, primarily in the power amplifier stages. Fixed time delays translate into variable phase shifts as a function of frequency. The result is that the detector sampling phase may be adjusted for each operating frequency. This is done on the upper card and is described in the section "Sampling Phase Control".

Power Amplifier Stage

Figure 16:
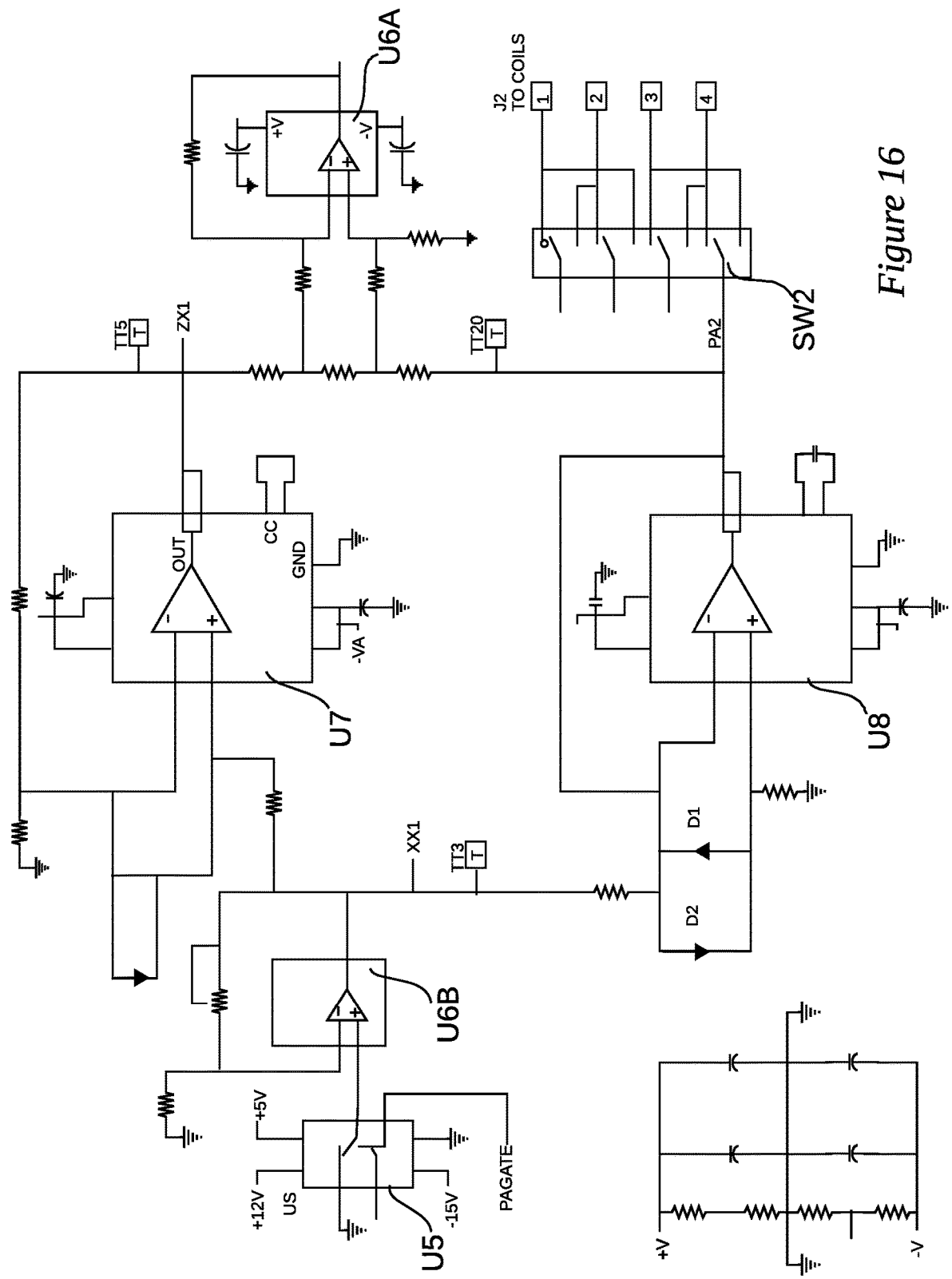

In some embodiments, the power output stage can comprise one or more amplifiers. For example, FIG. 16 shows two amplifiers U7 and U8. These amplifiers can include one or more forced-air cooled amplifiers (e.g., Power Amplifier Designs P/N PAD135). Amplifiers U7 and U8 can include or not include heat sinks, and can be attached to CPU heat sink/fan units. With ambient air at 23° C. the heat sink temperatures reach about 58° C. with 40 watts dissipated in each heat sink. Amplifier U7 can be non-inverting and may run at nominally zero degrees phase with respect to the coil current. Amplifier U8 can be an inverting configuration and may run at 180 degree phase with respect to the coil current. The net output voltage to the coils can then be two times the voltage of either amplifier alone. Pre-amp U6B can feed amplifier U7 and/or amplifier U8. Analog switch U5 can disable the power amplifier drive when in SET-UP mode or when an over-temperature condition has been registered. Differential amplifier U6A can measure the total output voltage as one of the observables in the scope monitor output. Switch SW2 can allow reversing the coil current without reversing any of the circuit polarities. The Rapid Scan EPR signal can be conventionally recorded as the up-field scan immediately following the digitizer trigger, but inverted placement of the coils in the B0 field can lead to the first signal after the trigger being the down-field scan. Switch SW2 can provide a way to correct for this without remounting the coils.

Heat Sink Temperature Monitors

Figure 18:
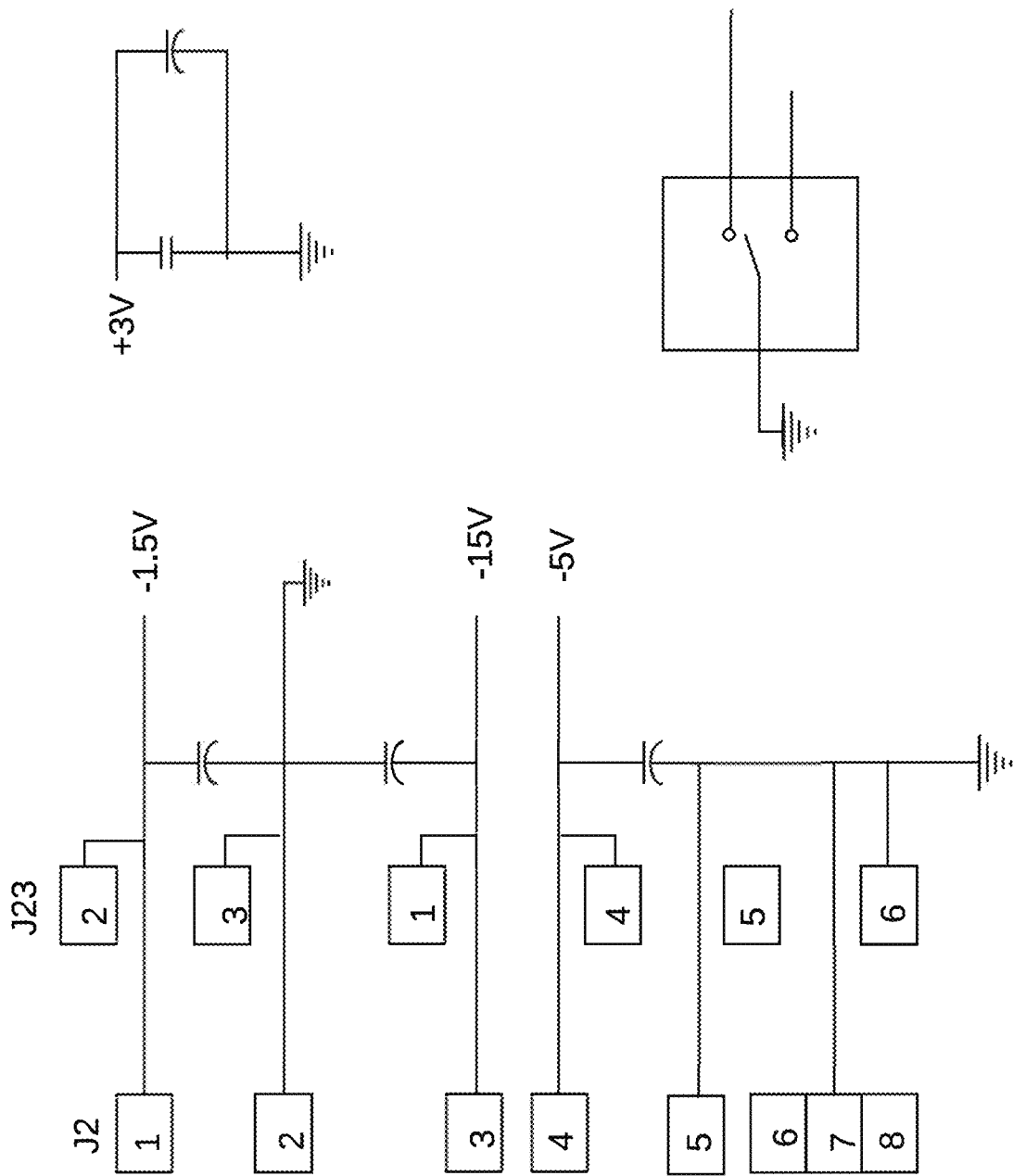
Figure 18:
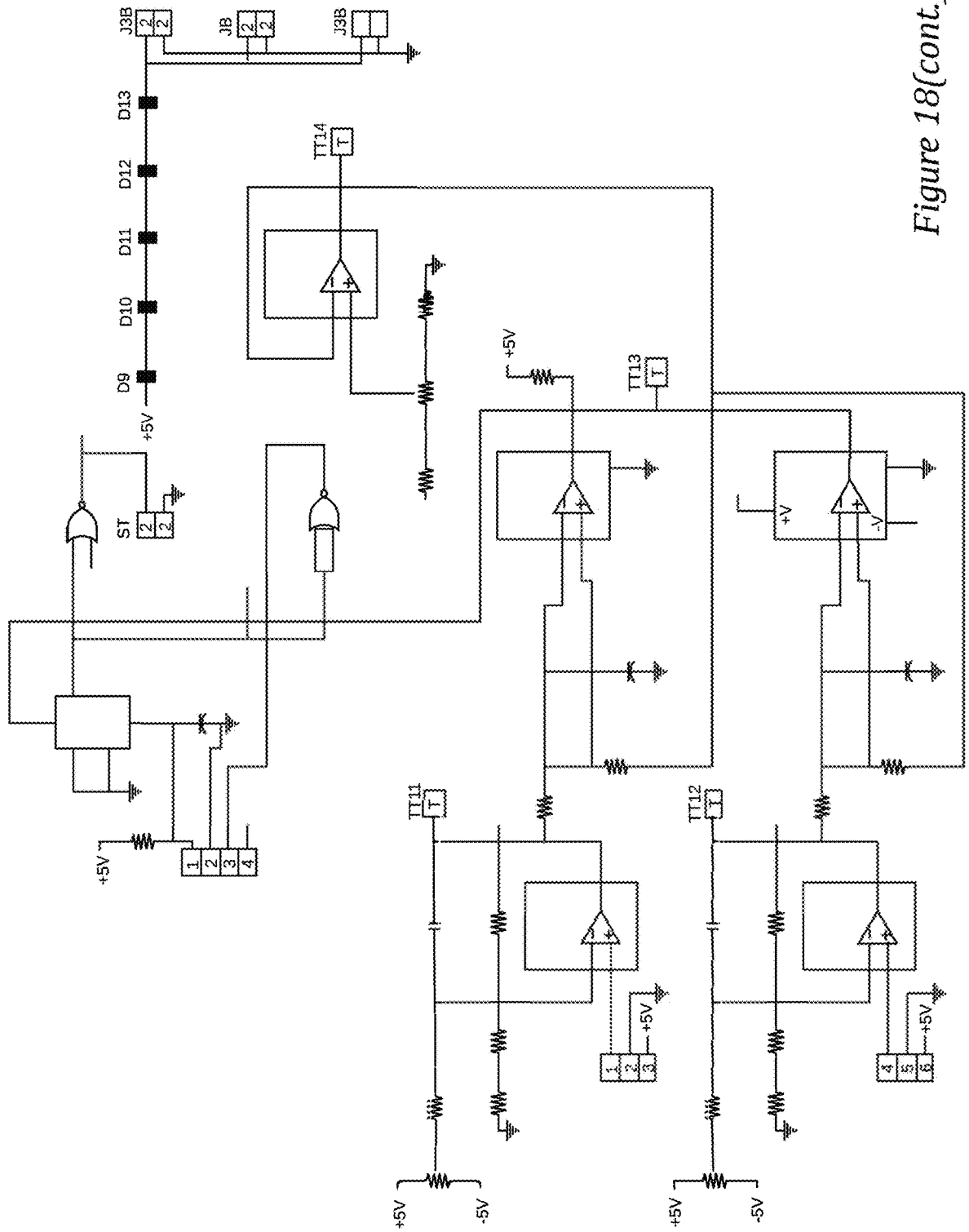

In some embodiments, as shown in FIG. 18, both heat sinks can be independently monitored with calibrated temperature sensors (e.g., National Semiconductor P/N LM35DZ). The output of the sensors can be amplified by stages U12B and U12C and threshold detected (with or without hysteresis) by comparators U13A and U13B. The OR of these comparator outputs sets flip-flop U15A if either sensor is at a temperature above the trip point. The trip point for over-temperature is set by internal potentiometer R68 at stage U12D. The trip point is nominally set to 60° C. which becomes about 62° C. after the application of hysteresis. The over-temperature register flip-flop (U15A) will stay in the over-temperature state until the front panel reset switch is activated. There is also a front panel over-temperature LED that indicates the state of the flip-flop. If an over-temperature condition has been registered the power amplifier drive is shut off at U5 (FIG. 16). Power-on resets the flip-flop to the normal state. The over-temperature condition is also sent to the upper card (signal label OT) to shut down the spectrometer triggers to stop the spectrometer and get the operator's attention.

Amplifier heating is a function of scan current, power supply voltage, and/or the A.C. resistance of the coils, which is in turn a function of scan frequency and the specific type of wire used in the coils. The heat sink temperature monitor will trip out at about 41 watts (e.g., approximately 60° C. heat sinks temperature).

Oscilloscope Monitor Output

Figure 17A:
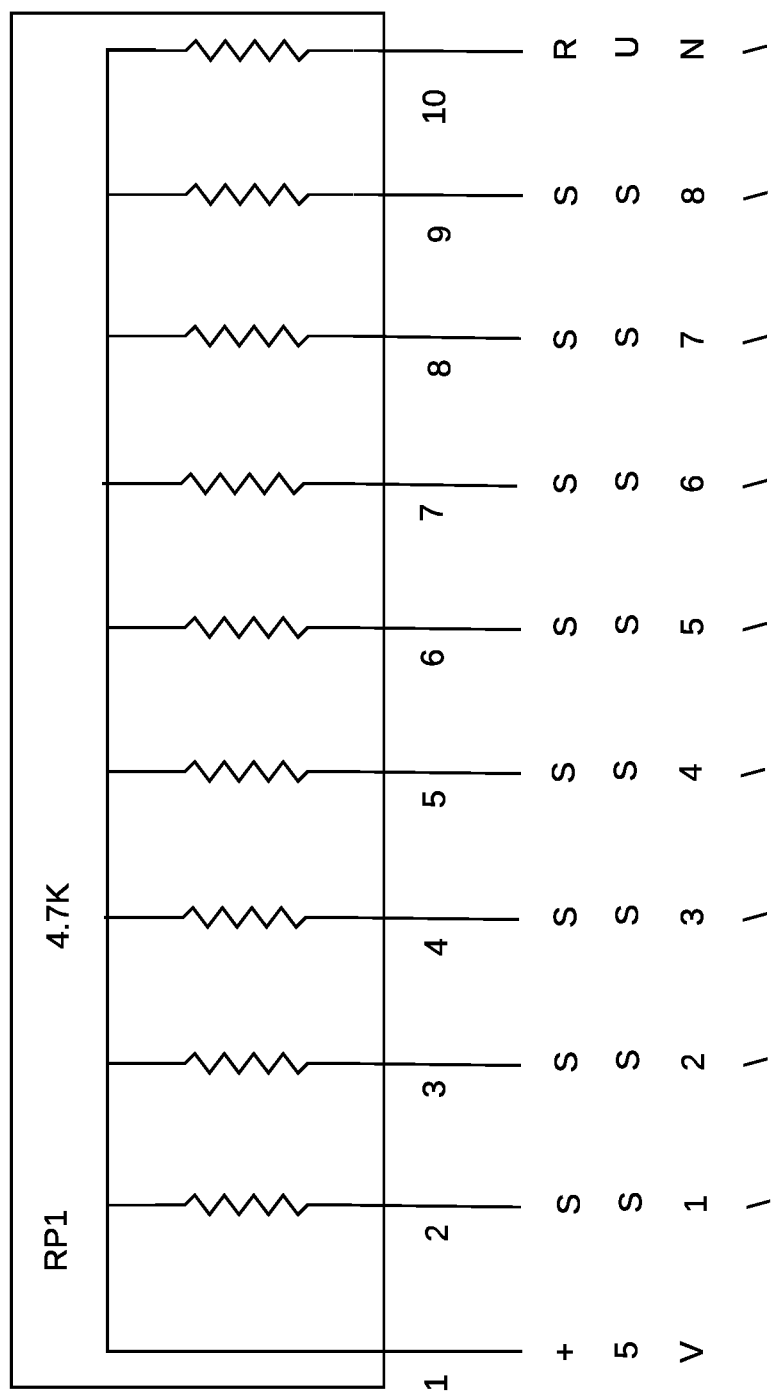
Figure 17B:
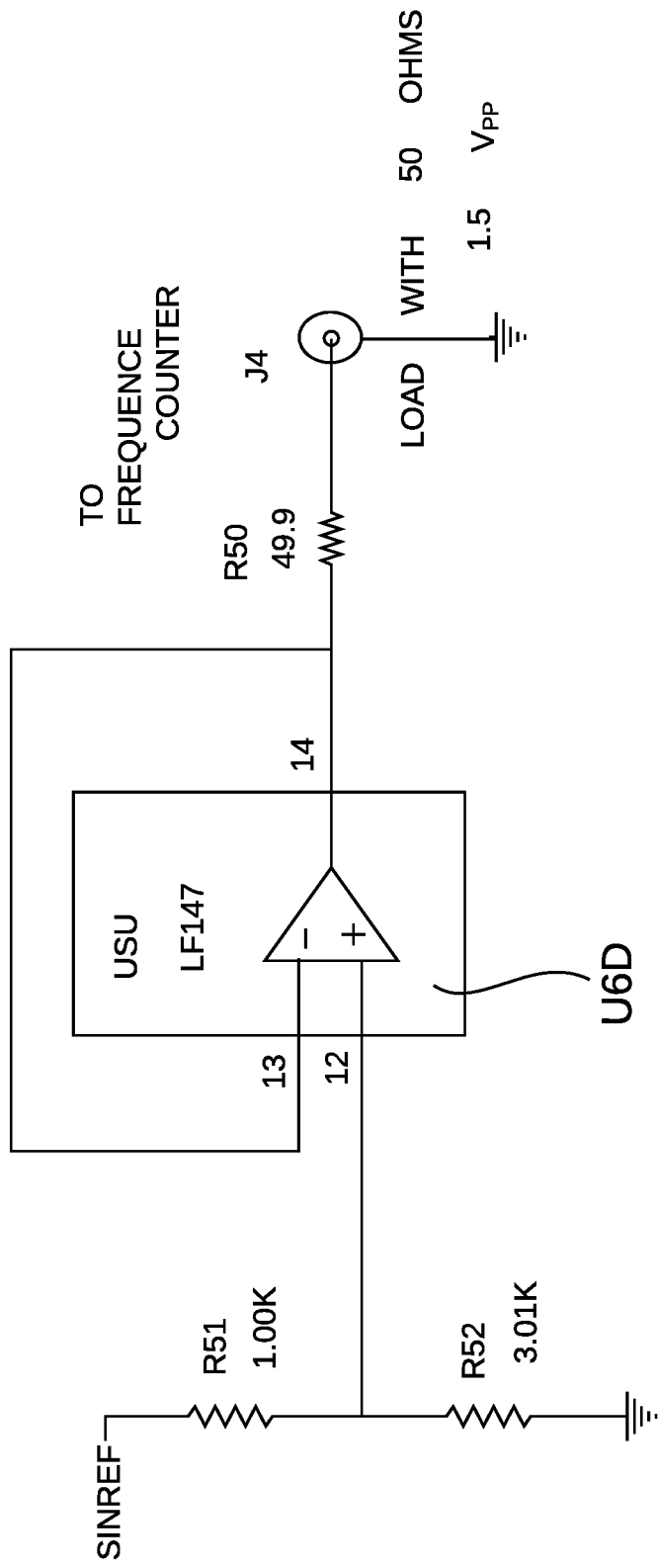
Figure 17C:
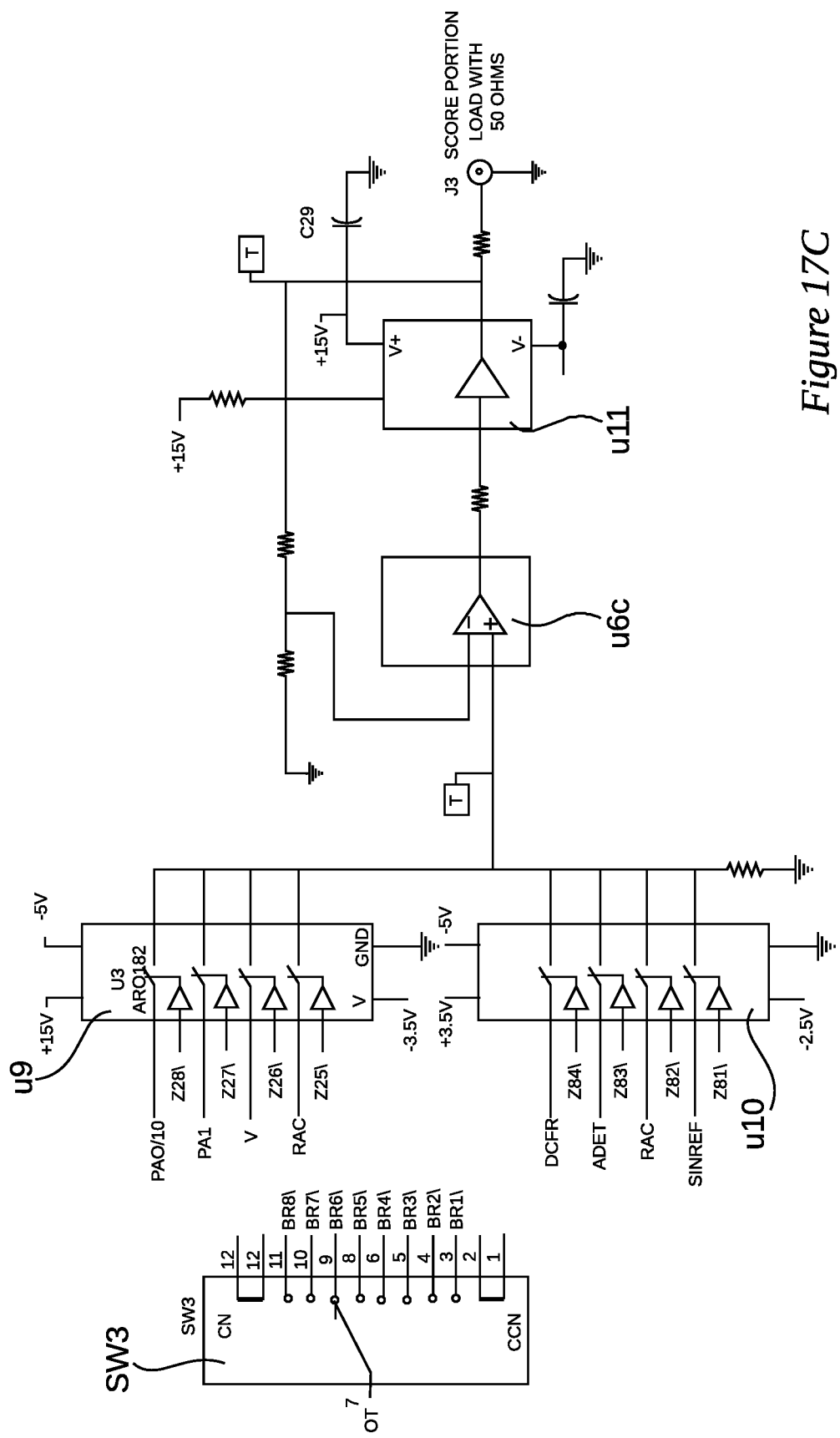

In some embodiments, as shown in FIG. 17 a front panel selector switch SW3 can provide a means to observe various internal signals in the coil driver. The signals are selected through analog multiplexers U9 and U10 and/or buffered by amplifier U6C and/or amplifier U11 and routed to a BNC connector on the rear of the unit. The output impedance of the buffer can be 50 ohms and the signals can be calibrated to be read with a scope input impedance of, for example, 50 ohms. The signals that can be selected, for example, can be: VR the sinusoidal reference voltage; a voltage representing the coil current at 1 V/A; DET, the detected voltage at the output of the synchronous sampler (amplified); Vf, the feedback D.C. voltage, which is DET after the low pass filter; VCS the sweep width control voltage generated by the microprocessor controlled D/A converter; Ve, the error voltage, which is a scaled version of VCS−Vf; PAi, the power amplifier drive at the input to the power amplifiers; PAO/10, the combined power amplifier output voltages (the voltage applied to the coils) divided by 10.

Front Panel Meter Circuit

A front panel 3½ digital panel meter can provide a selectable readout for various internal voltages and functions. The selections can be, for example: Heat sink #1 temperature (in ° C.); Heat sink #2 temperature (in ° C.); Sweep width (in App); +5V power supply voltage; +15V power supply voltage; −15V power supply voltage; +24V power amplifier supply; −24V power amplifier supply.

Figure 19A:
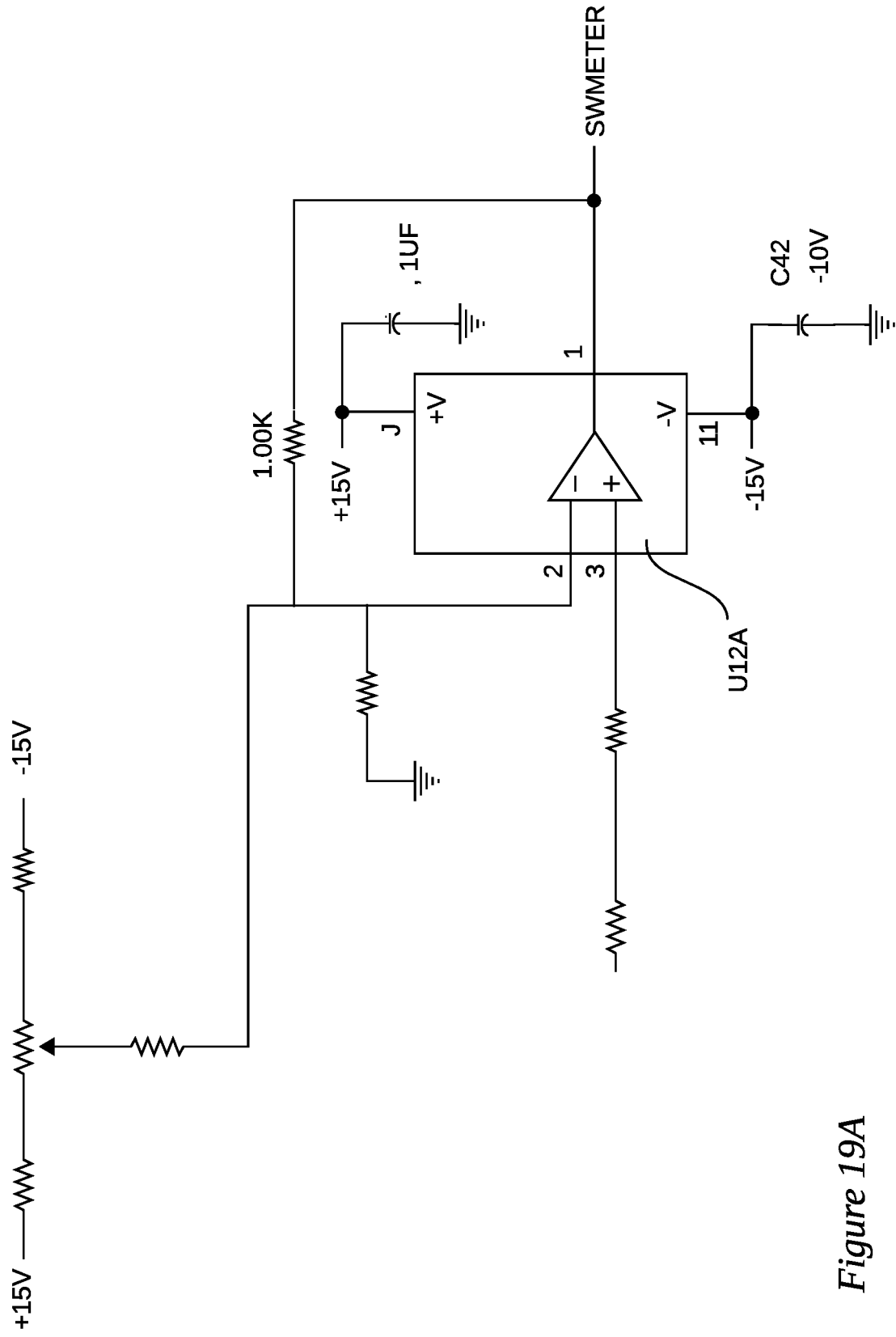
Figure 19B:
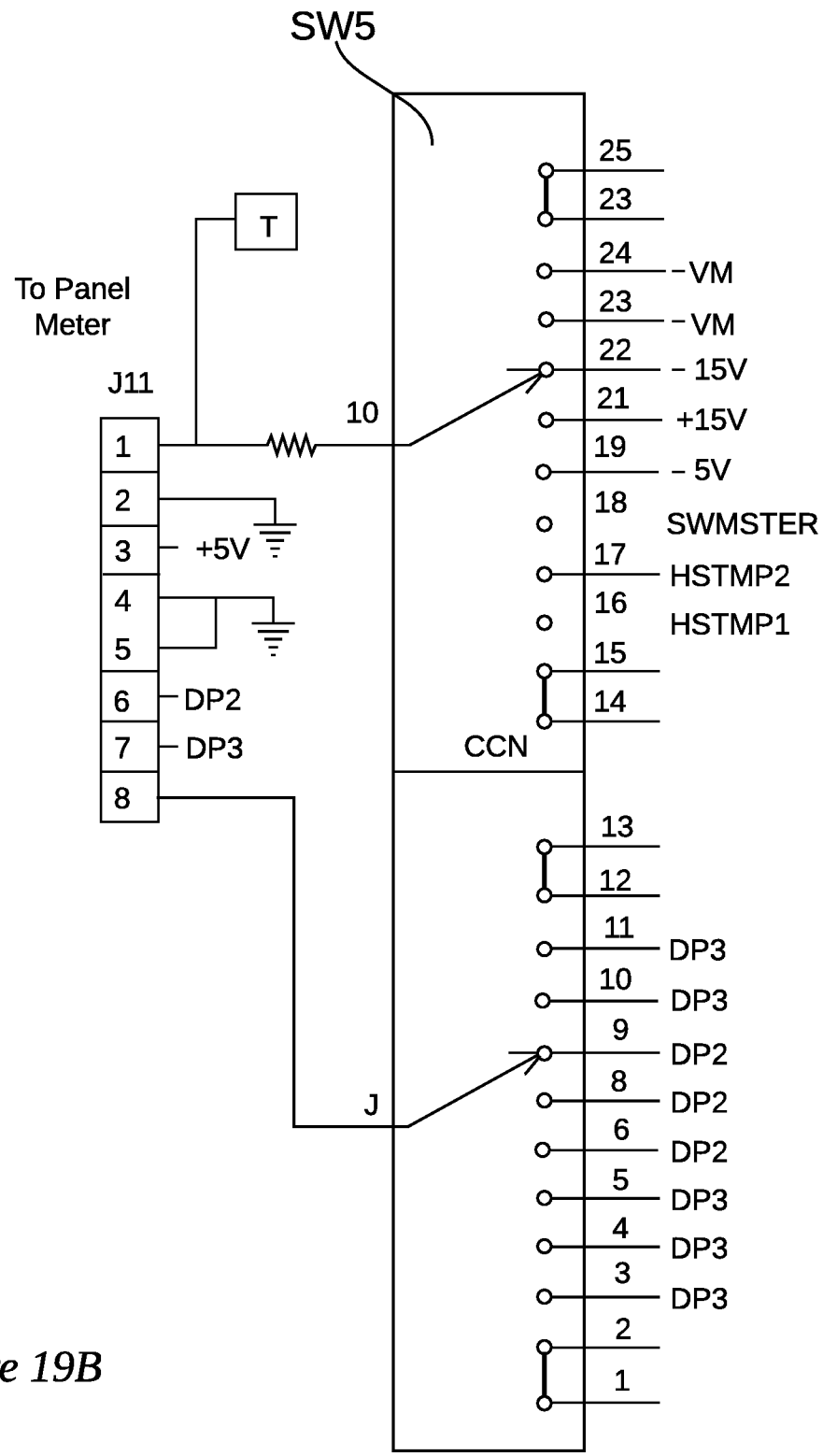

As shown in FIG. 19, the sweep width voltage can be conditioned by amplifier U12A. The selection switch SW5 can be a 2-pole switch, one to route the voltage to be displayed, and the other to manage the decimal point position.

Scan Coils Driven by the Coil Driver

A variety of coil designs can be used with a resonated coil driver. Generally they can range in average diameter from 76 cm to 89 cm with from to 50 to 75 turns per coil. The coils can be spaced at Helmholtz spacing where the average spacing along the axial dimension is set to the average radius of the coils. Coil constants range from 10 to 14 G/A, and inductance ranges from 0.9 mH to 1.8 mH. Coils have been made from both conventional solid copper magnet wire (#20 or #22 AWG) and from Litz wire. Litz wire sizes 240/44 and 220/46 have been used. The advantage for Litz wire is that the slope of the A.C. resistance curve is reduced by about a factor of 6 compared to what it is for solid wire coils under the same conditions. This reduces the power dissipated in the coils by a factor of 6 for the same sweep width and frequency (ignoring the power associated with the D.C. resistance). The amplifier power supply voltages can then be substantially reduced, which reduces the power dissipated in the amplifiers for a given coil current (sweep width).

Capacitors that Establish the Resonant Frequency

Figure 14:
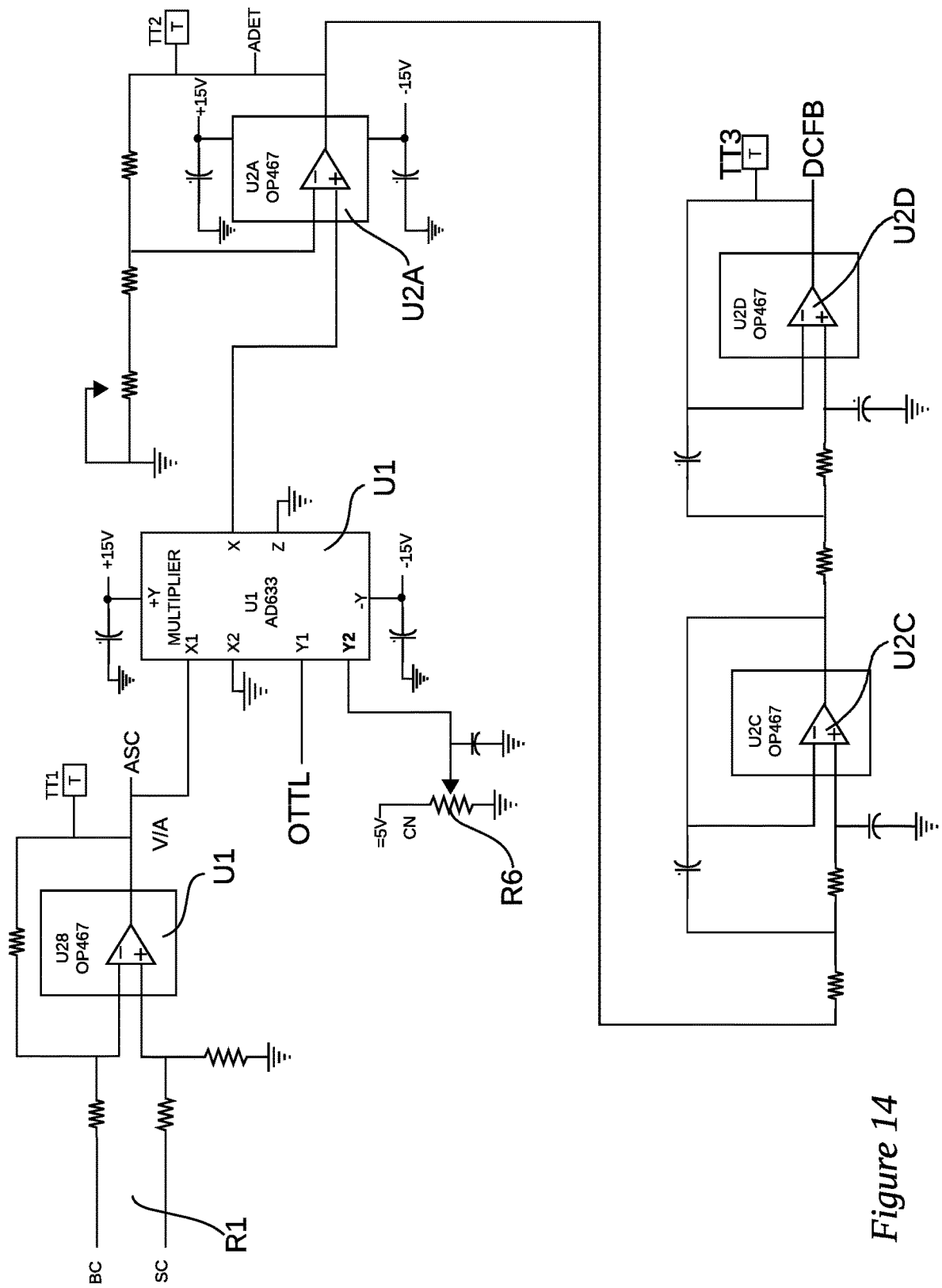

As shown in FIG. 8, the resonant circuit formed by the inductance of the scan coils 805 and series capacitances can be configured as a symmetrical circuit about the current sense resistor R1 (also in FIG. 14). In some embodiments, symmetry can be required to minimize the common mode voltages applied to amplifier U2B. In some embodiments, because of the requirement for symmetry in this circuit the capacitance is divided between 2 equal-valued capacitors, each twice the value of the total required capacitance for a given frequency. The capacitors can be mounted in a plastic box containing a p.c. card with sockets so that the capacitors can easily be changed to adjust the operating frequency. The box can be located in-line with the cable connecting the RCD to the scan coils. The node between the capacitor and the coil is the location of the highest voltage in the circuit. This cabling arrangement provides insulation from possible contact with the high voltage. The peak voltage can reach several hundred volts at the highest frequencies. For example, with the total coil inductance at a nominal 1 mH the inductive reactance is $2\pi$ ohms/kHz. So at 120 kHz and a sweep width of 30 Gpp, with a coil constant of 14 G/A the voltage will be $2\pi*120*30/14=1{,}615$ Vpp, or 807 Vp. This voltage is equally divided by the symmetry of the circuit, so the voltage, with respect to ground at each capacitor, in this example, is 404 Vp.

The layout of the p.c. card that the capacitors are plugged into allows for up to 3 parallel capacitors to make up each of the 2 series capacitances. This allows resonance to extend down to about 4.1 kHz for coils with 1 mH total inductance and using a total of six 1 µF capacitors.

Resonated Coil Drivers

Embodiments of the invention provide for the design and performance of one of three resonated coil drivers known as RCD-3. Two earlier versions of the RCD were constructed and are used routinely in, sometimes referred to as RCD-1 and RCD-2. In the simplest terms the differences are: RCD-1: The first unit built, this version contains only one air-cooled power amplifier stage. For medium to high scan rates this may require that the coil drive be duty-cycled to avoid amplifier overheating, but with duty cycling very high scan rates are possible. RCD-2: The second version incorporates two power amplifier stages, which greatly improves the amplifier heating situation and much higher scan rates are possible before duty cycling is needed. In almost all VHF rapid scan experiments, where scan rates are limited by resonator bandwidth, 100% duty cycle can be used. In x-band experiments, where much greater bandwidth is available, very high scan rates can be used but may require duty-cycling under some conditions. The duty cycling capability makes RCD-1 and -2 somewhat more complex in design due to the dynamic feedback control needed to produce the tone bursts. RCD-3 operates only at 100% duty cycle.

Figure 20:
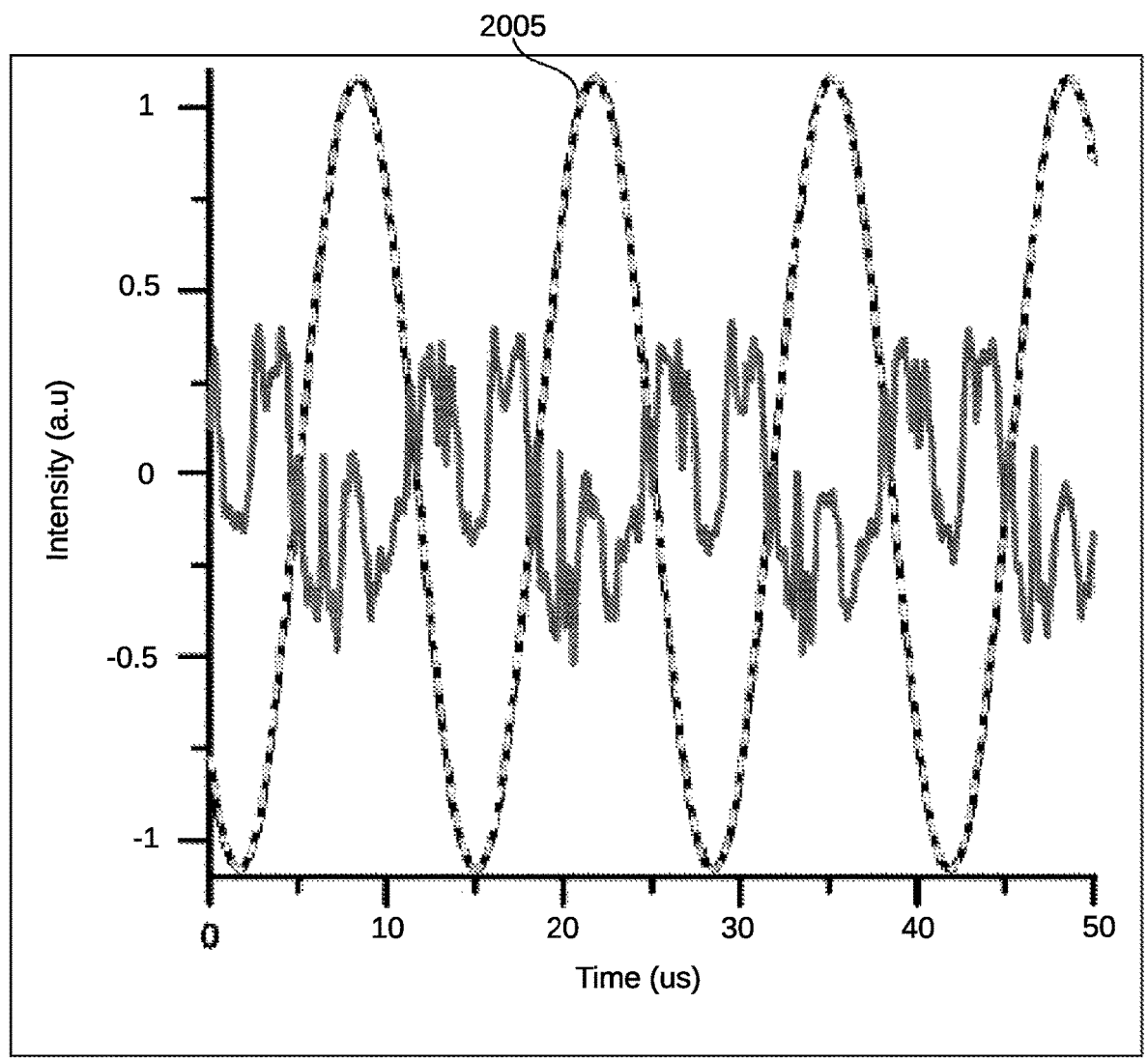
FIG. 20 is a graph showing a nearly sinusoidal current waveform according to some embodiments of the invention.
Figure 21:
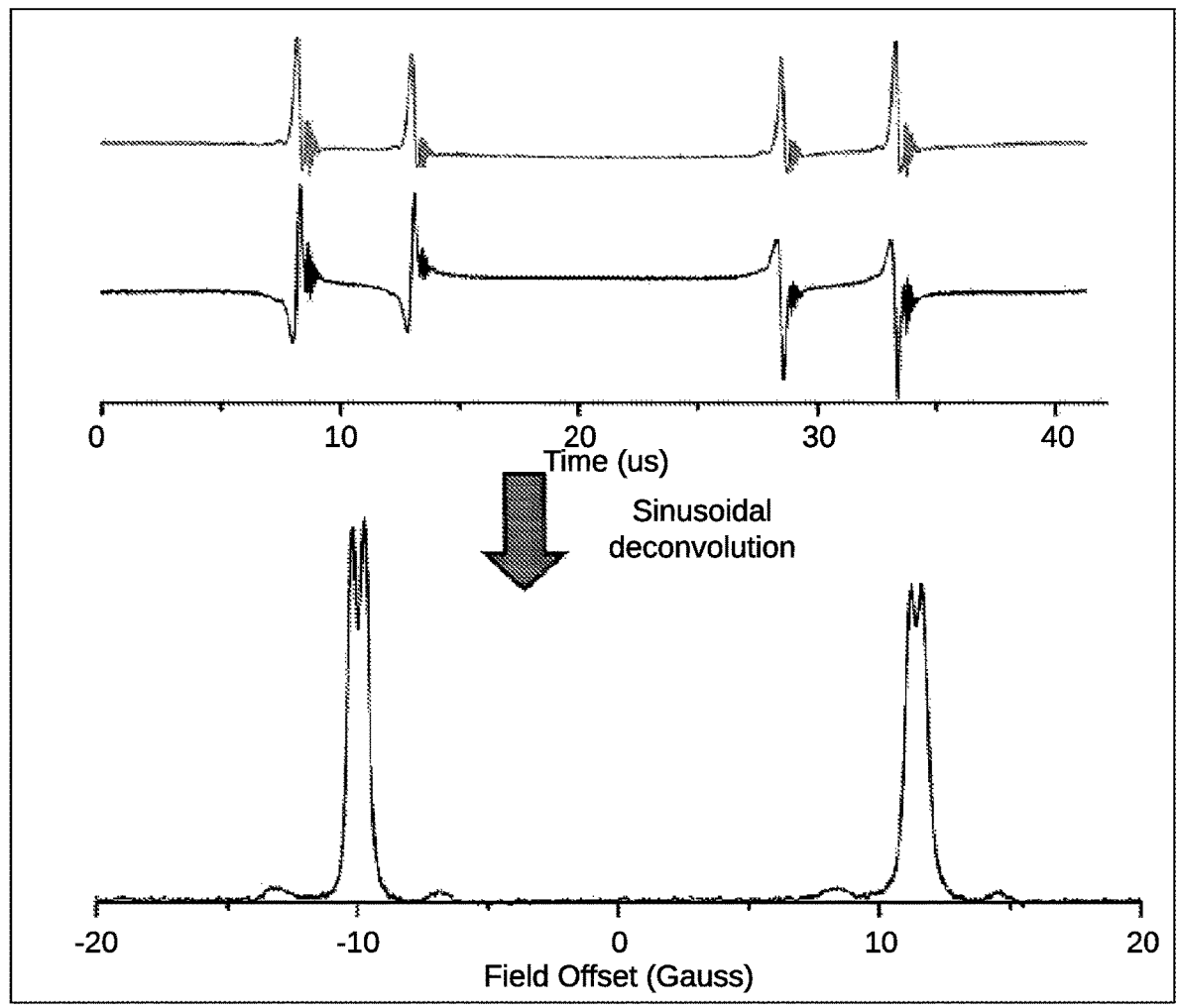
FIG. 21 is an example of sinusoidal decomposition according to some embodiments of the invention.

FIG. 20 shows that the current waveform 2005 is nearly sinusoidal. The residuals between the current waveform and the simulated sine wave were multiplied by 50. The total harmonic distortion (calculated by taking the ratio of the RMS of the residuals to the sine wave RMS value and multiplying by 100) is 0.6%. This very low distortion is attributed to the resonated type circuit that is used in this design.

EPR Applications and Results

A solution of 0.1 mM 15N-mHTCPO in 80/20 EtOH/H2O was placed in a 4 mm o.d.×3 mm i.d. quartz tube, which had a height of 3 mm, resulting in a 3×3 mm cylindrical shape. The sample was degassed by performing six freeze-pump-thaw cycles and then the tube was flame sealed. This concentration is in a range where the contribution to relaxation from collisions is very small.

Rapid scan signals were obtained on a Bruker custom E500T x-band spectrometer. Signal acquisition was via a Bruker signal processing unit (SPU) for CW spectra and a SpecJetII fast digitizer for rapid scan signals. A critically-coupled FlexLine ER4118X-MD5 dielectric resonator was used to minimize eddy currents induced by the rapidly-changing magnetic fields. Resonator Q was measured using the pulse ring down method with a locally-designed addition to the bridge. The 80/20 EtOH/H2O solutions lowered the resonator Q to about 150.

In some embodiments rapid scan (RS) EPR can be done using standard cavity modulation coils and the standard CW modulation coil driver. However, certain limitations may apply, and some modifications to a standard CW spectrometer may be made.

Rapid scan EPR means that transition through resonance occurs in a time that is short relative to electron spin relaxation time. This can cause oscillation on the trailing edge of the recorded signal. However, application of the methodology of rapid scan EPR for many applications including in vivo imaging does not inherently require that the EPR signal be in the relaxation-sensitive regime. When the scan is fast relative to relaxation times, there are potential S/N advantages, but the EPR signal acquisition works fine even if the scan is slow. One does not need the mathematical deconvolution step for a slow scan, but it does not cause any problem if applied. Line widths are faithfully preserved under deconvolution.

The maximum rate of scan of the magnetic field, when driven sinusoidally, is $$\text{rate} = \pi w f \text{ G/s}$$

where w is the width of the sinusoidal scan (in gauss) and f is the scan frequency. For example, a 40 G 100 kHz scan, as is the design limit for most CW EPR modulation amplifiers, has a maximum scan rate of 12.5 MG/s. When the scan rate is fast relative to T2, a transient response will be observed. Many readily-available samples fit this criterion.

For example, BDPA and LiPc solids, irradiated quartz, trityl radicals, and rapidly-tumbling nitroxyl radicals in room-temperature fluid solution could be used for demonstrations. These phenomena are readily accessible on a standard EPR spectrometer if the signals are made available to the operator.

Examples of Rapid Scan Spectra

In some embodiments of the invention rapid scan spectra occurs at several microwave/RF frequencies. In the examples presented herein, an E500T spectrometer is used, which was designed for rapid scan EPR.

The rapid scan time-domain spectrum shown in FIG. 22a of the low field line a 0.1 mM mHCTPO in 80/20 EtOH/Water solution was obtained using the ER4118X-MD5 dielectric resonator with modulation coils resonated at ~29 kHz with ~30 G scan width. A sample can be degassed by performing 6 freeze-pump-thaw cycles and sealing the tube. In 4 mm o.d., 3 mm i.d. quartz tubes, had a height of 3 mm, resulting in a 3×3 mm cylindrical shape, which gave a resonator Q~150.

Figure 22:
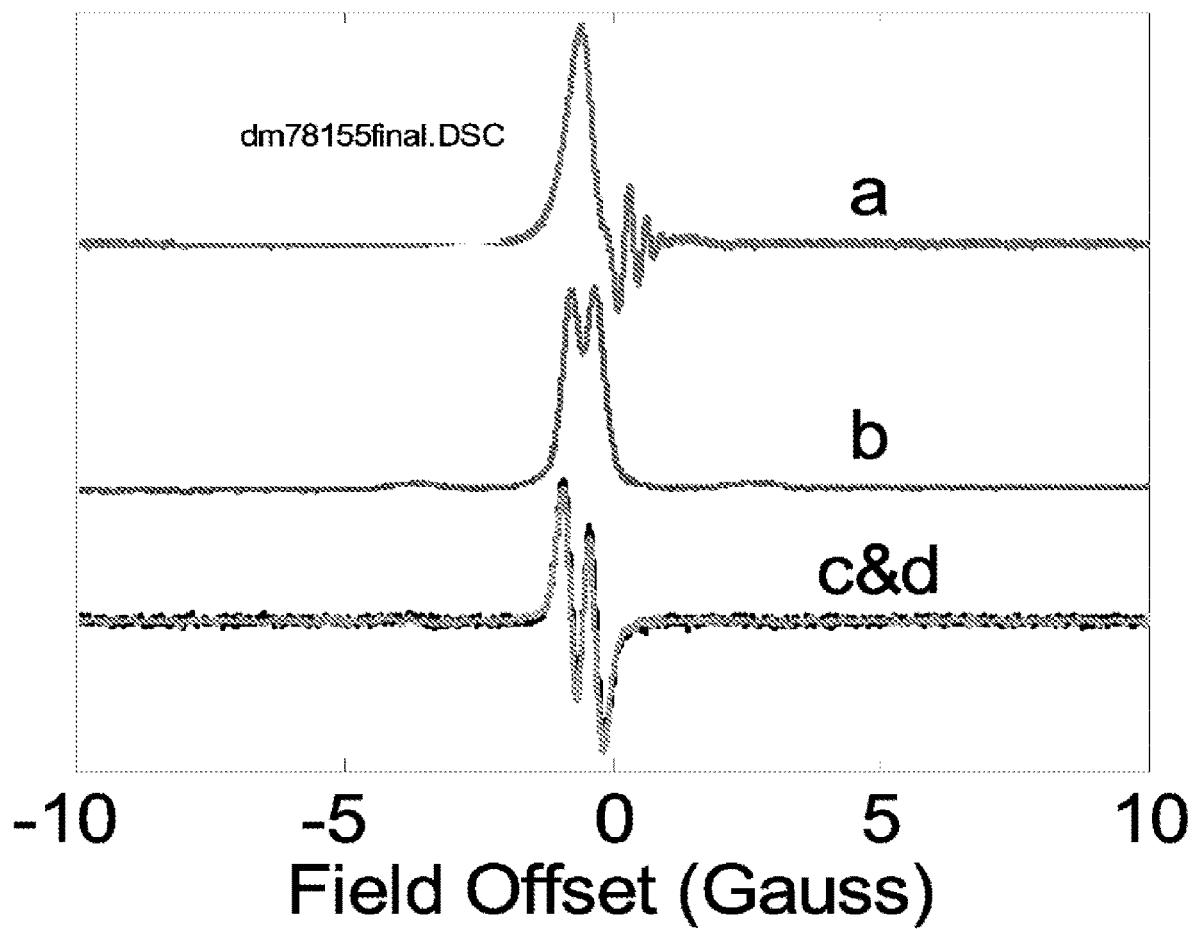
FIG. 22 is a graph showing a rapid scan time-domain spectrum according to some embodiments of the invention.
Figure 23:
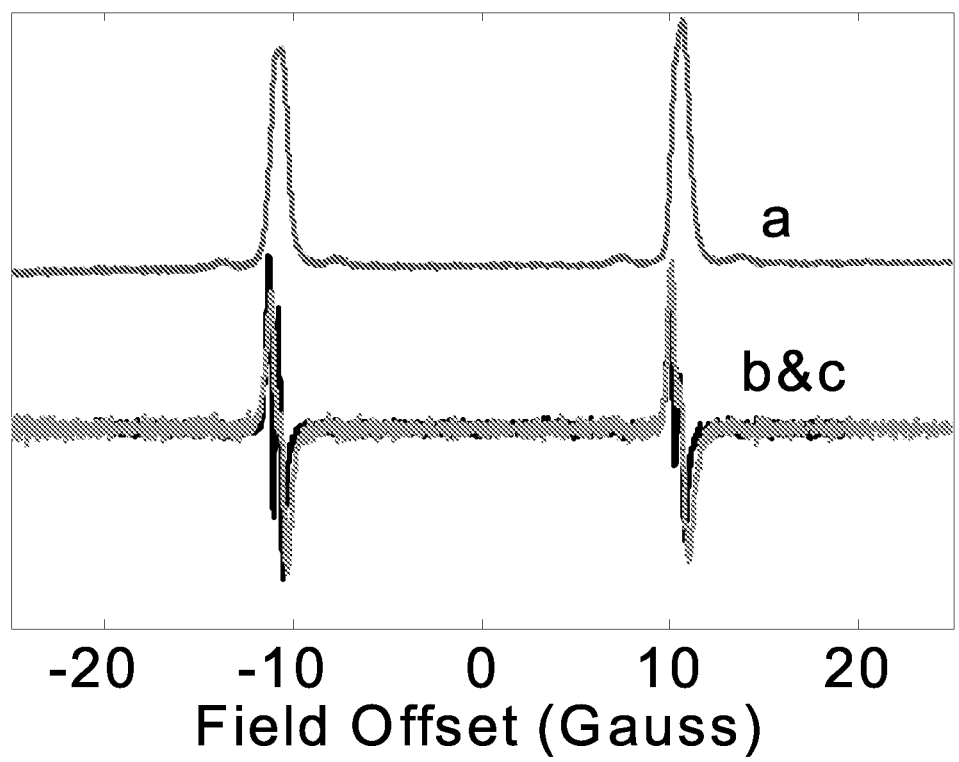
FIG. 23 is a graph showing a rapid scan time-domain spectrum and the deconvolved, pseudomodulated spectrum according to some embodiments of the invention.

Good agreement between the pseudomodulated-deconvoluted rapid scan spectrum with the CW spectrum was observed for the low-field line as shown in signals (c) and (d) in FIG. 22, but not for the full spectrum as shown by signal (b) and signal (c) in FIG. 23.

In some embodiments a dielectric resonator with resonated modulation coils at 29 kHz with ~30 G scan width, and 3 mm sample is used to produce the signals in FIG. 22. Signal (a) represents an as-recorded time-domain sinusoidal rapid scan signal. Signal (b) represents a slow-scan absorption spectrum obtained by deconvolution of signal in (a). Signal (c) (dashed) shows the first derivative spectrum obtained by pseudomodulation of the signal in b. And signal (d) shows a single scan of a conventional field-modulated first-derivative CW EPR spectrum of the same sample.

In some embodiments a dielectric resonator with modulation coils resonated at 29 kHz with ~55 G scan width is used to produce the signal shown in FIG. 22. Signal (a) shows a slow-scan absorption spectrum obtained by deconvolution of rapid scan signal. Signal (b) (magenta dashed trace) shows a first derivative spectrum obtained by pseudomodulation of the signal in a, and signal (c) (black trace) shows a single scan of a conventional field-modulated first-derivative CW EPR spectrum of the same sample.

Figure 11A:
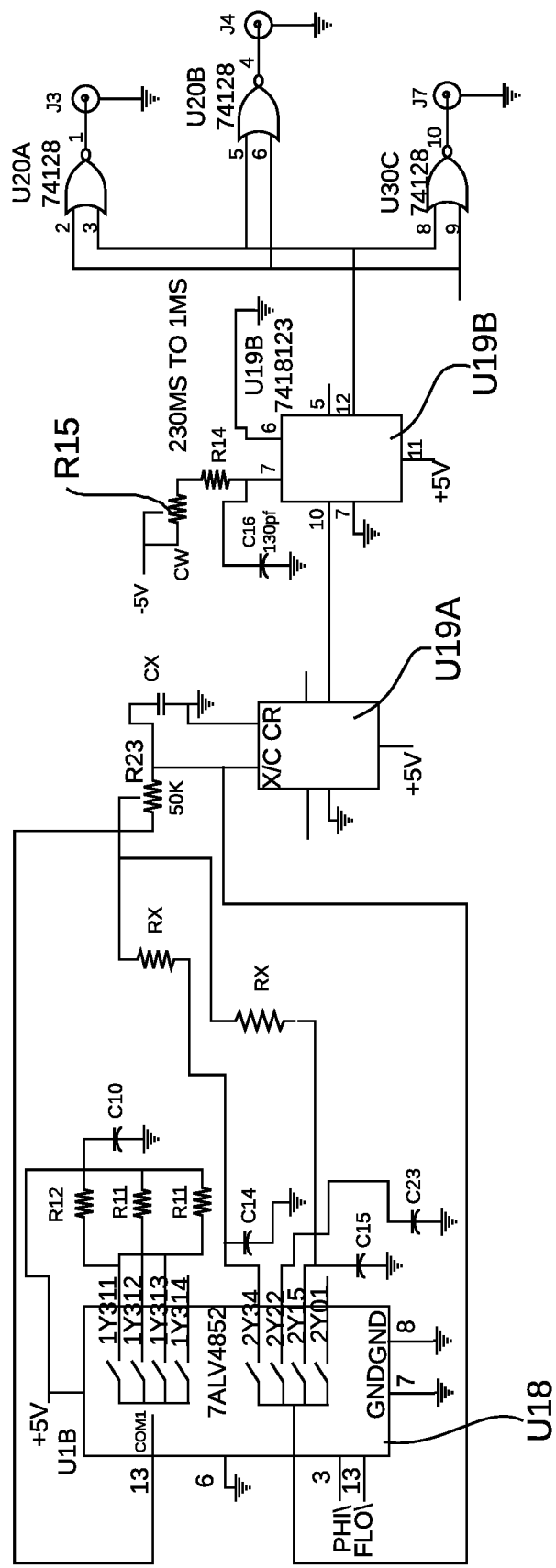
Figure 11B:
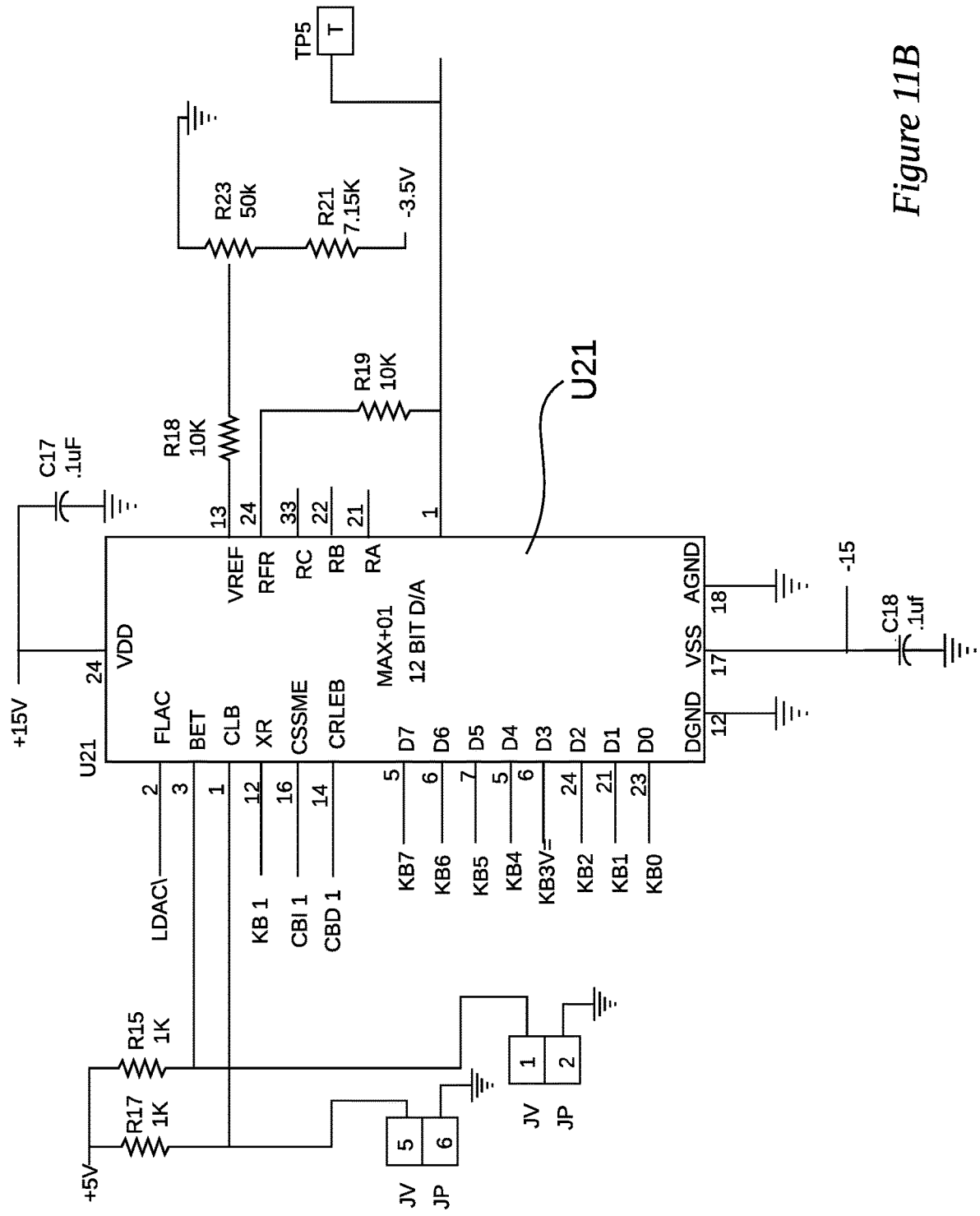
Figure 11C:
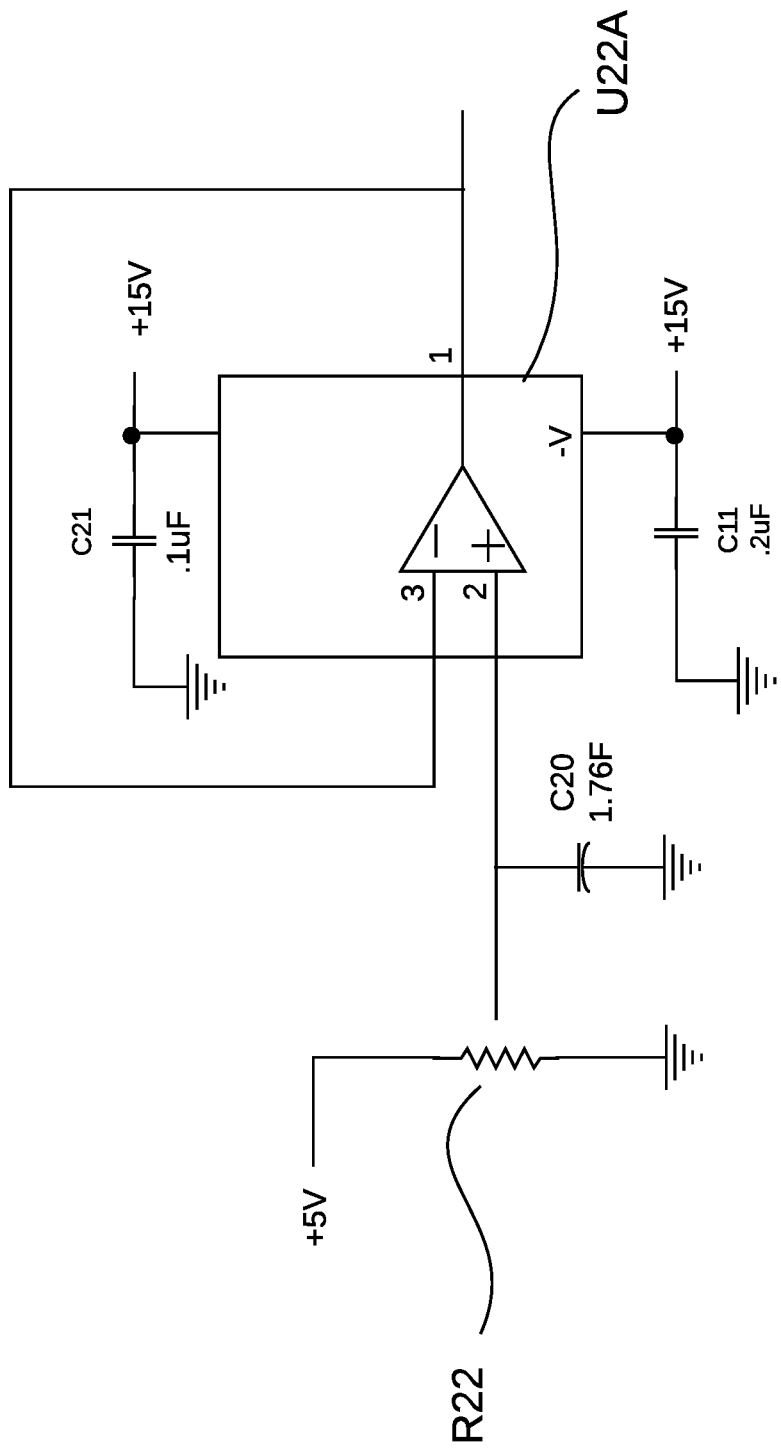

The broadening observed in FIG. 11 is most likely a result of the sample size relative to the size of the modulation coils. The modulation field, $B_m$, may not be homogeneous over the sample. The effect of inhomogeneous $B_m$ is amplified if the EPR line is near the extremes of the sinusoidal magnetic field scan shown in FIG. 23. There is less effect on the spectrum if the line is near the center of the scan shown in FIG. 22. If the exact dimensions of the coils are known, the $B_m$ field distribution could be calculated, and the effect on finite-sized samples could be corrected in post-processing.

Figure 24:
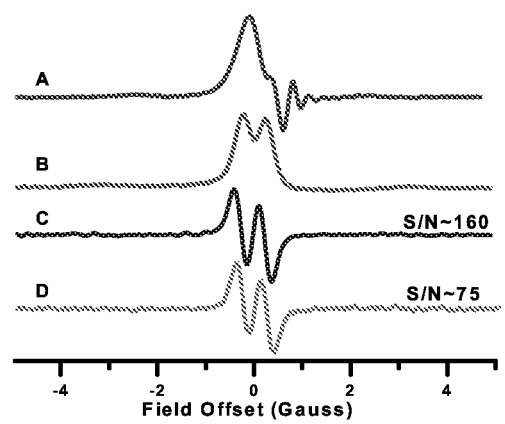
FIG. 24 is a graph of an experimental rapid scan signal, the deconvolved spectrum, and a pseudomodulated-deconvoluted rapid scan spectra for comparison with a continuous wave signal according to some embodiments of the invention.

In some embodiments the rapid scan spectrum of the low field line for a 0.1 mM mHCTPO in 80/20 EtOH/Water solution in the dielectric resonator with external, circular 9.5 cm coils, separated by 4.5 cm, resonated at ~60 kHz with ~10 G scan width is shown in signal A of FIG. 24. Good agreement is observed between the pseudomodulated-deconvoluted rapid scan spectrum with the continuous wave for the low-field line (see signals C and D of FIG. 24) and for the full spectrum (see signals A and B of FIG. 25).

In some embodiments magnetic field scans can be performed from low field to high field using 9.5 cm diameter external coils. In FIG. 24, signal A is an as-recorded sinusoidal rapid scan signal obtained with a scan rate of 1.8 MG/s. 1024 averages were recorded in about 0.9 seconds using SpecJet II The incident microwave power was about 80 mW (0.14 G B1). Signal B is a slow-scan absorption spectrum obtained by deconvolution of signal in a. Signal C is the first derivative spectrum obtained by pseudomodulation of the signal in B. First derivative spectrum was filtered using a fourth-order Butterworth filter allowing less than 2% broadening of the linewidth. Signal D is the single scan of a conventional field-modulated first-derivative CW EPR spectrum of the same sample, obtained in 0.9 sec using about 5 mW incident microwave power, 10 kHz modulation frequency, 0.9 ms conversion time, 1024 points, 0.13 G modulation amplitude. Modulation amplitude, power, and fourth-order Butterworth filter were chosen to maximize signal-to-noise while allowing less than 2% broadening of the linewidth.

Figure 25:
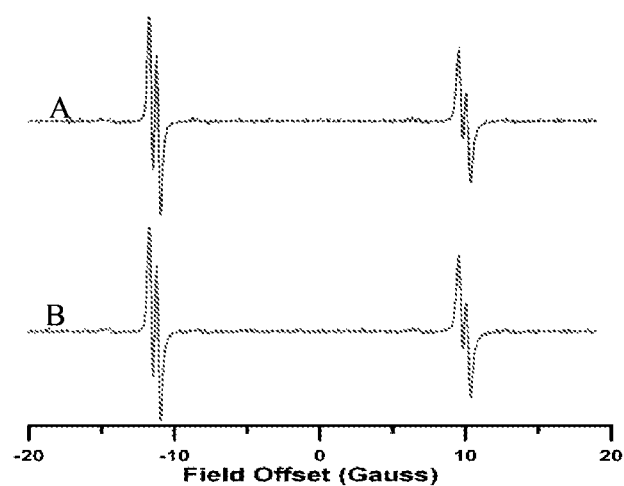
FIG. 25 is a graph showing a rapid scan time-domain spectrum and the deconvolved, pseudomodulated spectrum according to some embodiments of the invention.

In FIG. 25, signal A shows a CW spectrum of degassed 0.2 mM mHCTPO solution. 40 G sweep width, 0.05 G modulation amplitude, signal B shows Pseudomodulated, deconvolved rapid scan spectra of a degassed 0.1 mM mHCTPO solution with 55 G scan width, and 29.7 kHz scan frequency (~5.1 MG/s). 1024 averages were collected with resonator Q~150 and 2 mW power (0.02 G B1).

In some embodiments spectrometer configurations can vary. In some embodiments a number of modifications can be made to the standard spectrometer (e.g., a standard x-band CW spectrometer).

In some embodiments a high speed dual channel digitizer can be used. For example, an SPU or SpecJet II can be used. The bandwidth can be increased from the present 30 MHz to at least 60 MHz, and preferably 75 MHz to expand the range of samples that can be studied. In some embodiments, the SPU can be somewhat slower than SpecJet II when averaging less than 2048 averages, presumably due to data transfer rates. When averaging larger numbers of scans the two digitizers approach the same time efficiency.

In some embodiments a trigger from the modulation drive system to the SPU or SpecJet II can be used. If the system has an older style signal channel module the output on the front panel that is a square wave synchronized to the modulation frequency can be used. In some embodiments the trigger can be phased to be at the start of the up-field scan. If the up-down sense is ambiguous a switch could be provided to reverse the scan if it is wrong. The up-field direction can easily be determined from a simple EPR test. If the center field (B0) is increased a small amount and the first scan following the trigger shows the RS signal moving to the left, then that scan is confirmed to be an "up" scan. If the RS signal moves to the right, it is a "down" scan.

In some embodiments, a quadrature detection system can be used to implement the rapid scan response analysis. The phenomenon can be illustrated with only one channel, but proper phasing of the derived signal can include both channels. If starting from a CW-only bridge this will have to be added and provision made to switch it in and out.

In some embodiments a high-bandwidth dual channel video amplifier can be used. Preferably the bandwidth would be adjustable in several steps from a few hundred kHz to at least twice the maximum digitizer sampling rate. An alternative to the video amplifier bandwidth selections would be the use of an external programmable low-pass filter placed between the output of the video amplifier and the input to the digitizer, such as Krohn-Hite model 3995 LP Butterworth dual channel filter. The standard video gains used for pulse EPR in the range of 30 to 66 dB are appropriate. The video amplifier should be A.C. coupled with a low frequency cut-off of no higher than 20 Hz. Post-acquisition processing is an alternative to an adjustable external filter.

In some embodiments scan width control and calibration can be included. The standard automated method of resonating and calibrating the modulation coils is probably adequate, but it should be noted that precise knowledge of the scan rate (frequency and amplitude) may be used for accurate deconvolution of the RS spectrum.

In some embodiments, for primary data acquisition and averaging the standard data collection software for SPU or SpecJet II is adequate. However, to deconvolve the RS spectrum to obtain the slow scan spectrum, additional post-processing software can be used. In addition, post-processing simulation software is also useful to compare the experimental time-domain data with its simulation.

In some embodiments, there can be limitations to the use of standard modulation coils and drivers for RS EPR.

In some embodiments limitation due to small coil size can exist. Standard modulation coils are about 25 mm diameter. This limits the homogeneous field region produced by the coils. In some embodiments there are considerable distortion in RS spectra taken with standard modulation coils for extended samples. Hence, when using standard modulation coils, small samples can be used, not exceeding about 2-3 mm.

In some embodiments limitation due to maximum scan rate can exist. Taking the maximum modulation field available from the standard system to be 40 Gpp at 100 kHz the maximum scan rate is about 12.5 MG/s. For narrow lines and long T2* this is fully adequate. However, for short T2* and broad lines it may not be adequate to reach the rapid scan regime. Generally, the rapid scan regime, as evidenced by oscillations following the line passage, begins when (aT2*/LW) is greater than about 2. In this expression, a=scan rate and LW=line width of the absorption line. Although T2* and line width are not independent, this simple expression is a convenient way to use readily-available information about the spin system. For example, rough parameters for recording one line of a nitroxyl radical could be 10 Gpp, 40 kHz sinusoidal scan, T2~0.5 µsec and LW~0.3 G. This gives aT2*/LW approximately equal to 2, so the onset of an oscillatory response should be observed.

In some embodiments limitations due to power limitations in the coils can exist. The standard modulation coils themselves are robust enough to handle 40 Gpp continuously but their proximity to the resonator can sometimes cause heating and resultant r.f. tuning drift when run continuously. Since the power goes down as the square of the ratio of a reduction in sweep width, this limitation only occurs at the very highest sweep widths.

In some embodiments, the resonator temperature and r.f. drift begins to occur at about 1 W in the modulation coils. Because the A.C. resistance is less at lower frequencies the coils dissipate less power at the same sweep width for lower frequencies. In some embodiments these experiments were performed with the dielectric resonator not in a cryostat and with the ENDOR resonator in the cryostat.

In general, the Q of a critically coupled x-band resonator is much too high for rapid scan EPR. In some embodiments, Q is lowered by various means, for example, by introducing water into the sample area of the resonator in one or more separate tubes or by using water as the solvent for the sample. Note that in the experiments outlined above the Q was lowered to about 150. Since rapid scan is a continuously driven experiment, lowering the Q by over-coupling, as is done in pulse EPR is not an option for a reflection resonator, but it could be used to lower the Q of a cross-loop resonator.

The rapid scan experiment may require detection and resonator bandwidth that are proportional to the scan rate and T2* (or inversely proportional to line width). The scan rate at the center of a sinusoidal scan, which is used to describe spectra, is given by Equation 1, $$\text{rate} = \pi w f, \quad (1)$$

where w is the peak-to-peak width of the sinusoidal scan (in gauss) and f is the scan frequency. The signal bandwidth necessary to prevent distortions in the rapid scan signal is defined by Equation 2, $$BW_{signal} = \frac{N * a}{\sqrt{3} * \pi * \Delta B_{pp}}$$

where N is a constant that is usually taken to be 5 (which accounts for 5 lifetimes for T2* exponential decay), a is the scan rate in G/s, and ΔBpp is the peak-to-peak linewidth of the derivative line in gauss. The full bandwidth of the resonator is defined by Equation 3, $$BW_{res} = \frac{v}{Q},$$

where v is the resonator frequency. However, in a rapid scan experiment, the field is being scanned in only one direction for an individual line. Thus, only half of the total resonator bandwidth is available for the signal. To calculate the necessary Q to prevent distortions in the line, the signal bandwidth can be doubled before inserting into Equation 3 because the resonator bandwidth needs to be twice the signal bandwidth, as given in Equation 4.

$$Q = \frac{v}{2 * BW_{signal}}.$$

If, for example, T2 is ca. 11 µs (for example anoxic deuterated trityl radical), and a peak-to-peak derivative linewidth of ca. 20 mG, a 20 kHz 5 Gpp sinusoidal scan results in a signal bandwidth of ca. 14 MHz.

If, for example, a nitroxyl with 150 mG line width, recorded with a 80 kHz 40 G scan has a signal bandwidth of ca. 62 MHz. At 9.6 GHz, resonator Q would have to be less than about 78.

If, for example, 15N perdeutero tempone has a line width of 175 mG and a T2* of about 430 ns. If this spectrum is collected with a 65 G sweep width and 60 kHz sweep frequency, the signal bandwidth is about 65 MHz.

Rapid frequency and magnetic field scans for electron paramagnetic resonance can be accomplished with an unlimited variety of shapes, including linear, trapezoidal, sinusoidal, etc. Some of the experimental limits not previously solved include how to accurately drive the magnetic field, how to simulate the experimental responses and how to correct for background signals that superimpose on the desired signal.

A new solution of the Bloch equations has been accomplished in a way that is so fast that it is feasible to simulate the effect of relaxation times, unresolved hyperfine, and other physical phenomena on the experimental rapid scan response. The Bloch equations were formulated as a set of linear equations for which there is an efficient matrix solution. Solutions were two to four orders of magnitude faster than numerical integration, the normal method. These simulations permit designing a wide range of new experiments and interpreting them in terms of desired physical understanding of the spin system. For example, prior work has been in terms of the Bloch T2 relaxation, sometimes called the spin-spin relaxation time. Now, with the new solutions of the equations, it is feasible to design experiments to measure T1 sometimes called the spin-lattice relaxation time. For measurements of biological oximetry, and other important applications of EPR it is important to be able to measure T1.

It is inherent in rapid scan measurements that there is a background signal that is superimposed on the desired EPR response. Subtracting this signal has been a limit to the applications of rapid field scan EPR. Using new scan drivers that resonate the current through the scan coils, the field is accurately sinusoidal, and hence the field-induced background signal is accurately sinusoidal. It is generally assumed that in EPR one removes the background signal by recording a signal at a field different from the resonance field. However, when the background is field-dependent, this does not work. In an innovative approach it was found that the background oscillations can be removed without acquiring off-resonance data. For data acquired in quadrature, up-field and down-field scan signals can be separated in the frequency domain. For each scan direction, the background oscillation can be calculated by fitting to the half cycle that does not contain the EPR signal. The extrapolated fit function is then subtracted from the half cycle that contains the EPR signal. By zeroing the array for the half cycles that do not contain the EPR signal, the signal-to-noise is improved and the data are corrected for non-orthogonality of the quadrature channels. Thus one not only removes the background, but in the process improves the signal to noise.

Time-Domain Full Scan Sinusoidal Deconvolution

Embodiments of the invention also include systems and methods for time-domain full scan sinusoidal deconvolution. In some embodiments, the method to obtain slow scan EPR spectra from rapid scan EPR signals is limited to the case in which the EPR signal completely decays by the end of each half scan. This constraint can be mathematically expressed as follows:

$$m_x(0)=m_y(0)=m_x(P/2)=m_y(P/2)=0,$$

where mx and my are x and y component of magnetization, which are real (dispersion) and imaginary (absorption) parts of the complex rapid scan signal:

$$rs(t)=m_x(t)+jm_y(t), \text{ and}$$

where P is the scan period. For slow scan EPR spectrum and rapid scan signal:

$$rs(t)d(t)=\text{fid}(t) \otimes d(t),$$

where $\otimes$ denotes the convolution operator, d(t) is the driving function, and fid(t) is free induction decay that relates to spectrum S(w) through Fourier transform:

$$S(w)=FT[\text{fid}(t)].$$

S(w) can be obtained using the property of convolution become multiplication as the Fourier conjugate domain:

$$S(w)=FT[rs(t)d(t)]/D(w), \text{ where } D(w)=FT[d(t)].$$

Figure 26A:
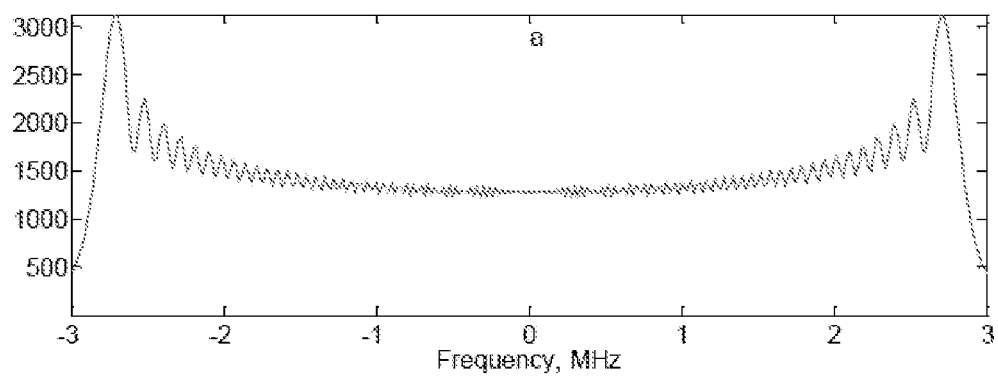
FIG. 26A shows the absolute value |D(w)| for a half cycle driving function according to some embodiments of the invention.
Figure 26B:
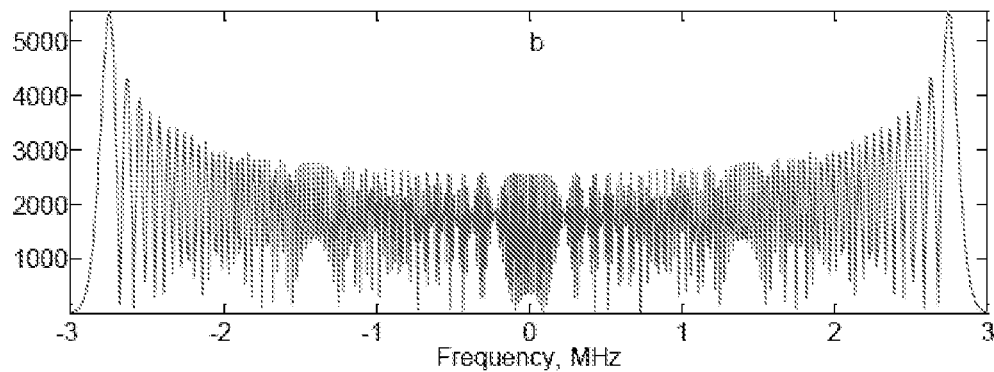
FIG. 26B shows the absolute value |D(w)| for a full cycle driving function according to some embodiments of the invention.

This equation is mathematically valid for two cases: (1) half cycle driving function $0 \leq t < P/2$ or $P/2 \leq t < P$, provided that the signal completely decays by the end of each half scan; and (2) the full cycle driving function $0 \leq t < P$ with no additional constrains. If this equation is used, the second case (2) does not produce a stable solution in the presence of noise. FIGS. 26A and 26B show the instability of the second case.

FIG. 26A shows the absolute value |D(w)| for the half-cycle driving function case and FIG. 26B shows the absolute value |D(w)| for the full cycle driving function case. The amplitude of full cycle driving function, FIG. 26B, is a fast oscillating function in the frequency domain. It goes up twice as high as the signal in FIG. 26A and drops down to almost zero level. At the point where |D(w)| is very small, division by a small number in the above equation is the reason for instability of the solution.

To solve this problem, $rs(t)d(t)=\text{fid}(t) \otimes d(t)$ is solved in the time domain using a Tikhonov regularization. The previous equation can be rewritten in matrix form:

$$\hat{D}\text{fid}=rs*d,$$

where fid, rs, and d are vectors defined on a discrete time scale; $\hat{D}$ is a Toeplitz matrix based on d; and symbol '*' denotes element-wise multiplication of two vectors. A stable fid can be found by minimization of $$\|\hat{D}\text{fid}-rs*d\|^2+\lambda\|\hat{R}\text{fid}\|^2,$$

where $\hat{R}$ is a regularization matrix and $\lambda$ is the regularization parameter. The solution to this equation is:

$$\text{fid}=(\hat{D}\hat{D}^T+\lambda\hat{R}\hat{R}^T)^{-1}\hat{R}^T(rs*d).$$

This equation can be solved by finding the $\hat{R}$ and $\lambda$ that give the best results. The EPR spectrum S(w) can be obtain from fid by the inverse Fourier transform.

Figure 27:
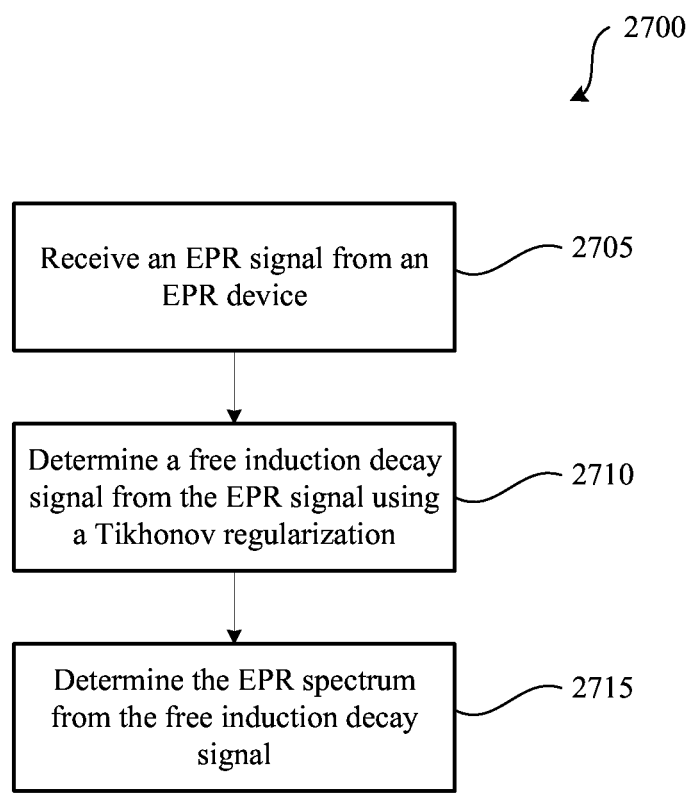
FIG. 27 shows a flowchart of process for determining an EPR spectrum for an EPR signal using Tikhonov regularization according to some embodiments of the invention.

FIG. 27 is a flowchart of process 2700 for determining an EPR spectrum from an EPR signal using Tikhonov regularization according to some embodiments of the invention. Process 2700 starts at block 2705, where the EPR signal is received. The EPR signal, for example, can be received at a computer system from an EPR source. At block 2710 the EPR signal can be converted into a free induction decay signal using a Tikhonov regularization as described above. The Tikhonov regularization can be solved in any manner. At block 2715 the EPR spectrum can be returned from the free induction decay signal. Later, the EPR spectrum can be returned to a user.

Figure 28:
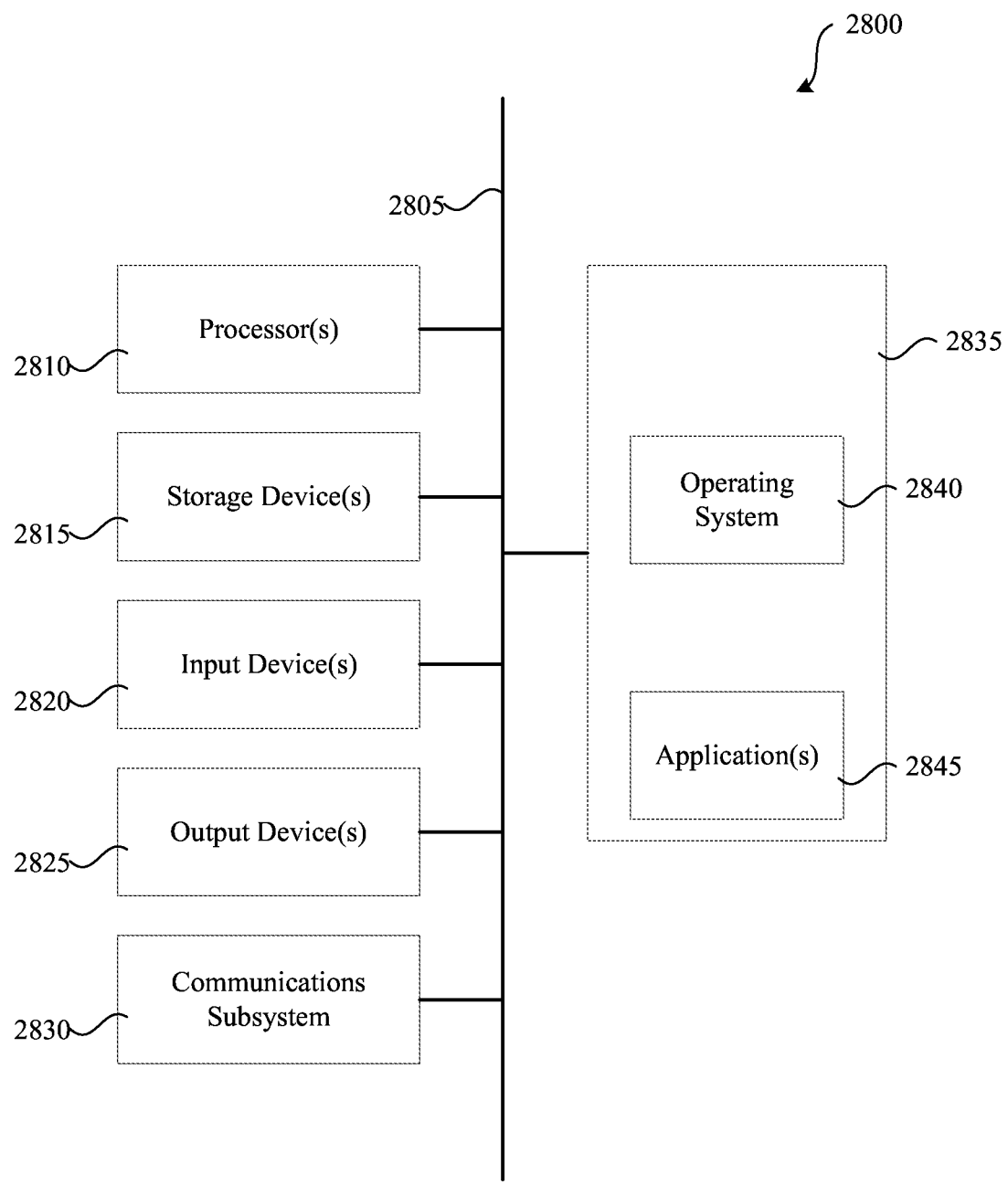
FIG. 28 shows a computational system for performing the described processes according to some embodiments of the invention.

The computational system 2800, shown in FIG. 28 can be used to perform any of the embodiments of the invention. For example, computational system 2800 can be used to execute methods 300, 400 and/or 2700 among others disclosed herein. Computational system 2800 may also perform any calculation or solve any equation described herein. As another example, computational system 2800 can be used perform any calculation, solve any equation, identification and/or determination described here. Computational system 2800 may also be used to replace or supplement any circuitry described herein.

Computational system 2800 includes hardware elements that can be electrically coupled via a bus 2805 (or may otherwise be in communication, as appropriate). The hardware elements can include one or more processors 2810, including without limitation one or more general-purpose processors and/or one or more special-purpose processors (such as digital signal processing chips, graphics acceleration chips, and/or the like); one or more input devices 2815, which can include without limitation a mouse, a keyboard and/or the like; and one or more output devices 2820, which can include without limitation a display device, a printer and/or the like.

The computational system 2800 may further include (and/or be in communication with) one or more storage devices 2825, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 2800 might also include a communications subsystem 2830, which can include without limitation a modem, a network card (wireless or wired), an infrared communication device, a wireless communication device and/or chipset (such as a Bluetooth device, an 802.6 device, a WiFi device, a WiMax device, cellular communication facilities, etc.), and/or the like. The communications subsystem 2830 may permit data to be exchanged with a network (such as the network described below, to name one example), and/or any other devices described herein. In many embodiments, the computational system 2800 will further include a working memory 2835, which can include a RAM or ROM device, as described above.

The computational system 2800 also can include software elements, shown as being currently located within the working memory 2835, including an operating system 2840 and/or other code, such as one or more application programs 2845, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 2825 described above.

In some cases, the storage medium might be incorporated within the computational system 2800 or in communication with the computational system 2800. In other embodiments, the storage medium might be separate from a computational system 2800 (e.g., a removable medium, such as a compact disC etc.), and/or provided in an installation package, such that the storage medium can be used to program a general purpose computer with the instructions/code stored thereon. These instructions might take the form of executable code, which is executable by the computational system 2800 and/or might take the form of source and/or installable code, which, upon compilation and/or installation on the computational system 2800 (e.g., using any of a variety of generally available compilers, installation programs, compression/decompression utilities, etc.) then takes the form of executable code.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A Hall probe simulator circuit for producing a simulated Hall effect voltage VH generatable by a Hall probe if the Hall probe were placed in a magnetic field created within a coil of wire, without actual use of the Hall probe, the Hall probe simulator circuit comprising:
   a reference current input configured to measure a reference voltage across a reference resistor by converting a reference current which is input into the reference resistor into a measured reference voltage VR;
   a current sensor comprising a current sense resistor configured to sense a coil current in the coil of wire;
   a controller coupled with the reference current input and the current sensor, wherein the controller is configured to produce the simulated Hall effect voltage VH, wherein producing the simulated Hall effect voltage VH comprises a multiplier for multiplying the sensed coil current times the measured reference voltage VR and a constant; and
   a water-cooled heat sink,
   wherein the current sense resistor is attached to the water-cooled heat sink,
   wherein the water-cooled heat sink is also used for a magnet power supply, and
   wherein the current sense resistor has a low resistance and a low temperature coefficient.

2. The Hall probe simulator circuit according to claim 1, wherein the controller is further configured to determine a magnitude of a magnetic field produced by the coil of wire.

3. The Hall probe simulator circuit according to claim 1, further comprising a temperature regulator coupled at least partially with the reference resistor and configured to regulate the temperature of the reference resistor.

4. The Hall probe simulator circuit according to claim 1,
   wherein the current sensor is configured to sense a current sense voltage across the current sense resistor, wherein the current sense voltage is proportional to the coil current,
   wherein the constant comprises a first constant, and
   wherein determining the simulated Hall effect voltage comprises multiplying the current sense voltage times the measured reference voltage and a second constant.

5. The Hall probe simulator circuit according to claim 4, further comprising a temperature regulator coupled at least partially with the current sense resistor and configured to regulate the temperature of the current sense resistor.

6. The Hall probe simulator circuit according to claim 1, wherein the constant comprises a Hall effect constant.

7. The Hall probe simulator circuit according to claim 1, wherein the controller is further configured to regulate the coil current in response to the simulated Hall effect voltage.

8. The Hall probe simulator circuit of claim 1, comprised in a system that further comprises:
   a Hall probe, separate from the Hall probe simulator; and
   a switch configured to enable switching between using the Hall probe simulator and the Hall probe.

9. A method for operating a Hall probe simulator circuit for producing a simulated Hall Effect voltage VH generatable by a Hall probe if the Hall probe were placed in a magnetic field created within a coil of wire, without actual use of the Hall probe, the method comprising:
   sensing a coil current in the coil of wire using a current sense resistor of a current sensor;
   sensing a reference voltage across a reference resistor so as to by converting a reference current input into the reference resistor into a measured reference voltage VR;
   producing the simulated Hall effect voltage VH using a controller coupled with the reference current input and the current sensor by using a multiplier to multiply the coil current times the measured reference voltage and a constant;
   attaching the current sense resistor to a water-cooled heat sink such that the current sense resistor exhibits a low resistance and a low temperature coefficient; and
   using the water-cooled heat sink for a magnet power supply.

10. The method of claim 9, further comprising determining a magnitude of a magnetic field produced by the coil of wire.

11. The method of claim 9, wherein sensing the coil current comprises sensing a current sense voltage across the current sense resistor in series with the coil of wire,
   wherein the constant comprises a first constant, and
   wherein determining the simulated the Hall effect voltage comprises multiplying the current sense voltage times the measured reference voltage and a second constant, wherein the current sense voltage is proportional to the coil current.

12. The method of claim 11, further comprising regulating the temperature of the current sense resistor.

13. The method of claim 9, further comprising regulating the coil current in response to the simulated Hall effect voltage.

14. A Hall probe simulator circuit for producing a simulated Hall effect voltage VH generatable by a Hall probe if the Hall probe were placed in a magnetic field created within a coil of wire, without actual use of the Hall probe, the Hall probe simulator circuit comprising:
   a reference current input configured to measure a reference voltage across a reference resistor by converting a reference current which is input into the reference resistor into a measured reference voltage VR; and
   a current sensor comprising a current sense resistor configured to sense a coil current in the coil of wire;
a controller coupled with the reference current input and the current sensor, wherein the controller is configured to produce the simulated Hall effect voltage VH, wherein producing the simulated Hall effect voltage VH comprises multiplying the sensed coil current times the measured reference voltage VR and a constant; and
   a switch configured to enable switching between using the Hall probe simulator circuit and an actual Hall probe, the actual Hall probe being separate from the Hall probe simulator circuit,
   wherein the Hall probe simulator is configured to:
   detect a signal phase from the actual Hall probe,
   adjust a signal phase of the Hall probe simulator to match the signal phase from the actual Hall probe, and
   engage a phase reversal switch, which can allow for connecting a magnet current so that it flows in either direction through the Hall probe simulator circuit.

15. The Hall probe simulator circuit of claim 14, further comprising a temperature regulator coupled at least partially with the reference resistor and configured to regulate the temperature of the reference resistor.

16. The Hall probe simulator circuit of claim 14,
   wherein the current sensor is configured to sense a current sense voltage across the current sense resistor, wherein the current sense voltage is proportional to the coil current,
   wherein the constant comprises a first constant, and
   wherein determining the simulated Hall effect voltage comprises multiplying the current sense voltage times the measured reference voltage and a second constant.

17. The Hall probe simulator circuit of claim 16, further comprising a temperature regulator coupled at least partially with the current sense resistor and configured to regulate the temperature of the current sense resistor.

18. The Hall probe simulator circuit of claim 14, wherein the constant comprises a Hall effect constant.

19. The Hall probe simulator of claim 14, wherein the controller is further configured to regulate the coil current in response to the simulated Hall effect voltage.

* * * * *